United States Patent
Asada et al.

(10) Patent No.: US 9,048,442 B2
(45) Date of Patent: Jun. 2, 2015

(54) COMPOSITION CONTAINING A METAL COMPLEX AND ORGANIC COMPOUND, AND LIGHT-EMITTING ELEMENT USING SAID COMPOUND

(75) Inventors: Kohei Asada, Tsukuba (JP); Osamu Goto, Tsukuba (JP); Chizu Sekine, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 800 days.

(21) Appl. No.: 13/000,554

(22) PCT Filed: Jun. 23, 2009

(86) PCT No.: PCT/JP2009/061367
§ 371 (c)(1),
(2), (4) Date: Jan. 20, 2011

(87) PCT Pub. No.: WO2009/157430
PCT Pub. Date: Dec. 30, 2009

(65) Prior Publication Data
US 2011/0114890 A1 May 19, 2011

(30) Foreign Application Priority Data
Jun. 23, 2008 (JP) ................................. 2008-163037

(51) Int. Cl.
| | | |
|---|---|---|
| H01L 51/54 | (2006.01) | |
| C09K 11/06 | (2006.01) | |
| H01L 51/00 | (2006.01) | |
| C08G 61/12 | (2006.01) | |
| C08K 5/3437 | (2006.01) | |
| C08L 65/00 | (2006.01) | |
| H01L 51/50 | (2006.01) | |

(52) U.S. Cl.
CPC ............ *H01L 51/0085* (2013.01); *C08G 61/12* (2013.01); *C08G 61/122* (2013.01); *C08G 2261/3142* (2013.01); *C08G 2261/3162* (2013.01); *C08G 2261/3221* (2013.01); *C08G 2261/5242* (2013.01); *C08K 5/3437* (2013.01); *C08L 65/00* (2013.01); *C09K 11/06* (2013.01); *C09K 2211/1029* (2013.01); *C09K 2211/1044* (2013.01); *C09K 2211/1059* (2013.01); *C09K 2211/185* (2013.01); *H01L 51/0037* (2013.01); *H01L 51/0039* (2013.01); *H01L 51/0043* (2013.01); *H01L 51/0071* (2013.01); *H01L 51/50* (2013.01); *H01L 2251/308* (2013.01); *H01L 2251/552* (2013.01); *Y10S 428/917* (2013.01)

(58) Field of Classification Search
CPC ............ H01L 51/0043; H01L 51/0071; H01L 51/0085; H01L 51/5016; H01L 2251/552; H01L 51/50; C09K 11/06; C09K 2211/1029; C09K 2211/1044; C09K 2211/1059; C09K 2211/1074; C09K 2211/1466; C09K 2211/185; C08G 61/12; C08G 61/122; C08G 2261/3142; C08G 2261/3162; C08G 2261/3221; C08G 2261/5242; C08L 65/00
See application file for complete search history.

(56) References Cited

U.S. PATENT DOCUMENTS

| | | | |
|---|---|---|---|
| 6,730,417 B2 | 5/2004 | Hu et al. | |
| 6,821,643 B1 | 11/2004 | Hu et al. | |
| 2004/0121184 A1 | 6/2004 | Thompson et al. | |
| 2005/0074630 A1 | 4/2005 | Kanno et al. | |
| 2005/0287391 A1 | 12/2005 | Chang et al. | |
| 2007/0184301 A1 | 8/2007 | Oshiyama et al. | |
| 2007/0196689 A1* | 8/2007 | Ragini et al. .................. 428/690 |
| 2008/0100199 A1 | 5/2008 | Sekine et al. | |
| 2008/0114151 A1 | 5/2008 | Shirasawa et al. | |
| 2008/0248220 A1 | 10/2008 | Sekine et al. | |
| 2010/0013377 A1 | 1/2010 | Male et al. | |
| 2010/0019669 A1* | 1/2010 | Akino et al. .................. 313/504 |
| 2010/0264812 A1 | 10/2010 | Akino et al. | |

FOREIGN PATENT DOCUMENTS

| | | | |
|---|---|---|---|
| CN | 1681904 A | 10/2005 | |
| CN | 1715363 A | 1/2006 | |
| EP | 2 128 168 A1 | 12/2009 | |
| JP | 2004-311420 A | 11/2004 | |
| JP | 2005126686 A | 5/2005 | |
| JP | 2006513278 A | 4/2006 | |
| JP | 1006-188673 A | 7/2006 | |
| JP | 2006219663 A | 8/2006 | |
| JP | 2007099765 A | 4/2007 | |
| JP | 2007-251097 A | 9/2007 | |
| JP | 2008-179617 A | 8/2008 | |
| WO | 2004/016711 A1 | 2/2004 | |
| WO | 2005/013386 A2 | 2/2005 | |
| WO | 2005083033 A1 | 9/2005 | |
| WO | 2008/025997 A1 | 3/2008 | |
| WO | WO 2008/078800 A1 * | 7/2008 | .............. C07F 15/00 |
| WO | 2009/011270 A1 | 1/2009 | |
| WO | 2009/026377 A1 | 2/2009 | |

OTHER PUBLICATIONS

First Office Action issued Jan. 4, 2013 in Chinese Patent Application No. 200980123997.7 to Sumitomo Chemical Co., Ltd., with translation.

Jing He et al., "Synthesis and phosphorescence of iridium (III) pyrazine-pyrimidine complex", Journal of Beijing Forestry University, vol. 28, Supp. 2, Dec. 2006, pp. 137-140.

(Continued)

*Primary Examiner* — Michael H Wilson
(74) *Attorney, Agent, or Firm* — Sughrue Mion, PLLC

(57) ABSTRACT

Disclosed is a composition containing a metal complex and an organic compound, wherein the difference between the absolute value of the energy level of the lowest unoccupied molecular orbit of said metal complex and the absolute value of the lowest unoccupied molecular orbit of said organic compound, as calculated with a computational technique, is less than 0.40 eV.

16 Claims, No Drawings

(56) References Cited

OTHER PUBLICATIONS

Extended European Search Report and Written Opinion dated Jun. 28, 2012, issued in corresponding European Patent Application No. 09770140.3.
Supplementary European Search Report dated Jul. 17, 2012, issued in corresponding European Patent Application No. 09770140.3.
Japanese Patent Office, "Notification of Reason(s) for Rejection," issued in connection with Japanese Patent Application No. 2009-145142, dated Feb. 3, 2014.
Taiwanese Patent Office, "Office Action," issued in connection with Taiwanese Patent Application No. 098120973, dated Mar. 27, 2014.
Office Action issued Mar. 25, 2014 in counterpart Taiwanese Patent Application No. 098120973 with English translation.

* cited by examiner

COMPOSITION CONTAINING A METAL COMPLEX AND ORGANIC COMPOUND, AND LIGHT-EMITTING ELEMENT USING SAID COMPOUND

CROSS REFERENCE TO RELATED APPLICATIONS

This application is a National Stage of International Application No. PCT/JP2009/061367, filed on Jun. 23, 2009, which claims priority from Japanese Patent Application No. 2008-163037, filed on Jun. 23, 2008, the contents of both of which are incorporated herein by reference in their entirety.

TECHNICAL FIELD

The present invention relates to a composition comprising a metal complex and an organic compound, and a device comprising these.

BACKGROUND ART

For example, a composition of a copolymer comprising a fluorenediyl group and a triphenylaminediyl group as repeating units and a metal complex is proposed as an organic material useful for the fabrication of an organic electroluminescent device (Patent Literature 1).

CITATION LIST

Patent Literature

Patent Literature 1: WO2005-13386

DISCLOSURE OF THE INVENTION

Problem to be Solved by the Invention

But, when the above organic material is used for the fabrication of an organic electroluminescent device or the like, a device with a sufficiently low driving voltage is not obtained.

Accordingly, it is an object of the present invention to provide an organic material that provides a device with a low driving voltage when used for the fabrication of an electroluminescent device or the like.

Means for Solving the Problem

First, the present invention provides a composition comprising a metal complex represented by the following formula (1), and an organic compound, wherein a difference between an absolute value of a lowest unoccupied molecular orbital level (hereinafter referred to as an "LUMO") energy level of the metal complex and an absolute value of an LUMO energy level of the organic compound as calculated by a computational scientific approach is less than 0.40 eV:

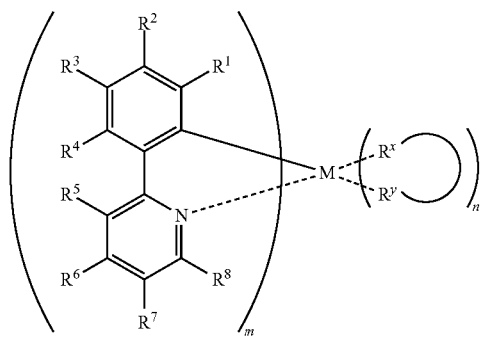

(1)

wherein M is a metal atom of ruthenium, rhodium, palladium, osmium, iridium, or platinum, and $R^1$, $R^2$, $R^3$, $R^4$, $R^5$, $R^6$, $R^7$, and $R^8$ each independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylalkynyl group, a substituted carboxyl group, or a cyano group, or $R^3$ and $R^4$, or $R^5$ and $R^6$ may be bonded to form a ring, provided that at least one of $R^2$ and $R^7$ is a group represented by the following formula (2):

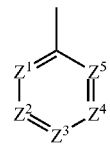

(2)

m is an integer of 1 to 3, and n is an integer of 0 to 2; $Z^1$, $Z^2$, $Z^3$, $Z^4$, and $Z^5$ each independently represent a carbon atom or a nitrogen atom, provided that at least two of $Z^1$, $Z^2$, $Z^3$, $Z^4$, and $Z^5$ are nitrogen atoms; when any of $Z^1$, $Z^2$, $Z^3$, $Z^4$, and $Z^5$ is a carbon atom, a hydrogen atom bonded to the carbon atom may be replaced by a substituent; a moiety represented by the following formula (3):

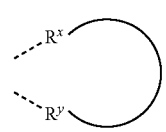

(3)

represents a monoanionic bidentate ligand; and $R^x$ and $R^y$ are atoms bonded to the metal atom M and each independently represent a carbon atom, an oxygen atom, or a nitrogen atom.

Secondly, the present invention provides a compound having a residue of a metal complex represented by the above formula (1), and a residue of an organic compound, wherein a difference between an absolute value of an LUMO energy level of the metal complex and an absolute value of an LUMO energy level of the organic compound as calculated by a computational scientific approach is less than 0.40 eV.

Thirdly, the present invention provides a film and a device formed using the above composition, and a surface light source and a light using the device.

Advantages of the Invention

When the composition and the compound of the present invention (hereinafter referred to as "the composition and the like of the present invention") are used for the fabrication of an organic electroluminescent device or the like, a device with a low driving voltage is obtained, and in a preferred embodiment, a device also having excellent luminous efficiency (that is, having high quantum yield) is obtained. Therefore, the composition and the like of the present invention are particularly useful for the manufacture of a light-emitting device, such as an organic electroluminescent device.

MODE FOR CARRYING OUT THE INVENTION

The present invention will be described below in detail.

<Composition>

—Metal Complex—

The metal complex contained in the composition of the present invention is one represented by the above formula (1).

The group represented by the above formula (2) is one in which at least two of $Z^1$, $Z^2$, $Z^3$, $Z^4$, and $Z^5$ are nitrogen atoms, preferably one in which two or three of $Z^1$, $Z^2$, $Z^3$, $Z^4$, and $Z^5$ are nitrogen atoms, particularly, preferably a combination in which these plurality of nitrogen atoms are not adjacent (that is, not present at adjacent positions), specifically one in which two or three of $Z^1$, $Z^2$, $Z^3$, $Z^4$, and $Z^5$ are nitrogen atoms, and the nitrogen atoms are not adjacent. For the substituent, when any of $Z^1$, $Z^2$, $Z^3$, $Z^4$, and $Z^5$ is a carbon atom, a hydrogen atom bonded to the carbon atom may be replaced by a substituent.

Examples of the group represented by the above formula (2) include groups represented by the following formulas, and among these, groups represented by formula (2-1), and groups represented by formula (2-7) are preferred.

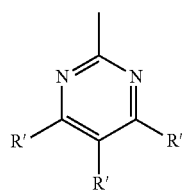
(2-1)

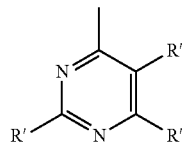
(2-2)

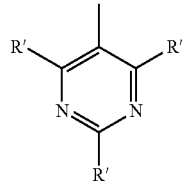
(2-3)

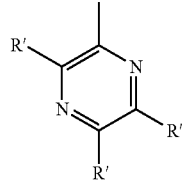
(2-4)

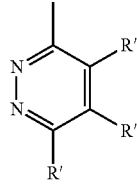
(2-5)

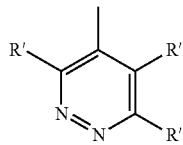
(2-6)

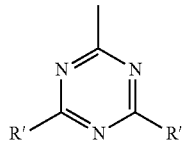
(2-7)

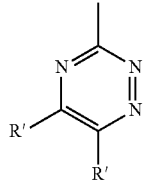
(2-8)

wherein R' is a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylalkynyl group, a substituted carboxyl group, or a cyano group; and a plurality of R' may be the same or different.

The halogen atom, the alkyl group, the alkoxy group, the alkylthio group, the aryl group, the aryloxy group, the arylthio group, the arylalkyl group, the arylalkoxy group, the arylalkylthio group, the acyl group, the acyloxy group, the amide group, the acid imide group, the imine residue, the substituted amino group, the substituted silyl group, the substituted silyloxy group, the substituted silylthio group, the substituted silylamino group, the monovalent heterocyclic group, the heteroaryloxy group, the heteroarylthio group, the arylalkenyl group, the arylalkynyl group, the substituted carboxyl group, and the cyano group represented by R' in the above formulas are the same definitions and specific examples as those represented by R described later.

The metal complex represented by the above formula (1) is composed of a metal atom represented by M, a ligand the number of which is defined by subscript m (hereinafter also referred to as a "bidentate chelating ligand"), and a monoanionic bidentate ligand represented by the above formula (3), the number of which is defined by subscript n, (hereinafter also referred to as a "monoanionic bidentate ligand"). In the following, a simple "ligand" means both ligands of the above bidentate chelating ligand and the above monoanionic bidentate ligand.

In the above formula (1), m is an integer of 1 to 3, and n is an integer of 0 to 2, preferably 0 or 1, and more preferably 0, provided that m+n is the total number of ligands that can be bonded to the metal atom M. For example, in a case where the central metal is iridium, m=1 and n=2, m=2 and n=1, or m=3 and n=0, preferably, m=3 and n=0, or m=2 and n=1, and more preferably, m=3 and n=0. A case where the central metal is rhodium, ruthenium, or osmium is similar to the case of iridium, and m=3 and n=0 are preferred. In a case where the central metal is palladium or platinum, m=1 and n=1, or m=2 and n=0, and preferably m=2 and n=0.

The metal complex represented by the above formula (1) is preferably one represented by the following formula (1a):

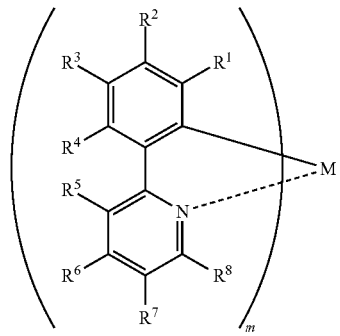

(1a)

wherein M, $R^1$, $R^2$, $R^3$, $R^4$, $R^5$, $R^6$, $R^7$, and $R^8$, and m are as defined above, (that is, n=0). The atoms and the groups represented by $R^1$, $R^2$, $R^3$, $R^4$, $R^5$, $R^6$, $R^7$, and $R^8$ are specifically the same as atoms and groups described and illustrated as R described later. However, in the above formula (1a), m is preferably 2 or 3, in terms of the stability of the compound.

The ligand constituting the metal complex affects the emission color, emission intensity, luminous efficiency, and the like of the metal complex. Therefore, as the metal complex, one composed of a ligand comprising a structure that minimizes the energy deactivation process in the ligand is preferred. Further, the type and/or substitution position of a substituent of the ligand affects the electronic properties of the ligand, and therefore affects the properties of the metal complex. From the above viewpoints, it is considered that by having the structure represented by the above formula (1), the above metal complex can improve the luminous efficiency, stability, and the like of the metal complex.

In the above metal complex, at least one of $R^2$ and $R^7$ in the above formula (1) or the above formula (1a) is a group represented by the above formula (2), and it is preferred that $R^7$ is a group represented by the above formula (2). In addition, in the above metal complex, a structure in which $R^2$ and $R^7$ are each independently a group represented by the above formula (2) is also preferred. It is more preferred that $R^7$ is one represented by the above formula (2-1) and the above $R^2$ is a hydrogen atom, that $R^7$ is one represented by the above formula (2-7) and the above $R^2$ is a hydrogen atom, and that the above $R^2$ and $R^7$ are each independently a group represented by the above formula (2-1) or (2-7). At least one peak wavelength of the PL (photoluminescence) emission spectrum of the composition of the present invention is preferably 550 nm to 800 nm, further preferably 570 nm to 750 nm, more preferably 570 nm to 700 nm, and particularly preferably 600 nm to 700 nm.

The metal atom M that is the central metal of the above metal complex is a metal atom of ruthenium, rhodium, palladium, osmium, iridium, or platinum. These metal atoms cause spin-orbit interaction in the metal complex and can cause intersystem crossing between the singlet state and the triplet state. The above metal atom M is preferably, osmium, iridium, or platinum, further preferably, iridium or platinum, and particularly preferably iridium.

In the metal complex represented by the above formula (1) or the above formula (1a), examples of the above bidentate chelating ligand include structures as represented by the following formulas:

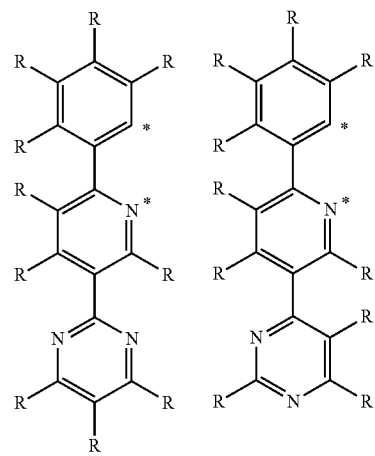

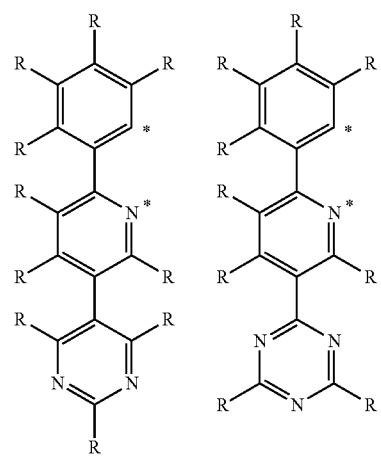

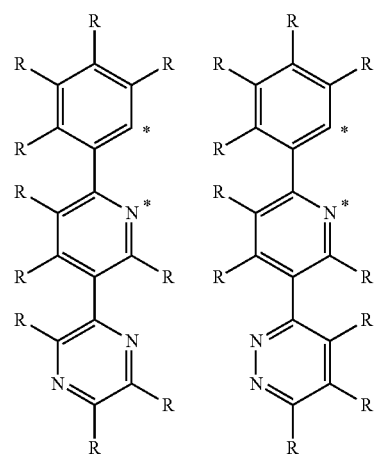

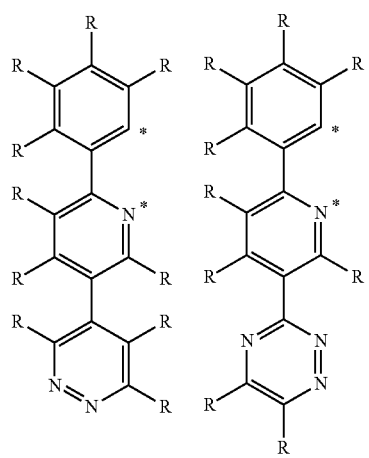
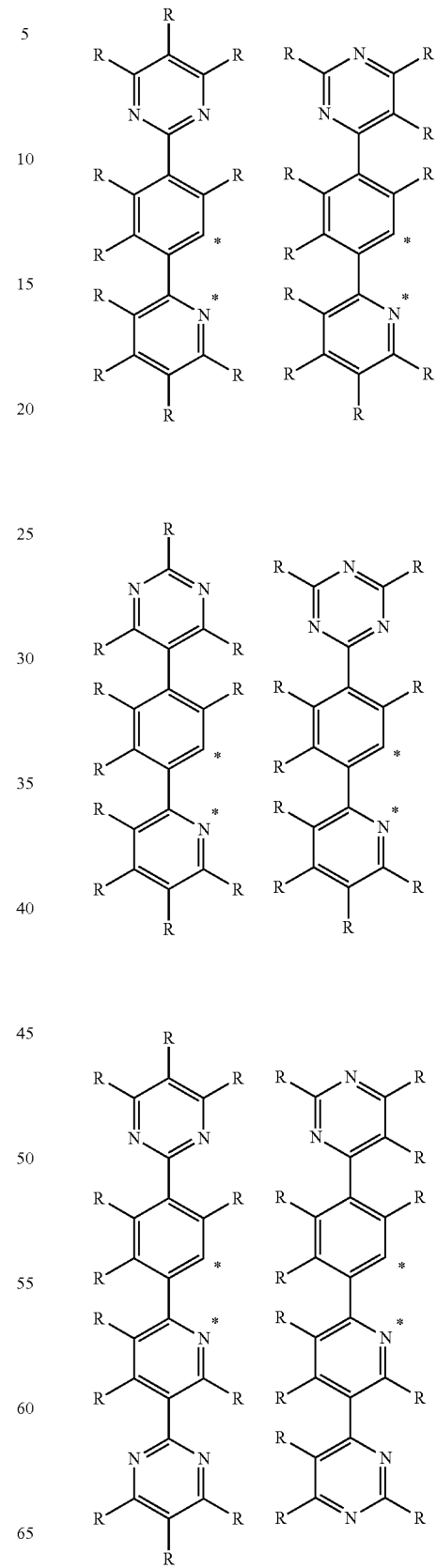

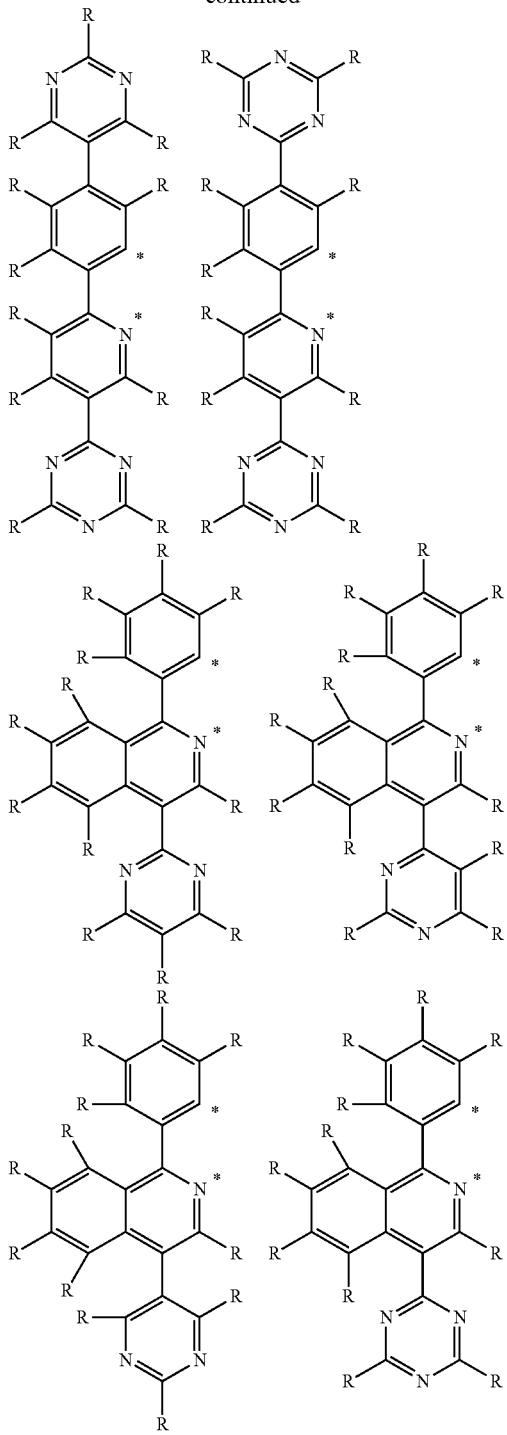

wherein R is a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylalkynyl group, a substituted carboxyl group, or a cyano group; *represents a site bonded to the metal atom M; and a plurality of R may be the same or different.

Examples of the above halogen atom represented by R include a fluorine atom, a chlorine atom, a bromine atom, and an iodine atom.

The above alkyl group represented by R may be any of linear, branched, or cyclic. This alkyl group usually has about 1 to 10 carbon atoms. Examples of the alkyl group include a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a 2-ethylhexyl group, a nonyl group, a decyl group, a 3,7-dimethyloctyl group, a lauryl group, a trifluoromethyl group, a pentafluoroethyl group, a perfluorobutyl group, a perfluorohexyl group, and a perfluorooctyl group, and a t-butyl group, a pentyl group, a hexyl group, an octyl group, a 2-ethylhexyl group, a decyl group, and a 3,7-dimethyloctyl group are preferred.

The above alkoxy group represented by R may be any of linear, branched, or cyclic. This alkoxy group usually has about 1 to 10 carbon atoms. Examples of the alkoxy group include a methoxy group, an ethoxy group, a propyloxy group, an isopropyloxy group, a butoxy group, an isobutoxy group, an s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group, and a 2-methoxyethyloxy group, and a pentyloxy group, a hexyloxy group, an octyloxy group, a 2-ethylhexyloxy group, a decyloxy group, and a 3,7-dimethyloctyloxy group are preferred.

The above alkylthio group represented by R may be any of linear, branched, or cyclic. This alkylthio group usually has about 1 to 10 carbon atoms. Examples of the alkylthio group include a methylthio group, an ethylthio group, a propylthio group, an isopropylthio group, a butylthio group, an isobutylthio group, an s-butylthio group, a t-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group, and a trifluoromethylthio group, and a pentylthio group, a hexylthio group, an octylthio group, a 2-ethylhexylthio group, a decylthio group, and a 3,7-dimethyloctylthio group are preferred.

The above aryl group represented by R usually has about 6 to 60 carbon atoms, and preferably 7 to 48 carbon atoms. Examples of the aryl group include a phenyl group, a $C_1$ to $C_{12}$ alkoxyphenyl group (the "$C_1$ to $C_{12}$ alkoxy" means that the alkoxy moiety has 1 to 12 carbon atoms. The same applies hereinafter.), a $C_1$ to $C_{12}$ alkylphenyl group (the "$C_1$ to $C_{12}$ alkyl" means that the alkyl moiety has 1 to 12 carbon atoms. The same applies hereinafter.), a 1-naphthyl group, a 2-naphthyl group, a 1-anthracenyl group, a 2-anthracenyl group, a 9-anthracenyl group, and a pentafluorophenyl group, and a $C_1$ to $C_{12}$ alkoxyphenyl group and a $C_1$ to $C_{12}$ alkylphenyl group are preferred. Here, the aryl group is an atomic group in which one hydrogen atom is removed from an aromatic hydrocarbon. This aromatic hydrocarbon includes those having a condensed ring, and those in which two or more independent benzene rings or condensed rings are bonded directly or via a group, such as vinylene. Further, the aryl group may have a substituent, and examples of the substituent include a $C_1$ to $C_{12}$ alkoxyphenyl group and a $C_1$ to $C_{12}$ alkylphenyl group.

Examples of the above $C_1$ to $C_{12}$ alkoxyphenyl group include a methoxyphenyl group, an ethoxyphenyl group, a propyloxyphenyl group, an isopropyloxyphenyl group, a butoxyphenyl group, an isobutoxyphenyl group, an s-butoxyphenyl group, a t-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, and a lauryloxyphenyl group.

Examples of the above $C_1$ to $C_{12}$ alkylphenyl group include a methylphenyl group, an ethylphenyl group, a dimethylphenyl group, a propylphenyl group, a mesityl group, a methylethylphenyl group, an isopropylphenyl group, a butylphenyl group, an isobutylphenyl group, s-butylphenyl, a t-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

The above aryloxy group represented by R usually has about 6 to 60 carbon atoms, and preferably 7 to 48 carbon atoms. Examples of the aryloxy group include a phenoxy group, a $C_1$ to $C_{12}$ alkoxyphenoxy group, a $C_1$ to $C_{12}$ alkylphenoxy group, a 1-naphthyloxy group, a 2-naphthyloxy group, and a pentafluorophenyloxy group, and a $C_1$ to $C_{12}$ alkoxyphenoxy group and a $C_1$ to $C_{12}$ alkylphenoxy group are preferred.

Examples of the above $C_1$ to $C_{12}$ alkoxyphenoxy group include a methoxyphenoxy group, an ethoxyphenoxy group, a propyloxyphenoxy group, an isopropyloxyphenoxy group, a butoxyphenoxy group, an isobutoxyphenoxy group, an s-butoxyphenoxy group, a t-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, and a lauryloxyphenoxy group.

Examples of the above $C_1$ to $C_{12}$ alkylphenoxy group include a methylphenoxy group, an ethylphenoxy group, a dimethylphenoxy group, a propylphenoxy group, 1,3,5-trimethylphenoxy group, a methylethylphenoxy group, an isopropylphenoxy group, a butylphenoxy group, an isobutylphenoxy group, an s-butylphenoxy group, a t-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

The above arylthio group represented by R usually has about 6 to 60 carbon atoms, and preferably 7 to 48 carbon atoms. Examples of the arylthio group include a phenylthio group, a $C_1$ to $C_{12}$ alkoxyphenylthio group, a $C_1$ to $C_{12}$ alkylphenylthio group, a 1-naphthylthio group, a 2-naphthylthio group, and a pentafluorophenylthio group, and a $C_1$ to $C_{12}$ alkoxyphenylthio group and a $C_1$ to $C_{12}$ alkylphenylthio group are preferred.

The above arylalkyl group represented by R usually has about 7 to 60 carbon atoms, and preferably 7 to 48 carbon atoms. Examples of the arylalkyl group include a phenyl-$C_1$ to $C_{12}$ alkyl group, a $C_1$ to $C_{12}$ alkoxyphenyl-$C_1$ to $C_{12}$ alkyl group, a $C_1$ to $C_{12}$ alkylphenyl-$C_1$ to $C_{12}$ alkyl group, a 1-naphthyl-$C_1$ to $C_{12}$ alkyl group, and a 2-naphthyl-$C_1$ to $C_{12}$ alkyl group, and a $C_1$ to $C_{12}$ alkoxyphenyl-$C_1$ to $C_{12}$ alkyl group and a $C_1$ to $C_{12}$ alkylphenyl-$C_1$ to $C_{12}$ alkyl group are preferred.

The above arylalkoxy group represented by R usually has about 7 to 60 carbon atoms, and preferably 7 to 48 carbon atoms. Examples of the arylalkoxy group include a phenyl-$C_1$ to $C_{12}$ alkoxy group, such as a phenylmethoxy group, a phenylethoxy group, a phenylbutoxy group, a phenylpentyloxy group, a phenylhexyloxy group, a phenylheptyloxy group, and a phenyloctyloxy group, a $C_1$ to $C_{12}$ alkoxyphenyl-$C_1$ to $C_{12}$ alkoxy group, a $C_1$ to $C_{12}$ alkylphenyl-$C_1$ to $C_{12}$ alkoxy group, a 1-naphthyl-$C_1$ to $C_{12}$ alkoxy group, and a 2-naphthyl-$C_1$ to $C_{12}$ alkoxy group, and a $C_1$ to $C_{12}$ alkoxyphenyl-$C_1$ to $C_{12}$ alkoxy group and a $C_1$ to $C_{12}$ alkylphenyl-$C_1$ to $C_{12}$ alkoxy group are preferred.

The above arylalkylthio group represented by R usually has about 7 to 60 carbon atoms, and preferably 7 to 48 carbon atoms. Examples of the arylalkylthio group include a phenyl-$C_1$ to $C_{12}$ alkylthio group, a $C_1$ to $C_{12}$ alkoxyphenyl-$C_1$ to $C_{12}$ alkylthio group, a $C_1$ to $C_{12}$ alkylphenyl-$C_1$ to $C_{12}$ alkylthio group, a 1-naphthyl-$C_1$ to $C_{12}$ alkylthio group, and a 2-naphthyl-$C_1$ to $C_{12}$ alkylthio group, and a $C_1$ to $C_{12}$ alkoxyphenyl-$C_1$ to $C_{12}$ alkylthio group and a $C_1$ to $C_{12}$ alkylphenyl-$C_1$ to $C_{12}$ alkylthio group are preferred.

The above acyl group represented by R usually has about 2 to 20 carbon atoms, and preferably 2 to 18 carbon atoms. Examples of the acyl group include an acetyl group, a propionyl group, a butyryl group, an isobutyryl group, a pivaloyl group, a benzoyl group, a trifluoroacetyl group, and a pentafluorobenzoyl group.

The above acyloxy group represented by R usually has about 2 to 20 carbon atoms, and preferably 2 to 18 carbon atoms. Examples of the acyloxy group include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

The above amide group represented by R usually has about 2 to 20 carbon atoms, and preferably 2 to 18 carbon atoms. Examples of the amide group include a formamide group, an acetamide group, a propioamide group, a butyramide group, a benzamide group, a trifluoroacetamide group, a pentafluorobenzamide group, a diformamide group, a diacetamide group, a dipropioamide group, a dibutyramide group, a dibenzamide group, a ditrifluoroacetamide group, and a dipentafluorobenzamide group.

The above acid imide group represented by R means a monovalent residue obtained by removing from an acid imide one hydrogen atom bonded to its nitrogen atom. This acid imide group usually has about 2 to 60 carbon atoms, and preferably 2 to 48 carbon atoms. Examples of the acid imide group include groups represented by the following structural formulas:

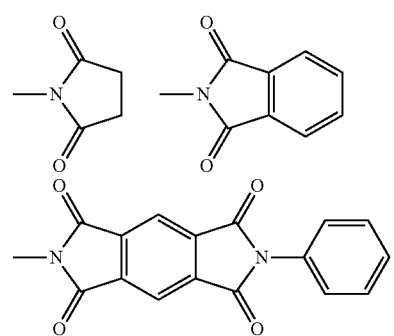

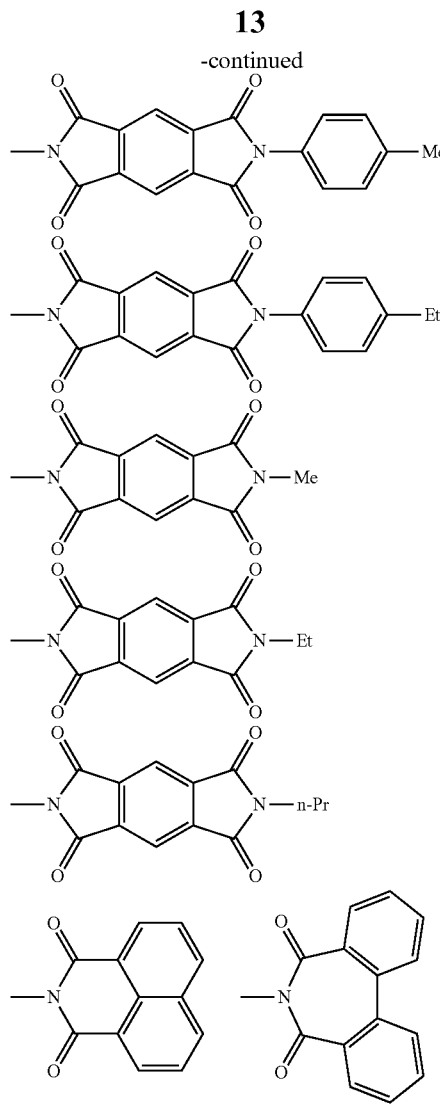

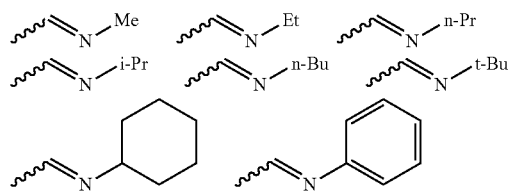

wherein a line extending from a nitrogen atom represents a bond, Me represents a methyl group, Et represents an ethyl group, and n-Pr represents an n-propyl group; and the same applies hereinafter.

The above imine residue represented by R means a monovalent residue in which one hydrogen atom is removed from an imine compound (that is, an organic compound having —N=C— in the molecule. Examples of the organic compound include aldimine, ketimine, and compounds in which a hydrogen atom bonded to a nitrogen atom in these molecules is replaced by an alkyl group or the like.). This imine residue usually has about 2 to 20 carbon atoms, and preferably 2 to 18 carbon atoms. Specific examples of the imine residue include groups represented by the following structural formulas:

wherein i-Pr represents an isopropyl group, n-Bu represents an n-butyl group, and t-Bu represents a t-butyl group; a bond represented by a wavy line means "a bond represented by a wedge shape" and/or "a bond represented by a broken line;" and here, the "bond represented by a wedge shape" means a bond projecting toward this side from the plane of the paper, and the "bond represented by a broken line" means a bond projecting on the other side of the plane of the paper.

The above substituted amino group represented by R means an amino group substituted with one or two groups selected from the group consisting of an alkyl group, an aryl group, an arylalkyl group, and a monovalent heterocyclic group. The alkyl group, the aryl group, the arylalkyl group, or the monovalent heterocyclic group may have a substituent. The substituted amino group usually has about 1 to 60 carbon atoms, and preferably 2 to 48 carbon atoms, not including the carbon atoms of the substituent. Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, an s-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a $C_1$ to $C_{12}$ alkoxyphenylamino group, a di($C_1$ to $C_{12}$ alkoxyphenyl)amino group, a di($C_1$ to $C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-$C_1$ to $C_{12}$ alkylamino group, a $C_1$ to $C_{12}$ alkoxyphenyl-$C_1$ to $C_{12}$ alkylamino group, a $C_1$ to $C_{12}$ alkylphenyl-$C_1$ to $C_{12}$ alkylamino group, a di($C_1$ to $C_{12}$ alkoxyphenyl-$C_1$ to $C_{12}$ alkyl)amino group, a di($C_1$ to $C_{12}$ alkylphenyl-$C_1$ to $C_{12}$ alkyl)amino group, a 1-naphthyl-$C_1$ to $C_{12}$ alkylamino group, and a 2-naphthyl-$C_1$ to $C_{12}$ alkylamino group.

The above substituted silyl group represented by R means a silyl group substituted with one, two, or three groups selected from the group consisting of an alkyl group, an aryl group, an arylalkyl group, and a monovalent heterocyclic group. The substituted silyl group usually has about 1 to 60 carbon atoms, and preferably 3 to 48 carbon atoms. The alkyl group, the aryl group, the arylalkyl group, or the monovalent heterocyclic group may have a substituent. Examples of the substituted silyl group include a trimethylsilyl group, a triethylsilyl group, a tripropylsilyl group, a triisopropylsilyl group, a dimethylisopropylsilyl group, a diethylisopropylsilyl group, a t-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, a lauryldimethylsilyl group, a phenyl-$C_1$ to $C_{12}$ alkylsilyl group, a $C_1$ to $C_{12}$ alkoxyphenyl-$C_1$ to $C_{12}$ alkylsilyl group, a $C_1$ to $C_{12}$ alkylphenyl-$C_1$ to $C_{12}$ alkylsilyl group, a 1-naphthyl-$C_1$ to $C_{12}$ alkylsilyl group, a 2-naphthyl-$C_1$ to $C_{12}$ alkylsilyl group, a phenyl-$C_1$ to $C_{12}$ alkyldimethylsilyl group, a triphenylsilyl group, a tri-p-xylylsilyl group, a tribenzylsilyl group, a diphenylmethylsilyl group, a t-butyldiphenylsilyl group, and a dimethylphenylsilyl group.

The above substituted silyloxy group represented by R means a silyloxy group substituted with one, two, or three groups selected from the group consisting of an alkoxy group, an aryloxy group, an arylalkoxy group, and a monovalent heterocyclic oxy group. The substituted silyloxy group usually has about 1 to 60 carbon atoms, and preferably 3 to 48 carbon atoms. The alkoxy group, the aryloxy group, the arylalkoxy group, or the monovalent heterocyclic oxy group may have a substituent. Examples of the substituted silyloxy group include a trimethylsilyloxy group, a triethylsilyloxy group, a tripropylsilyloxy group, a triisopropylsilyloxy group, a dimethylisopropylsilyloxy group, a diethylisopropylsilyloxy group, a t-butyldimethylsilyloxy group, a pentyldimethylsilyloxy group, a hexyldimethylsilyloxy group, a heptyldimethylsilyloxy group, an octyldimethylsilyloxy group, a 2-ethylhexyl-dimethylsilyloxy group, a nonyldimethylsilyloxy group, a decyldimethylsilyloxy group, a 3,7-dimethyloctyl-dimethylsilyloxy group, a lauryldimethylsilyloxy group, a phenyl-$C_1$ to $C_{12}$ alkylsilyloxy group, a $C_1$ to $C_{12}$ alkoxyphenyl-$C_1$ to $C_{12}$ alkylsilyloxy group, a $C_1$ to $C_{12}$ alkylphenyl-$C_1$ to $C_{12}$ alkylsilyloxy group, a 1-naphthyl-$C_1$ to $C_{12}$ alkylsilyloxy group, a 2-naphthyl-$C_1$ to $C_{12}$ alkylsilyloxy group, a phenyl-$C_1$ to $C_{12}$ alkyldimethylsilyloxy group, a triphenylsilyloxy group, a tri-p-xylylsilyloxy group, a tribenzylsilyloxy group, a diphenylmethylsilyloxy group, a t-butyldiphenylsilyloxy group, and a dimethylphenylsilyloxy group.

The above substituted silylthio group represented by R means a silylthio group substituted with one, two, or three groups selected from the group consisting of an alkylthio group, an arylthio group, an arylalkylthio group, and a monovalent heterocyclic thio group. The substituted silylthio group usually has about 1 to 60 carbon atoms, and preferably 3 to 48 carbon atoms. The alkoxy group, the arylthio group, the arylalkylthio group, or the monovalent heterocyclic thio group may have a substituent. Examples of the substituted silylthio group include a trimethylsilylthio group, a triethylsilylthio group, a tripropylsilylthio group, a triisopropylsilylthio group, a dimethylisopropylsilylthio group, a diethylisopropylsilylthio group, a t-butyldimethylsilylthio group, a pentyldimethylsilylthio group, a hexyldimethylsilylthio group, a heptyldimethylsilylthio group, an octyldimethylsilylthio group, a 2-ethylhexyl-dimethylsilylthio group, a nonyldimethylsilylthio group, a decyldimethylsilylthio group, a 3,7-dimethyloctyl-dimethylsilylthio group, a lauryldimethylsilylthio group, a phenyl-$C_1$ to $C_{12}$ alkylsilylthio group, a $C_1$ to $C_{12}$ alkoxyphenyl-$C_1$ to $C_{12}$ alkylsilylthio group, a $C_1$ to $C_{12}$ alkylphenyl-$C_1$ to $C_{12}$ alkylsilylthio group, a 1-naphthyl-$C_1$ to $C_{12}$ alkylsilylthio group, a 2-naphthyl-$C_1$ to $C_{12}$ alkylsilylthio group, a phenyl-$C_1$ to $C_{12}$ alkyldimethylsilylthio group, a triphenylsilylthio group, a tri-p-xylylsilylthio group, a tribenzylsilylthio group, a diphenylmethylsilylthio group, a t-butyldiphenylsilylthio group, and a dimethylphenylsilylthio group.

The above substituted silylamino group represented by R means a silylamino group substituted with one, two, or three groups selected from the group consisting of an alkylamino group, an arylamino group, an arylalkylamino group, and a monovalent heterocyclic amino group. The substituted silylamino group usually has about 1 to 60 carbon atoms, and preferably 3 to 48 carbon atoms. The alkoxy group, the arylamino group, the arylalkylamino group, or the monovalent heterocyclic amino group may have a substituent. Examples of the substituted silylamino group include a trimethylsilylamino group, a triethylsilylamino group, a tripropylsilylamino group, a triisopropylsilylamino group, a dimethylisopropylsilylamino group, a diethylisopropylsilylamino group, a t-butyldimethylsilylamino group, a pentyldimethylsilylamino group, a hexyldimethylsilylamino group, a heptyldimethylsilylamino group, an octyldimethylsilylamino group, a 2-ethylhexyl-dimethylsilylamino group, a nonyldimethylsilylamino group, a decyldimethylsilylamino group, a 3,7-dimethyloctyl-dimethylsilylamino group, a lauryldimethylsilylamino group, a phenyl-$C_1$ to $C_{12}$ alkylsilyloxy group, a $C_1$ to $C_{12}$ alkoxyphenyl-$C_1$ to $C_{12}$ alkylsilylamino group, a $C_1$ to $C_{12}$ alkylphenyl-$C_1$ to $C_{12}$ alkylsilylamino group, a 1-naphthyl-$C_1$ to $C_{12}$ alkylsilylamino group, a 2-naphthyl-$C_1$ to $C_{12}$ alkylsilylamino group, a phenyl-$C_1$ to $C_{12}$ alkyldimethylsilylamino group, a triphenylsilylamino group, a tri-p-xylylsilylamino group, a tribenzylsilylamino group, a diphenylmethylsilylamino group, a t-butyldiphenylsilyloamino group, and a dimethylphenylsilylamino group.

The above monovalent heterocyclic group represented by R means a remaining atomic group obtained by removing one hydrogen atom from a heterocyclic compound. The monovalent heterocyclic group usually has about 3 to 60 carbon atoms, and preferably 3 to 20 carbon atoms. The carbon atoms of a substituent are not included in the carbon atoms of the monovalent heterocyclic group. Here, the heterocyclic compound refers to, among organic compounds having a cyclic structure, those in which the elements constituting the ring are not only a carbon atom and which comprise a heteroatom, such as oxygen, sulfur, nitrogen, phosphorus, or boron, in the ring. Examples of the monovalent heterocyclic group include a thienyl group, a $C_1$ to $C_{12}$ alkylthienyl group, a pyrrolyl group, a furyl group, a pyridyl group, a $C_1$ to $C_{12}$ alkylpyridyl group, a piperidyl group, a quinolyl group, and an isoquinolyl group, and a thienyl group, a $C_1$ to $C_{12}$ alkylthienyl group, a pyridyl group, and a $C_1$ to $C_{12}$ alkylpyridyl group are preferred. In addition, the monovalent heterocyclic group is preferably a monovalent aromatic heterocyclic group.

The above heteroaryloxy group represented by R usually has about 6 to 60 carbon atoms, and preferably 7 to 48 carbon atoms. Examples of the heteroaryloxy group include a thienyl group, a $C_1$ to $C_{12}$ alkoxythienyl group, a $C_1$ to $C_{12}$ alkylthienyl group, a pyridyloxy group, a pyridyloxy group, and an isoquinolyloxy group, and a $C_1$ to $C_{12}$ alkoxypyridyl group and a $C_1$ to $C_{12}$ alkylpyridyl group are preferred.

Examples of the above $C_1$ to $C_{12}$ alkoxypyridyl group include a methoxypyridyl group, an ethoxypyridyl group, a propyloxypyridyl group, an isopropyloxypyridyl group, a butoxypyridyl group, an isobutoxypyridyl group, an s-butoxypyridyl group, a t-butoxypyridyl group, a pentyloxypyridyl group, a hexyloxypyridyl group, a cyclohexyloxypyridyl group, a heptyloxypyridyl group, an octyloxypyridyl group, a 2-ethylhexyloxypyridyl group, a nonyloxypyridyl group, a decyloxypyridyl group, a 3,7-dimethyloctyloxypyridyl group, and a lauryloxypyridyl group.

Examples of the above $C_1$ to $C_{12}$ alkylpyridyloxy group include a methylpyridyloxy group, an ethylpyridyloxy group, a dimethylpyridyloxy group, a propylpyridyloxy group, a 1,3,5-trimethylpyridyloxy group, a methylethylpyridyloxy group, an isopropylpyridyloxy group, a butylpyridyloxy group, an isobutylpyridyloxy group, an s-butylpyridyloxy group, a t-butylpyridyloxy group, a pentylpyridyloxy group, an isoamylpyridyloxy group, a hexylpyridyloxy group, a heptylpyridyloxy group, an octylpyridyloxy group, a nonylpyridyloxy group, a decylpyridyloxy group, and a dodecylpyridyloxy group.

The above heteroarylthio group represented by R usually has about 6 to 60 carbon atoms, and preferably 7 to 48 carbon atoms. Examples of the heteroarylthio group include a pyridylthio group, a $C_1$ to $C_{12}$ alkoxypyridylthio group, a $C_1$ to $C_{12}$ alkylpyridylthio group, and an isoquinolylthio group, and a $C_1$ to $C_{12}$ alkoxypyridylthio group and a $C_1$ to $C_{12}$ alkylpyridylthio group are preferred.

The above arylalkenyl group represented by R usually has about 8 to 60 carbon atoms, and preferably 8 to 48 carbon atoms. Examples of the arylalkenyl group include a phenyl-$C_2$ to $C_{12}$ alkenyl group (the "$C_2$ to $C_{12}$ alkenyl" means that the alkenyl moiety has 2 to 12 carbon atoms. The same applies hereinafter.), a $C_1$ to $C_{12}$ alkoxyphenyl-$C_2$ to $C_{12}$ alkenyl group, a $C_1$ to $C_{12}$ alkylphenyl-$C_2$ to $C_{12}$ alkenyl group, a 1-naphthyl-$C_2$ to $C_{12}$ alkenyl group, and a 2-naphthyl-$C_2$ to $C_{12}$ alkenyl group, and a $C_1$ to $C_{12}$ alkoxyphenyl-$C_2$ to $C_{12}$ alkenyl group and a $C_2$ to $C_{12}$ alkylphenyl-$C_1$ to $C_{12}$ alkenyl group are preferred.

The above arylalkynyl group represented by R usually has about 8 to 60 carbon atoms, and preferably 8 to 48 carbon atoms. Examples of the arylalkynyl group include a phenyl-$C_2$ to $C_{12}$ alkynyl group (the "$C_2$ to $C_{12}$ alkynyl" means that the alkynyl moiety has 2 to 12 carbon atoms. The same applies hereinafter.), a $C_1$ to $C_{12}$ alkoxyphenyl-$C_2$ to $C_{12}$ alkynyl group, a $C_1$ to $C_{12}$ alkylphenyl-$C_2$ to $C_{12}$ alkynyl group, a 1-naphthyl-$C_2$ to $C_{12}$ alkynyl group, and a 2-naphthyl-$C_2$ to $C_{12}$ alkynyl group, and a $C_1$ to $C_{12}$ alkoxyphenyl-$C_2$ to $C_{12}$ alkynyl group and a $C_1$ to $C_{12}$ alkylphenyl-$C_2$ to $C_{12}$ alkynyl group are preferred.

The above substituted carboxyl group represented by R usually has about 2 to 60 carbon atoms, and preferably 2 to 48 carbon atoms, and means a carboxyl group substituted with an alkyl group, an aryl group, an arylalkyl group, or a monovalent heterocyclic group. Examples of the substituted carboxyl group include a methoxycarbonyl group, an ethoxycarbonyl group, a propoxycarbonyl group, an isopropoxycarbonyl group, a butoxycarbonyl group, an isobutoxycarbonyl group, an s-butoxycarbonyl group, a t-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a pyridyloxycarbonyl group, a naphthoxycarbonyl group, and a pyridyloxycarbonyl group. The alkyl group, the aryl group, the arylalkyl group, or the monovalent heterocyclic group may have a substituent. The carbon atoms of the substituent are not included in the carbon atoms of the substituted carboxyl group.

For the above monoanionic bidentate ligand, it is preferred that the portion of an arc connecting $R^x$ and $R^y$ in the above formula (3) is a divalent group in which the number of atoms other than a hydrogen atom is 3 to 30, and examples thereof include the following structures:

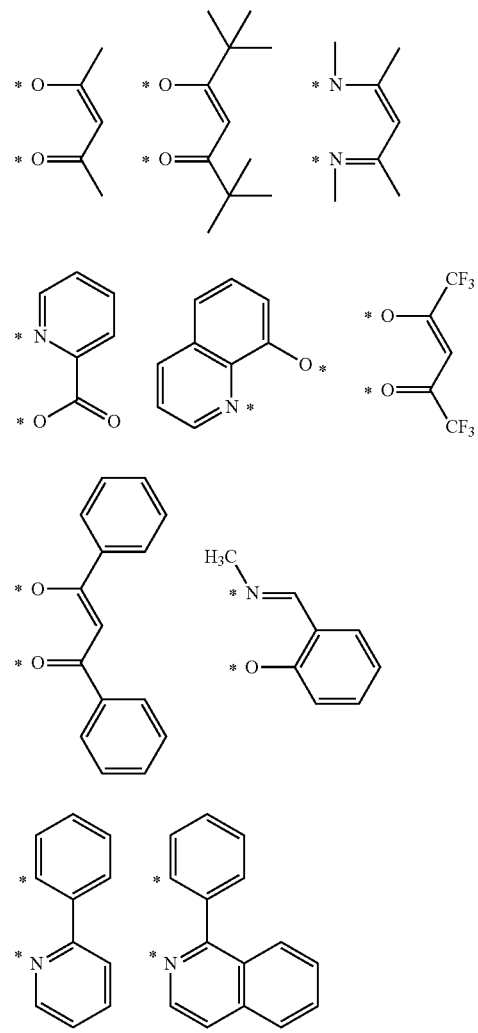

wherein * represents a site bonded to the metal atom M.

Examples of the above metal complex include those shown below.

M-1 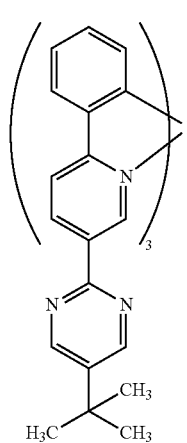
M-2 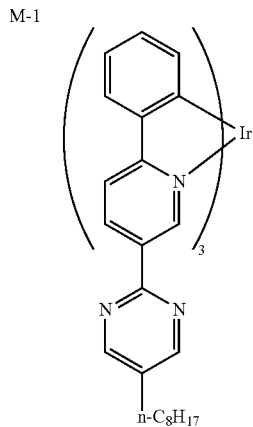
M-3 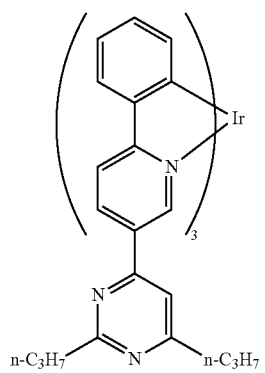
M-4 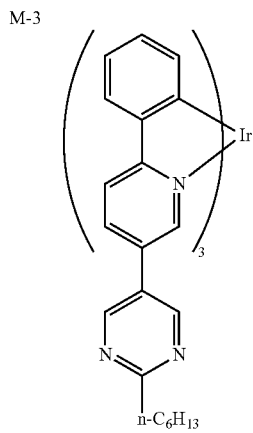
M-5 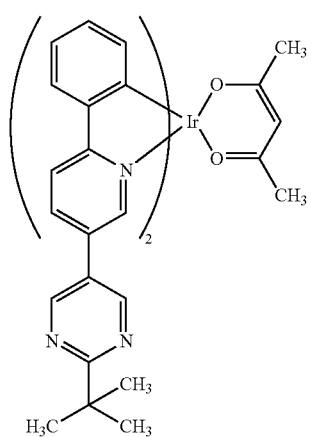
M-6 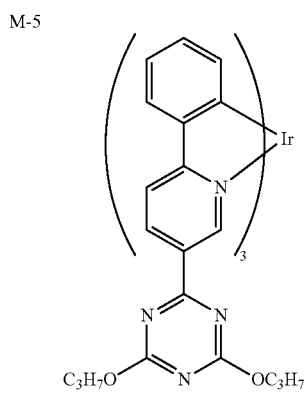

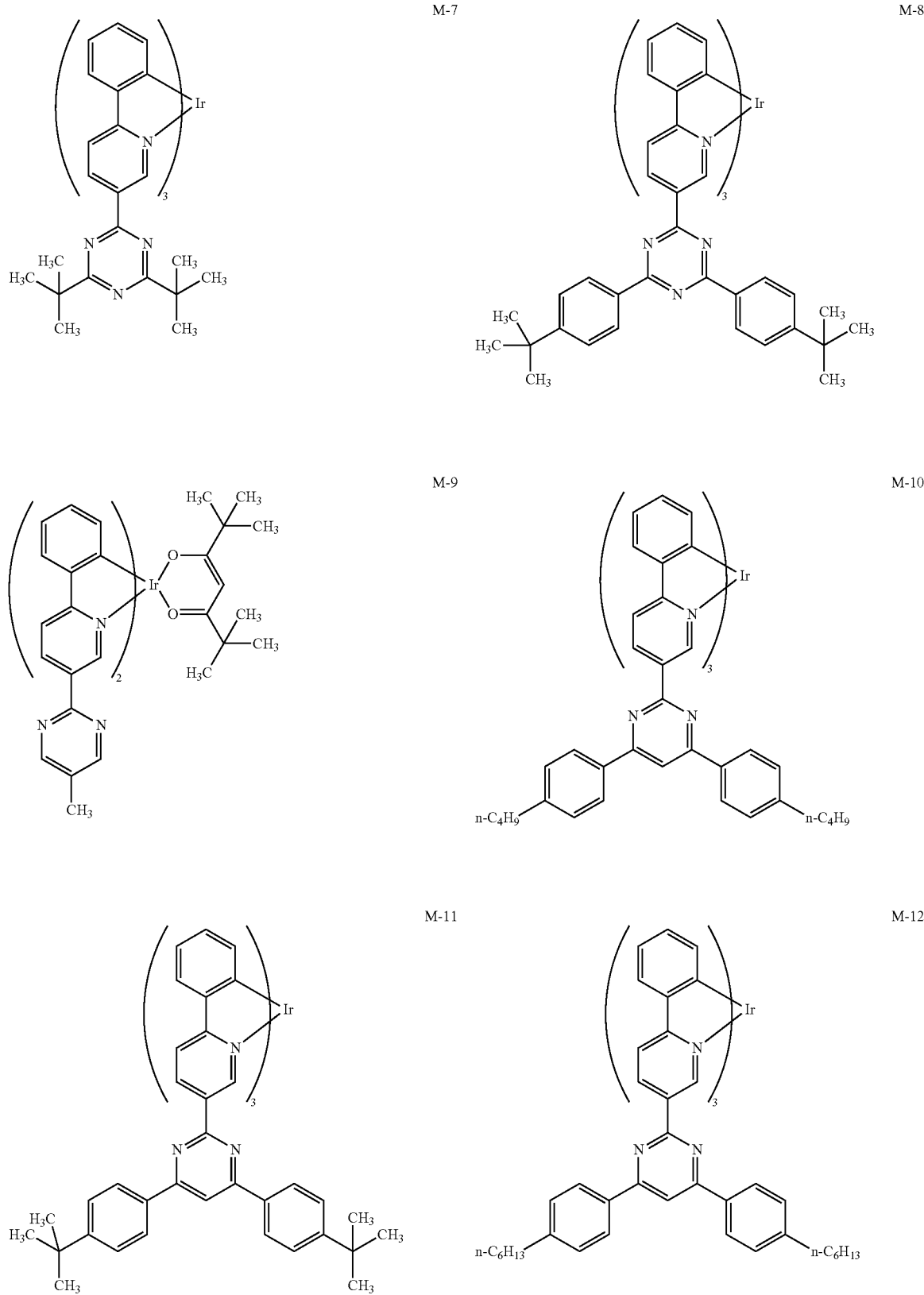

M-13
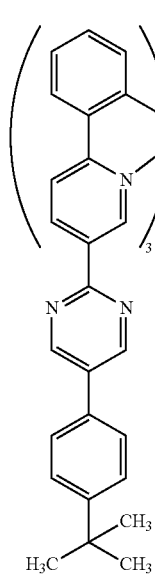
M-14
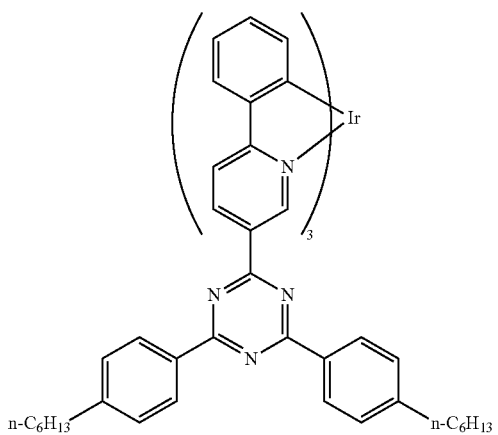
M-15
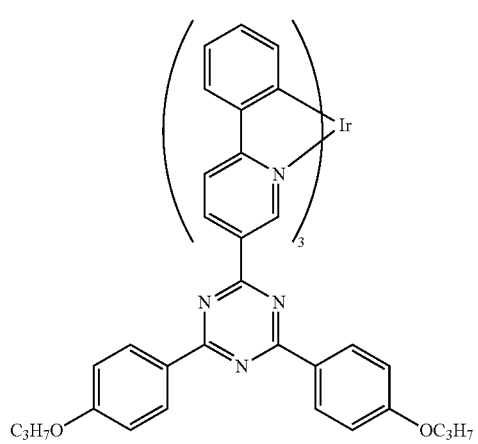
M-16
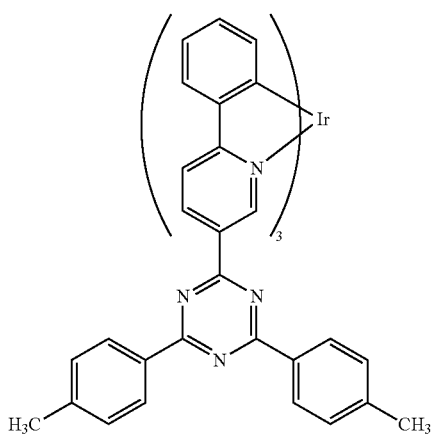
M-17
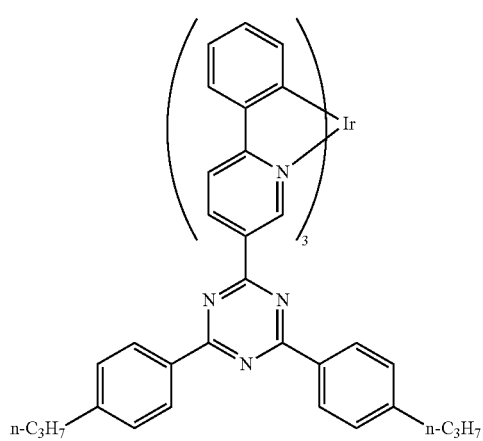
M-18
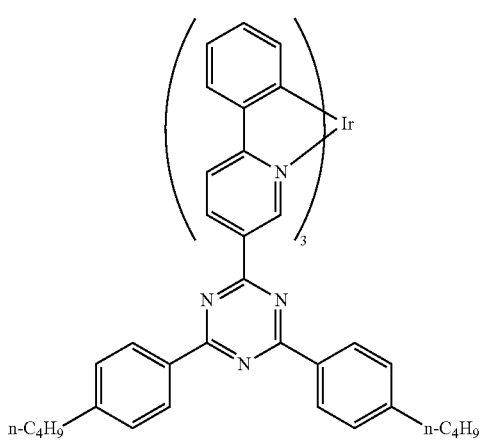

-continued
M-19
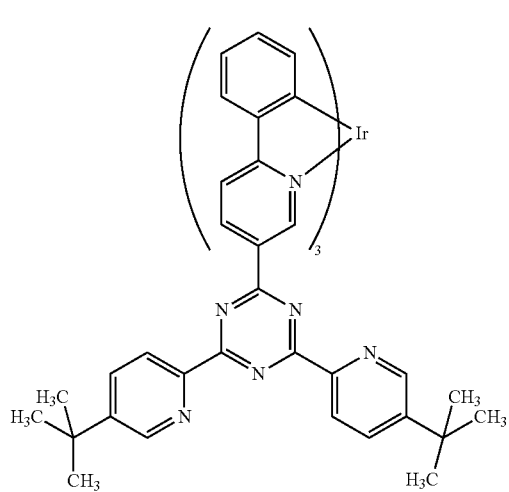
M-20
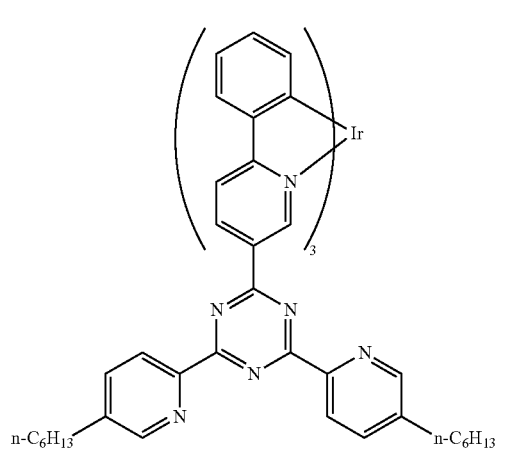
M-21
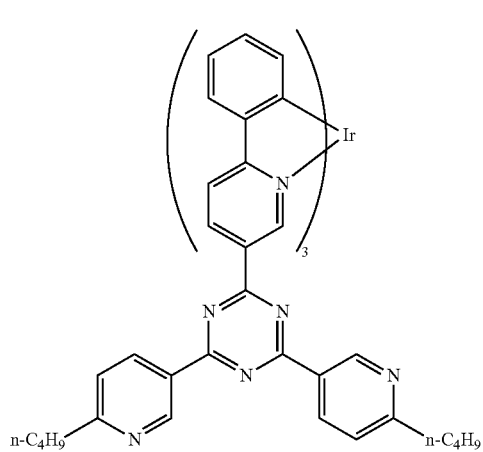
M-22
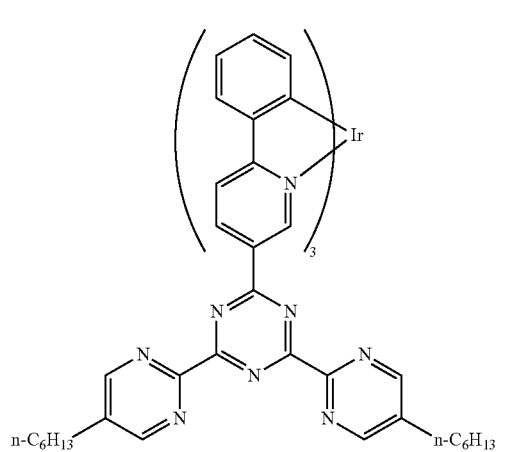
M-23
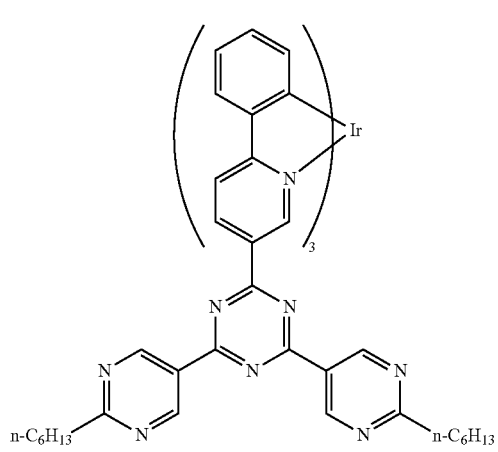
M-24
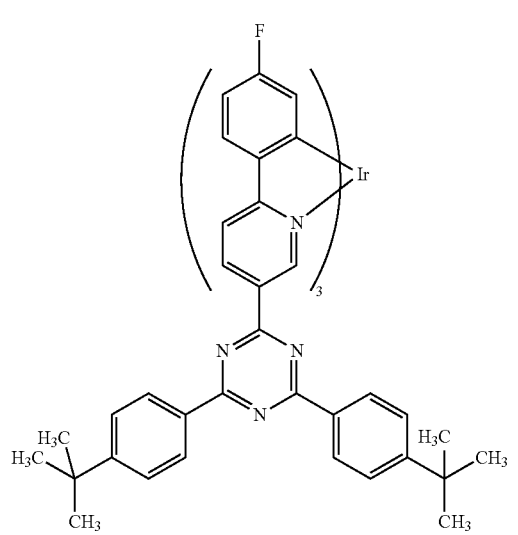

-continued
M-25
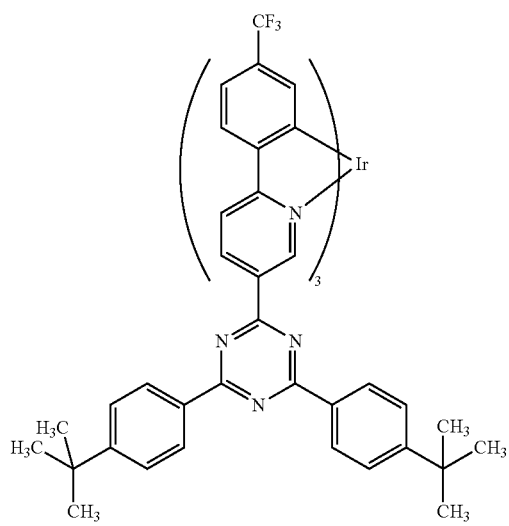
M-26
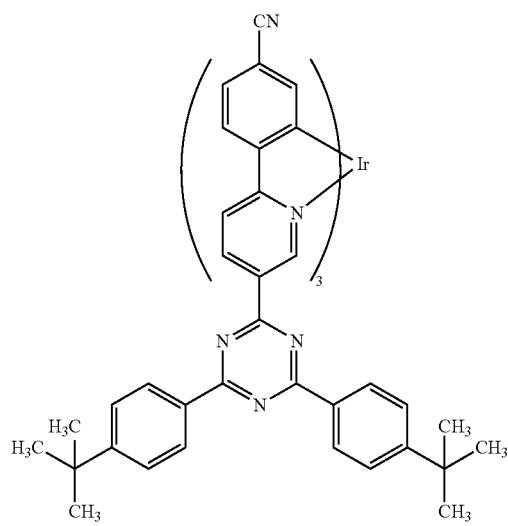
M-27
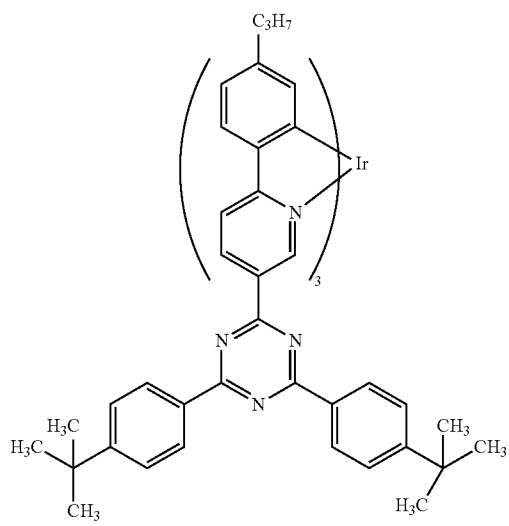
M-28
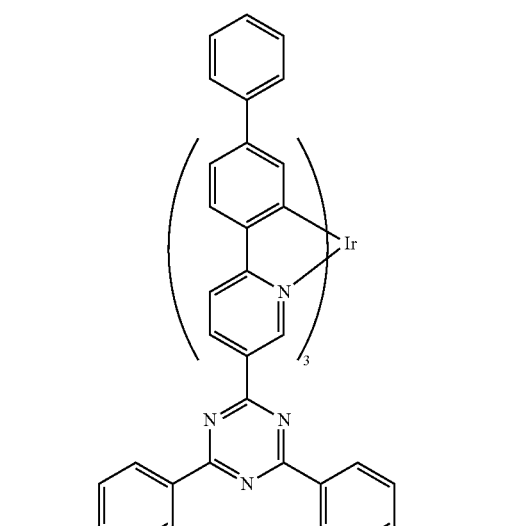
M-29
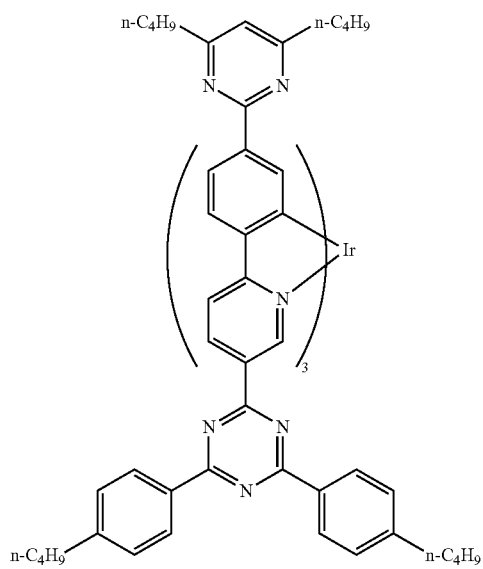
M-30
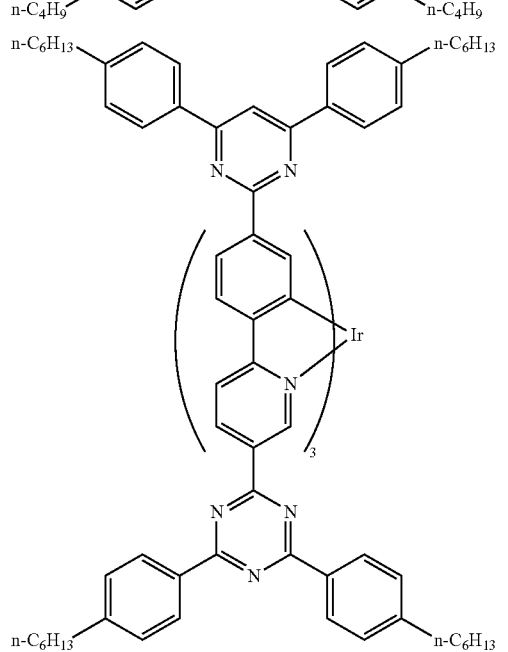

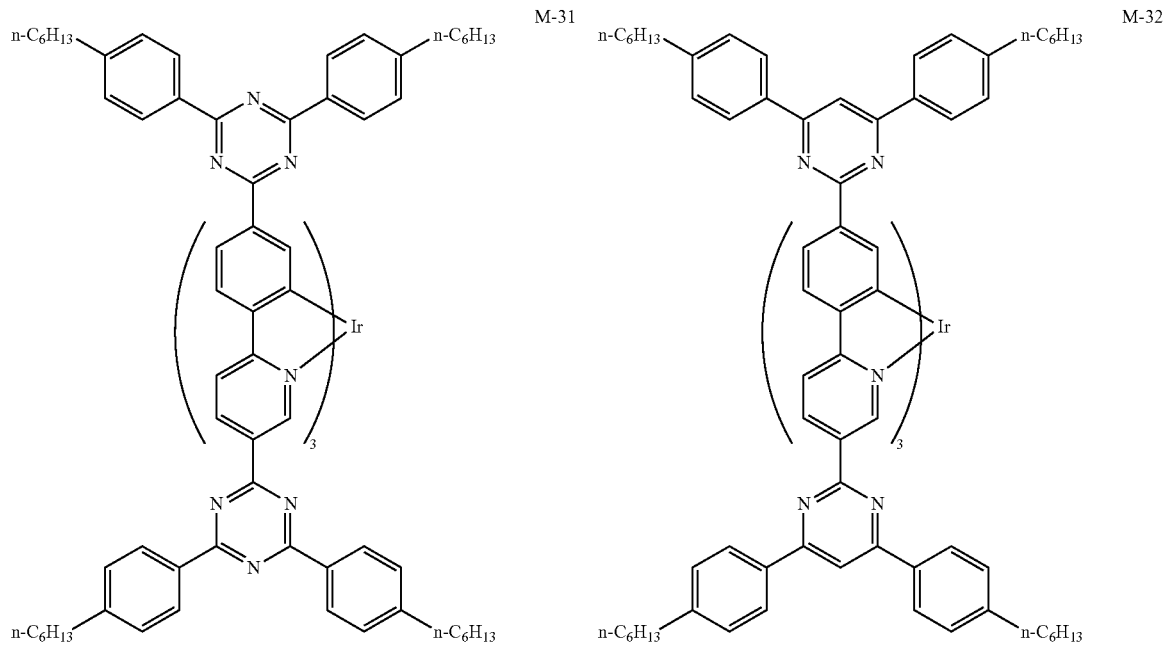
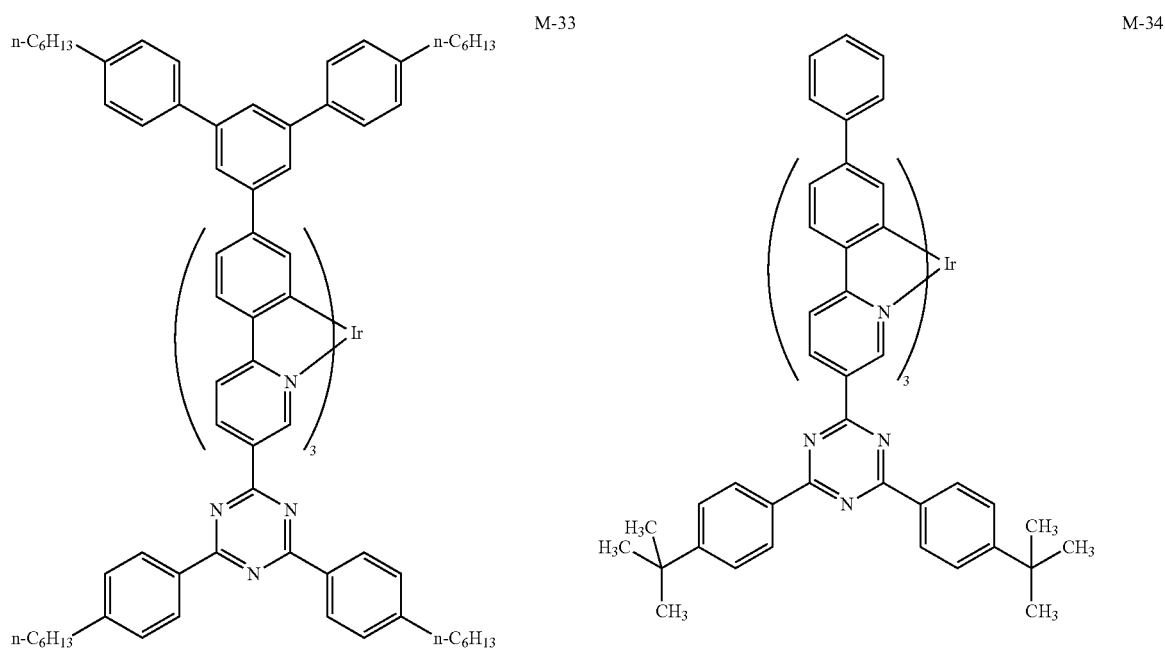

-continued
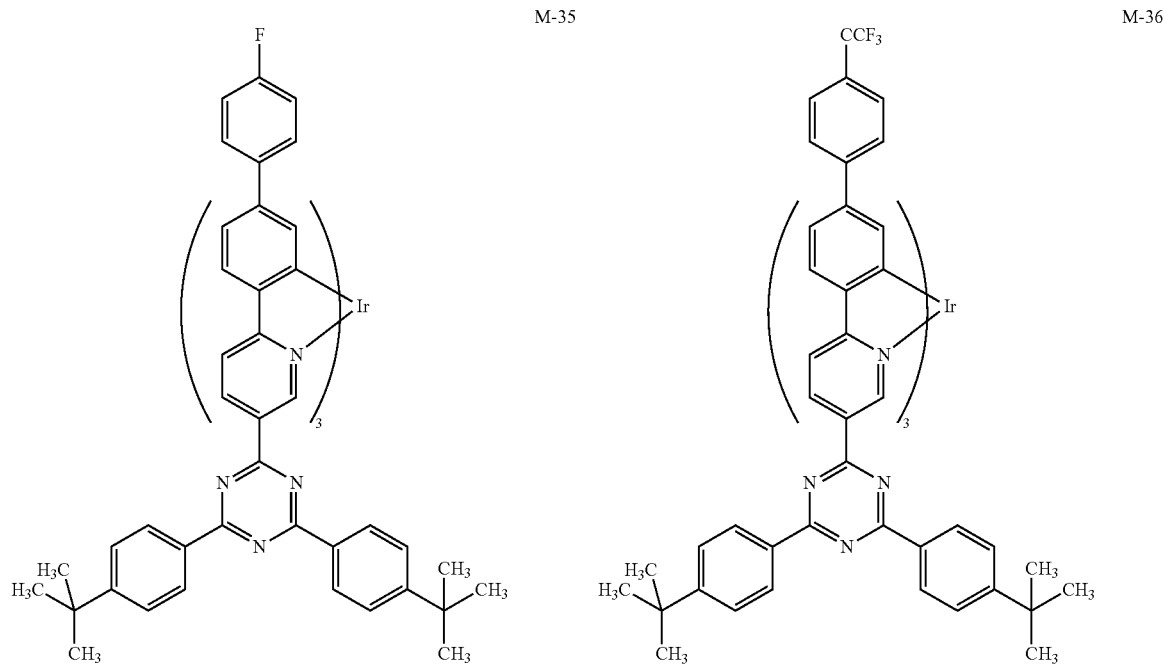
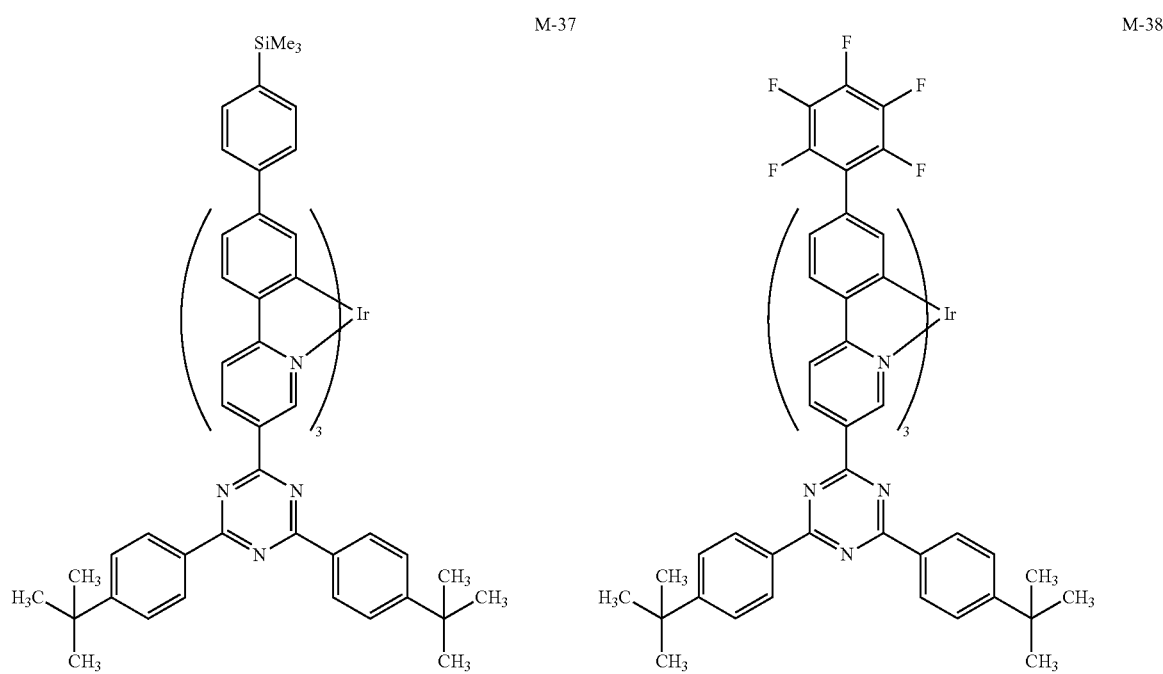

-continued
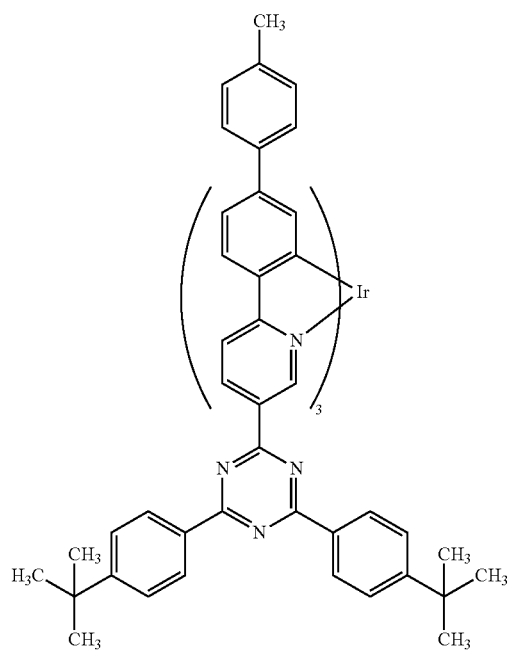
M-39
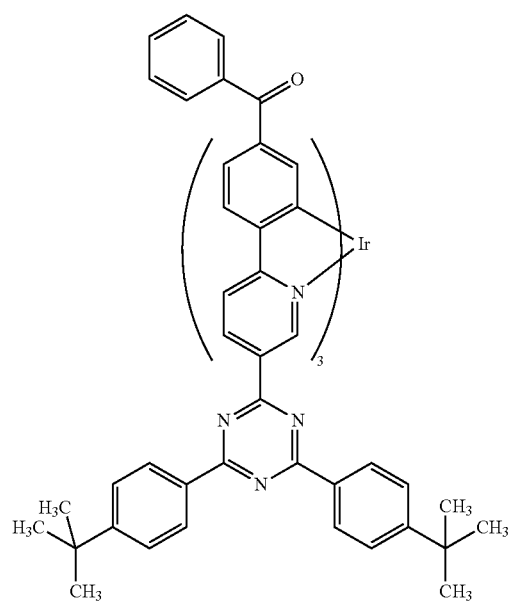
M-40
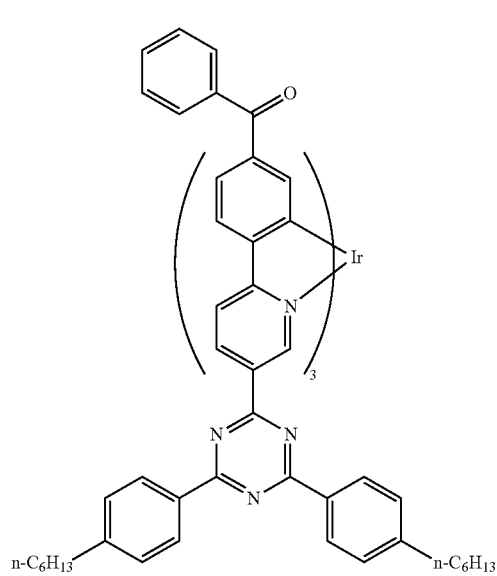
M-41
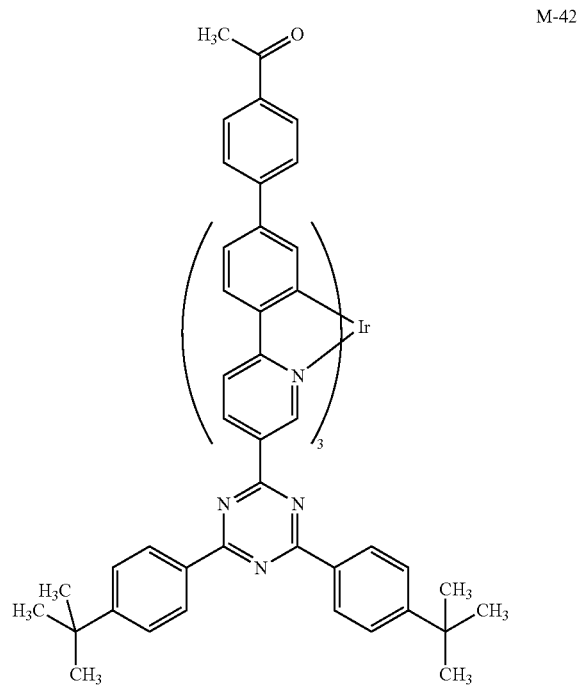
M-42

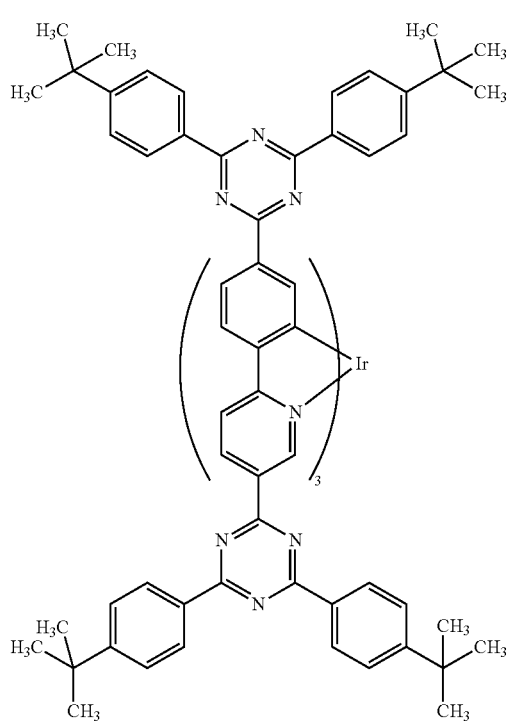
M-43
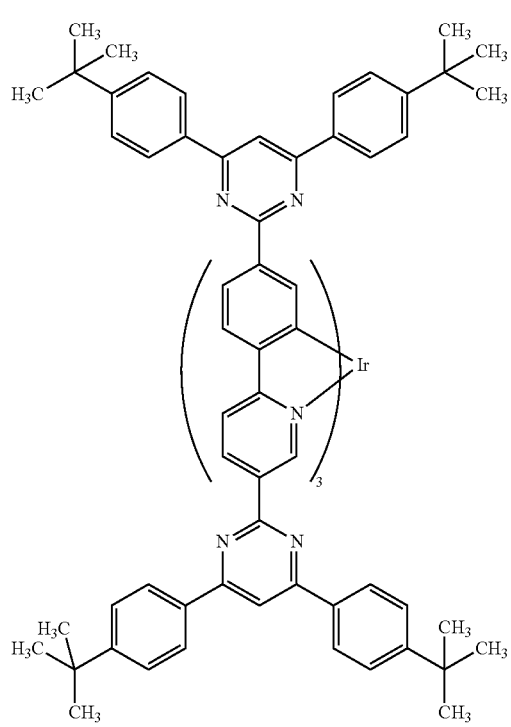
M-44
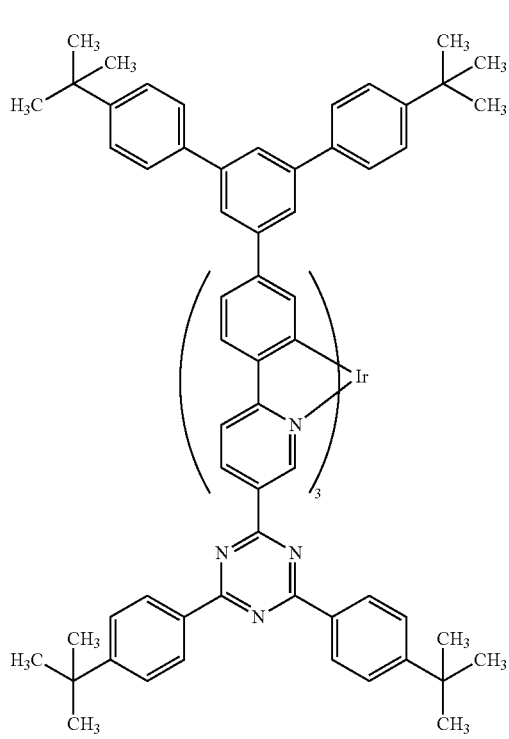
M-45
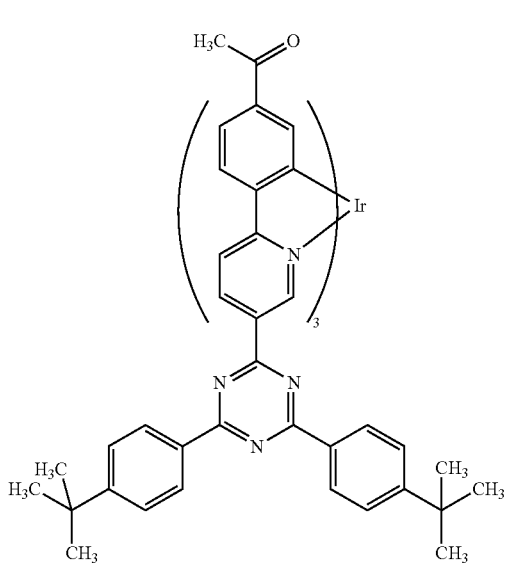
M-46

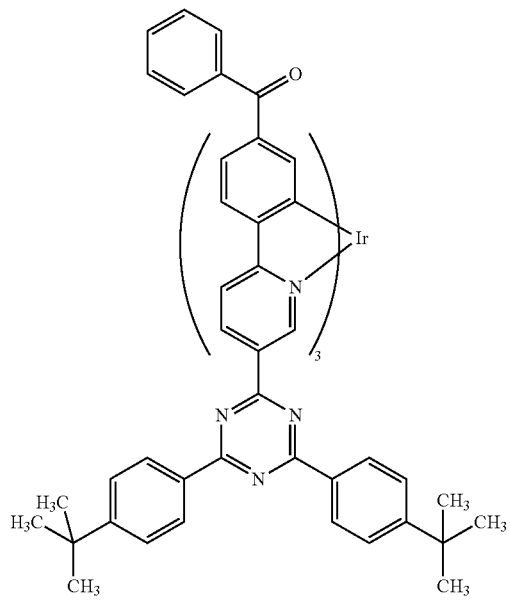
M-47
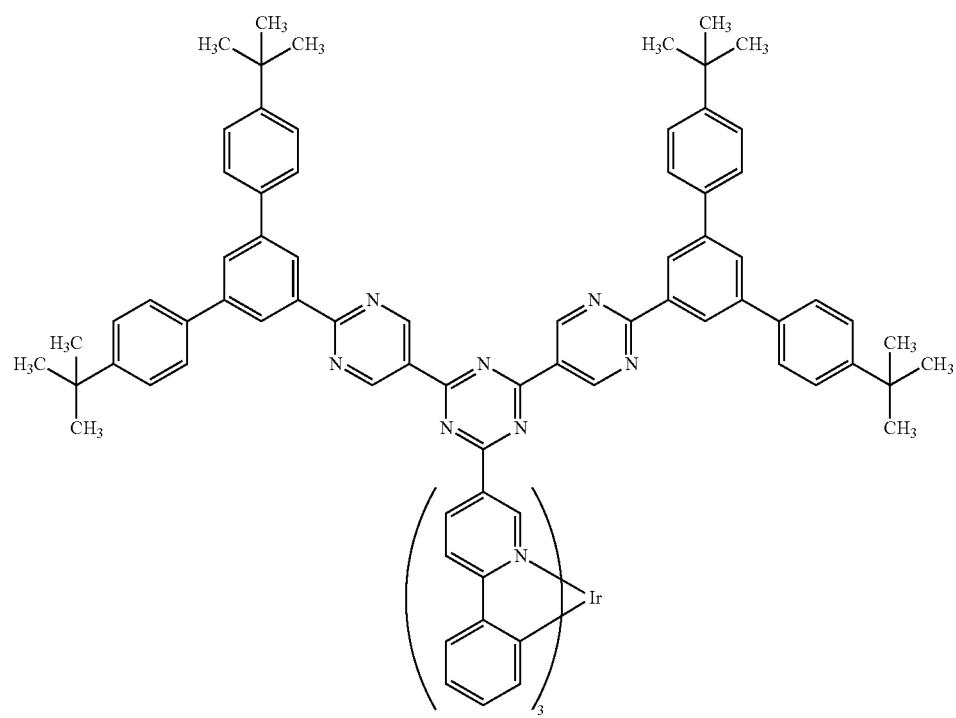
M-48

-continued
M-49
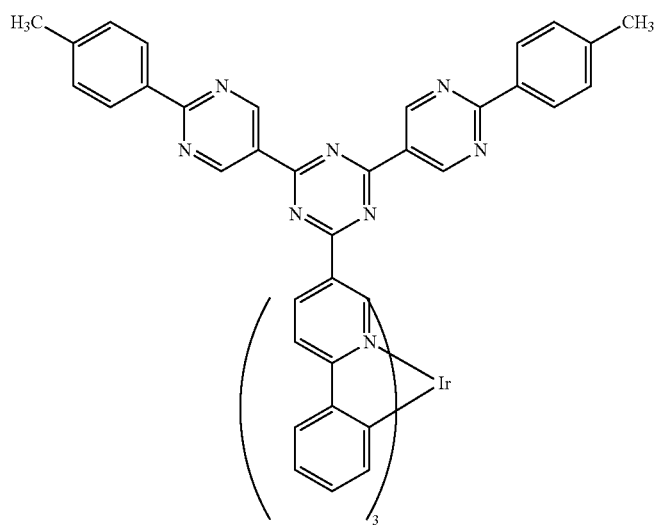
M-50
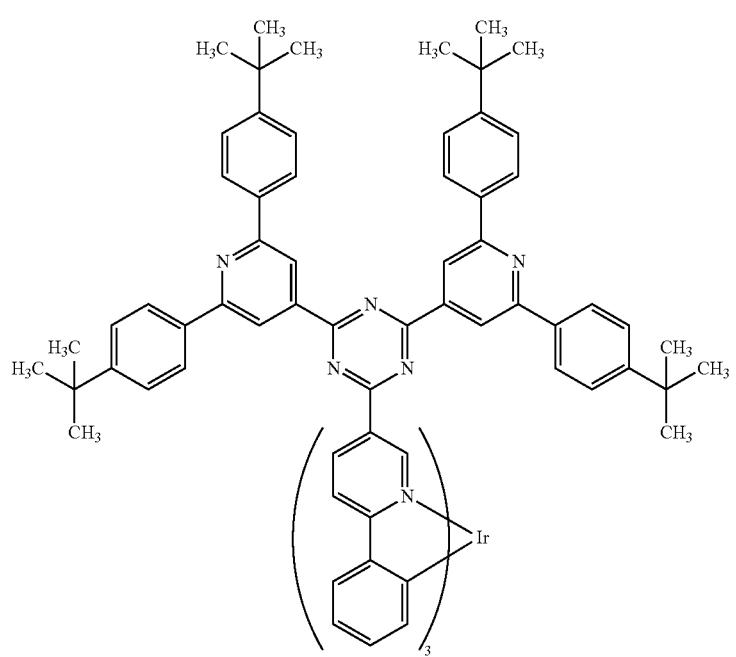
M-51
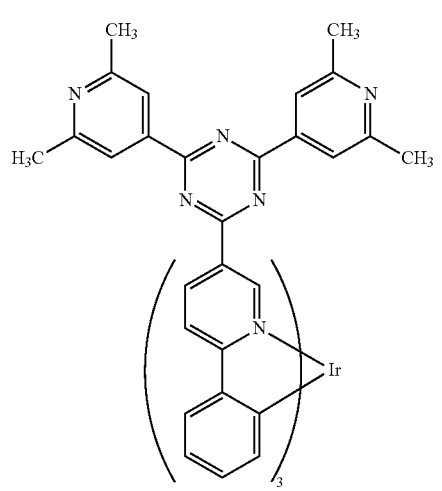

The absolute values of the LUMO energy levels of typical metal complexes, among the above metal complexes M-1 to M-51, are listed. The absolute value of the LUMO energy level is 1.62 eV for the metal complex M-1, 1.92 eV for the metal complex M-3, 2.08 eV for the metal complex M-7, 2.05 eV for the metal complex M-16, and 2.46 eV for the metal complex M-51.

As the above metal complexes, metal complexes in which the life of the triplet excited state, which easily allows forbidden transition, is short are preferred in terms of stable high-efficiency light emission.

The above metal complexes may be used alone or in combination of two or more thereof.

Next, a method for manufacturing the above metal complex will be described.

The above metal complex can be synthesized, for example, by reacting a compound that is a ligand with a metal compound in a solution. A base, a silver salt compound, and the like may be present in the reaction system, as required. In addition, the above metal complex can be synthesized by the coupling reaction of a metal complex having a 2-phenylpyridine derivative for a ligand with a heterocyclic aromatic compound.

Examples of the method of complexation (that is, the method for reacting a compound that is a ligand with a metal compound in a solution) include methods described in J. Am. Chem. Soc. 1984, 106, 6647; Inorg. Chem. 1991, 30, 1685; Inorg. Chem. 1994, 33, 545; Inorg. Chem. 2001, 40, 1704; Chem. Lett., 2003, 32, 252, and the like for iridium complexes, methods described in Inorg. Chem., 1984, 23, 4249; Chem. Mater. 1999, 11, 3709; Organometallics, 1999, 18, 1801, and the like for platinum complexes, and methods described in J. Org. Chem., 1987, 52, 73 and the like for palladium complexes.

For the reaction temperature of the complexation, usually, the reaction can be performed at the melting point to the boiling point of the solvent, preferably −78° C. to the boiling point of the solvent. The reaction time is usually about 30 minutes to 30 hours. However, when a microwave reaction apparatus is used in the complexation reaction, the reaction can also be performed at the boiling point of the solvent or higher, and the reaction time is about several minutes to several hours.

The above compound that is a ligand can be synthesized, for example, by the Suzuki coupling, Grignard coupling, Stille coupling, or the like of a 2-phenylpyridine derivative with a heterocyclic aromatic compound. The above compound that is a ligand can be synthesized by dissolving in an organic solvent as required, and reacting at a temperature equal to or higher than the melting point and equal to or lower than the boiling point of the organic solvent, using, for example, an alkali, a suitable catalyst, and the like. For this synthesis, for example, methods described in "Organic Syntheses," Collective Volume VI, pp. 407-411, John Wiley&Sons, Inc., 1988; Chem. Rev., Volume 106, p. 2651 (2006); Chem. Rev., Volume 102, p. 1359 (2002); Chem. Rev., Volume 95, p. 2457 (1995); J. Organomet. Chem., Volume 576, p. 147 (1999), and the like can be used.

The above heterocyclic aromatic compound can be synthesized by methods described in "HOUBEN-WEYL METHODS OF ORGANIC CHEMISTRY 4$^{TH}$ EDITION," Volume E9b, p. 1, GEORG THIEME VERLAG STUTTGART; HOUBEN-WEYL METHODS OF ORGANIC CHEMISTRY 4$^{TH}$ EDITION, Volume E9c, p. 667, GEORG THIEME VERLAG STUTTGART, and the like.

—Organic Compound—

The above organic compound may be a low-molecular compound or a polymer compound, but has a polystyrene equivalent number-average molecular weight of preferably $2 \times 10^3$ or more, more preferably $2 \times 10^3$ to $1 \times 10^8$, and particularly preferably $1 \times 10^4$ to $1 \times 10^6$, in terms of device properties, such as luminous efficiency and life, when used for a light-emitting device, and a film formation property. In this description, a compound having a polystyrene equivalent number-average molecular weight of $2 \times 10^3$ or more is referred to as a polymer compound, and on the other hand, one comprising a single composition is referred to as a low-molecular compound (usually having a number-average molecular weight of less than $2 \times 10^3$). In addition, the above organic compound may be one having an intermediate structure between a low-molecular compound and a polymer compound, such as a dendrimer or an oligomer.

Examples of the above organic compound include triazole derivatives, oxazole derivatives, imidazole derivatives, oxadiazole derivatives, fluorenone derivatives, anthraquinodimethane derivatives, triazine derivatives, pyrimidine derivatives, pyridine derivatives, and compounds having residues thereof, and triazine derivatives and pyrimidine derivatives are preferred.

In terms of a further reduction in driving voltage, the above organic compound is preferably a compound represented by the following formula (A'):

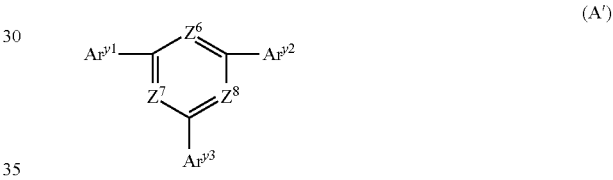

(A')

wherein $Ar^{y1}$, $Ar^{y2}$, and $Ar^{y3}$ each independently represent an aryl group or a monovalent heterocyclic group; $Z^6$, $Z^7$, and $Z^8$ each independently represent a carbon atom or a nitrogen atom, provided that at least two of $Z^6$, $Z^7$, and $Z^8$ are nitrogen atoms; and when any of $Z^6$, $Z^7$, and $Z^8$ is a carbon atom, a hydrogen atom bonded to the carbon atom may be replaced by a substituent, or a compound having a residue of the foregoing compound, and more preferably a compound having a divalent group represented by the following formula (A):

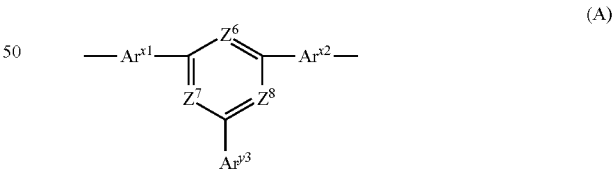

(A)

wherein $Ar^{x1}$ and $Ar^{x2}$ represent an arylene group or a divalent heterocyclic group; and $Ar^{y3}$ and $Z^6$ to $Z^8$ are as defined above. Particularly preferably, the compound having a divalent group represented by the above formula (A) is a polymer compound having a divalent group represented by the above formula (A) as a repeating unit. Especially preferably, the above organic compound is a compound in which in these, $Z^6$, $Z^7$, and $Z^8$ are nitrogen atoms.

Examples of the arylene group represented by $Ar^{x1}$ and $Ar^{x2}$ in the above formula (A) include a phenylene group (for example, the following formulas 1 to 3), a naphthalenediyl group (for example, the following formulas 4 to 13), an anthracene-diyl group (for example, the following formulas 14 to 19), a biphenyl-diyl group (for example, the following formulas 20 to 25), a terphenyl-diyl group (for example, the following formulas 26 to 28), a condensed ring compound group (for example, the following formulas 29 to 35), a fluorene-diyl group (for example, the following formulas 36 to 38), a stilbene-diyl group (the following formulas 39 to 42), a distilbene-diyl group (for example, the following formulas 43 and 44), a benzofluorene-diyl group (for example, the following formulas A-1 to A-3), and a dibenzofluorene-diyl group (for example, the following formula A-4).

1
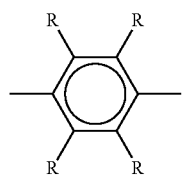

2
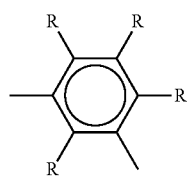

3
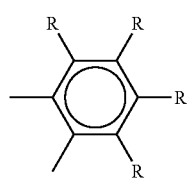

4
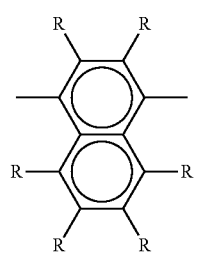

5
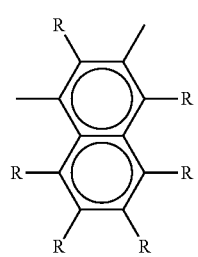

6
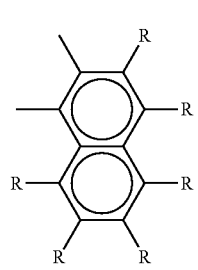

-continued

7
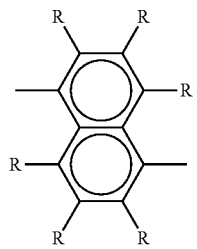

8
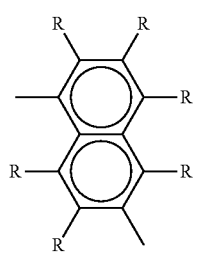

9
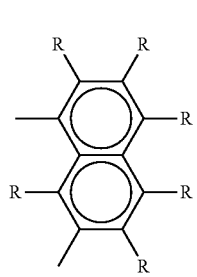

10
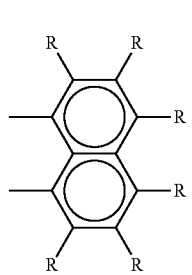

11
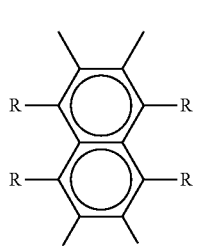

12
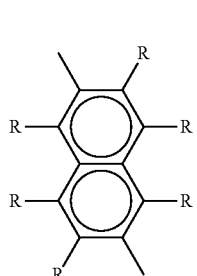

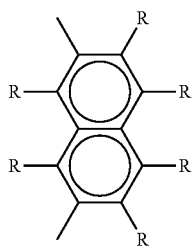
13
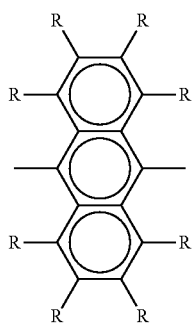
14
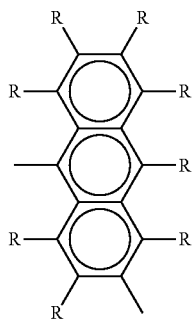
15
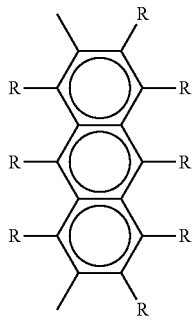
16
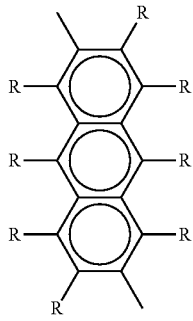
17
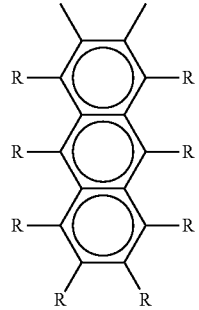
18
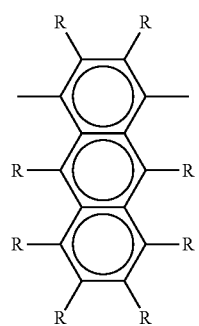
19
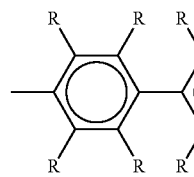
20
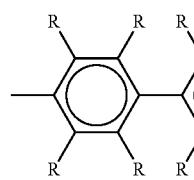
21
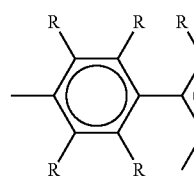
22
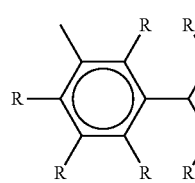
23
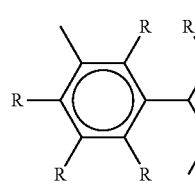
24

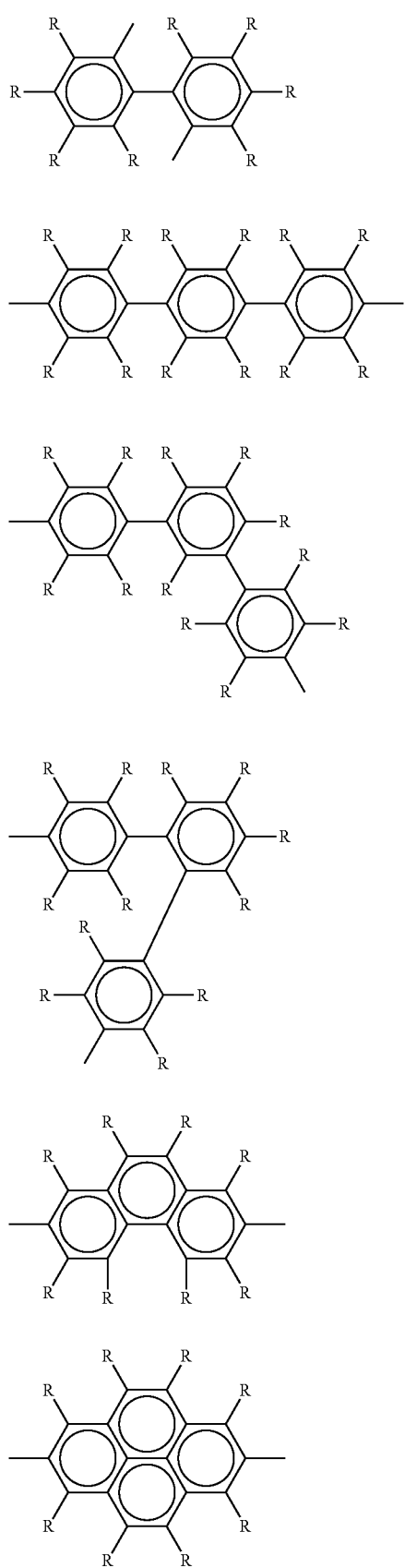
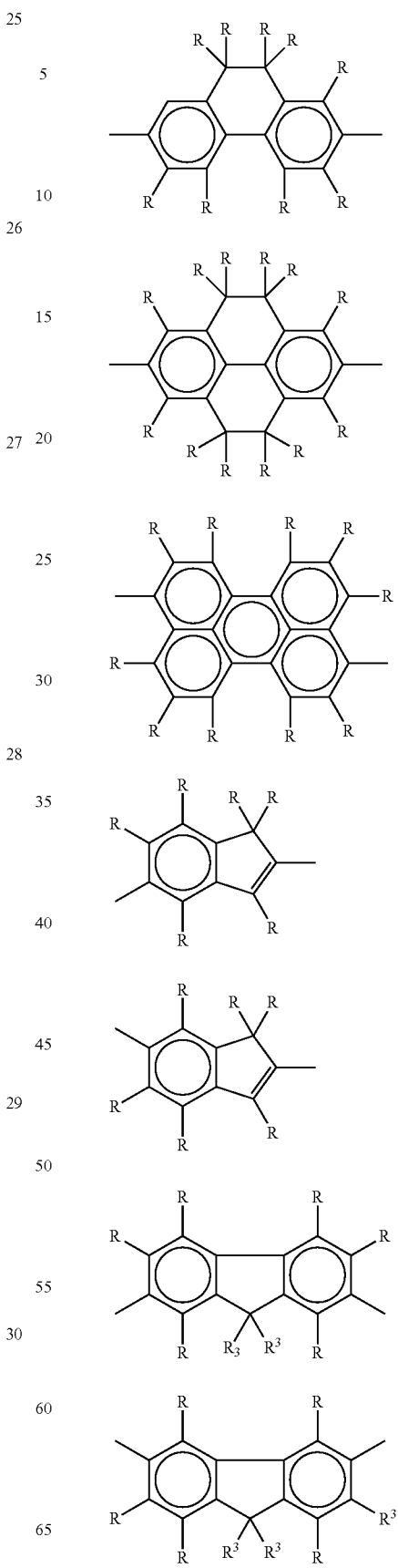

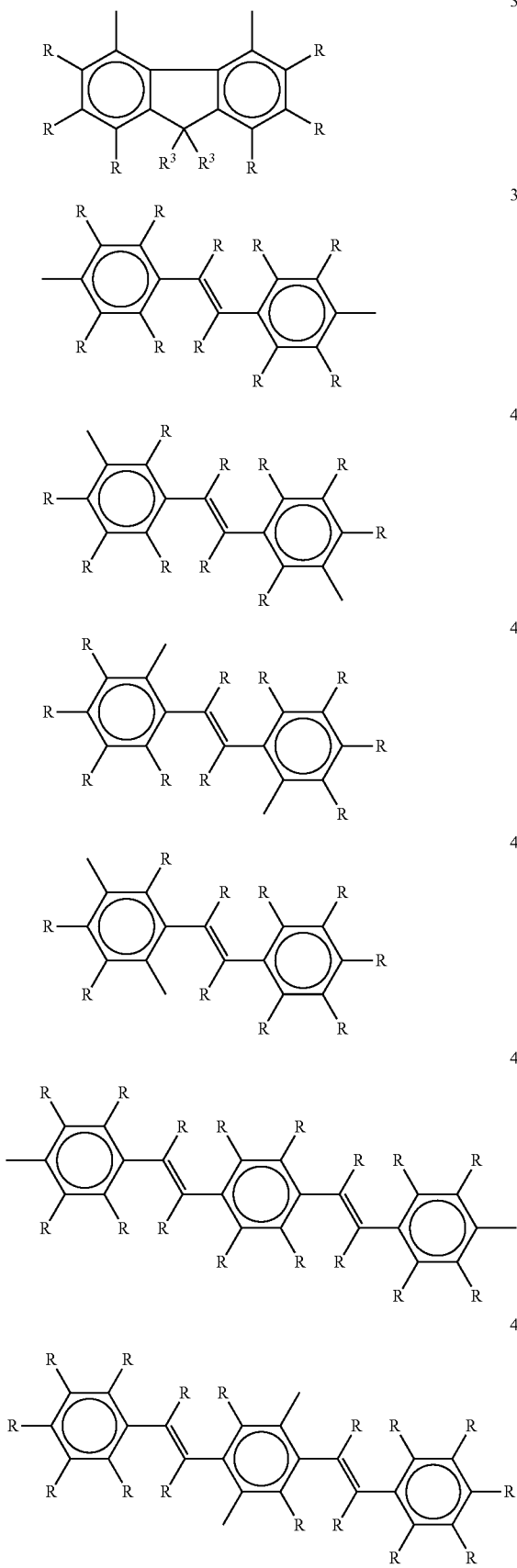
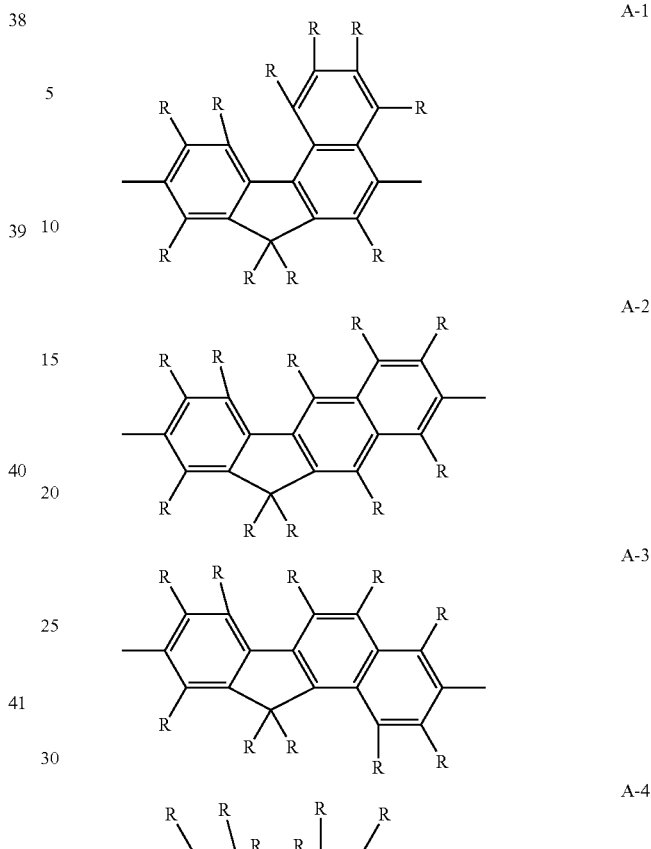

wherein R is as defined above; $R^3$ represents a hydrogen atom, an alkyl group, an alkoxy group, an alkylthio group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a nitro group, or a cyano group; and a plurality of each of R and $R^3$ may be the same or different.

The aryl group represented by $Ar^{y3}$ in the above formula (A) is the same as those described and illustrated in the paragraph of the above aryl group represented by R.

Examples of the divalent heterocyclic group represented by $Ar^{x1}$ and $Ar^{x2}$ include divalent heterocyclic groups comprising nitrogen as a heteroatom, such as a pyridinediyl group (for example, the following formulas 45 to 50), a diazaphenylene group (for example, the following formulas 51 to 54), a quinolinediyl group (for example, the following formulas 55 to 69), a quinoxalinediyl group (for example, the following formulas 70 to 74), an acridinediyl group (for example, the following formulas 75 to 78), a bipyridyldiyl group (for example, the following formulas 79 to 81), a phenanthrolinediyl group (for example, the following formulas 82 to 84), and a group having a carbazole structure (for example, the following formulas 85 to 87); five-membered ring heterocyclic groups comprising oxygen, silicon, nitrogen, sulfur, selenium, or the like as a heteroatom (for example, the following formulas 88 to 92); five-membered ring-condensed heterocyclic groups comprising oxygen, silicon, nitrogen, selenium, or the like as a heteroatom (for example, the following formulas 93 to 103); five-membered ring heterocyclic groups comprising oxygen, silicon, nitrogen, sulfur, selenium, or the like as a heteroatom, bonded at the α position of the heteroatom to form a dimer or an oligomer (for example, the following formulas 104 to 105); five-membered ring heterocyclic groups comprising oxygen, silicon, nitrogen, sulfur, selenium, or the like as a heteroatom, bonded at the α position of the heteroatom to a phenyl group (for example, the following formulas 106 to 112); and five-membered ring-condensed heterocyclic groups comprising oxygen, nitrogen, sulfur, or the like as a heteroatom, substituted with a phenyl group, a furyl group, or a thienyl group (for example, the following formulas 113 to 118).

45

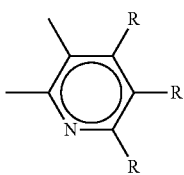

46

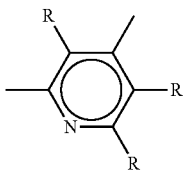

47

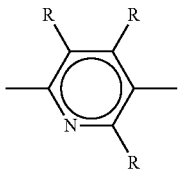

48

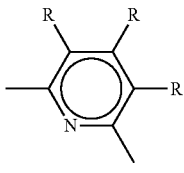

49

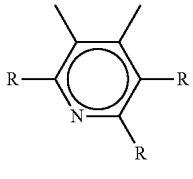

50

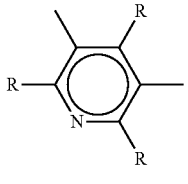

-continued

51

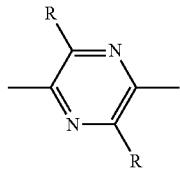

52

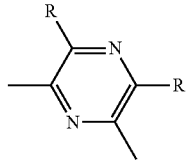

53

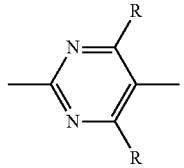

54

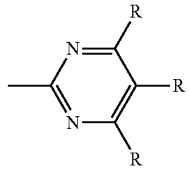

55

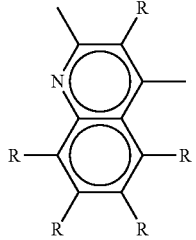

56

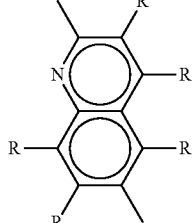

57

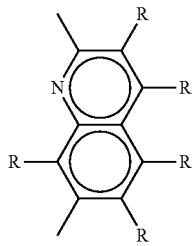

58
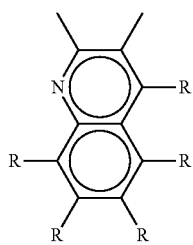
59
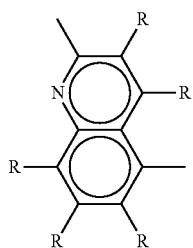
60
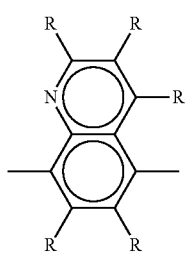
61
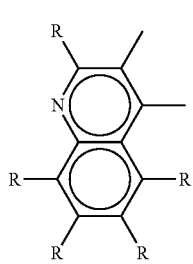
62
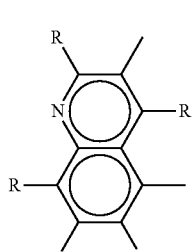
63
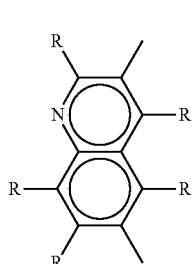
64
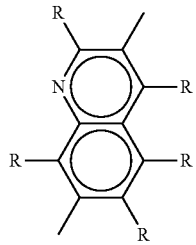
65
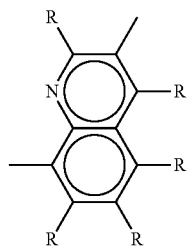
66
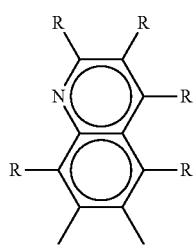
67
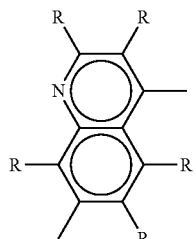
68
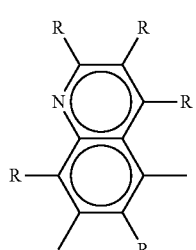
69
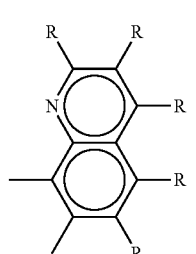

70
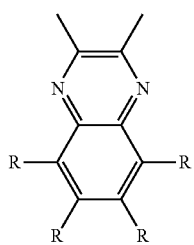
71
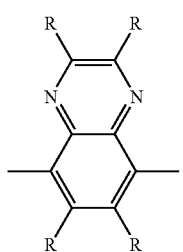
72
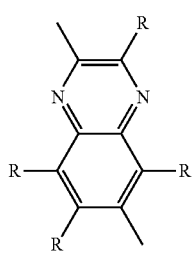
73
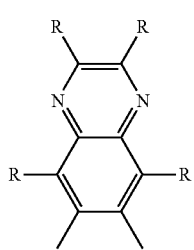
74
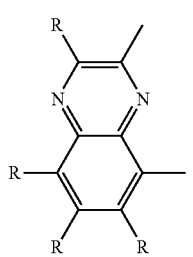
75
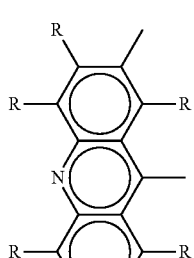
76
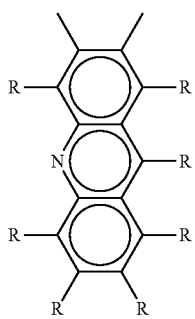
77
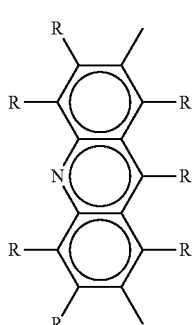
78
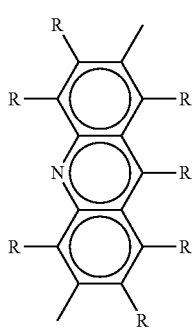
79
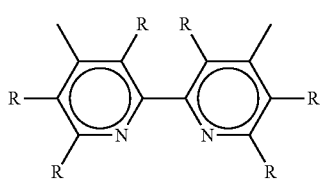
80
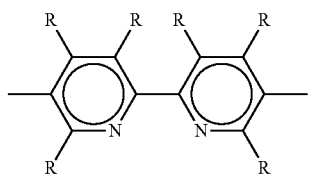
81
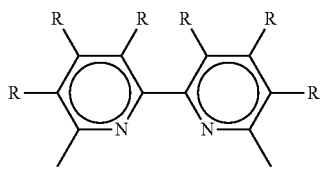

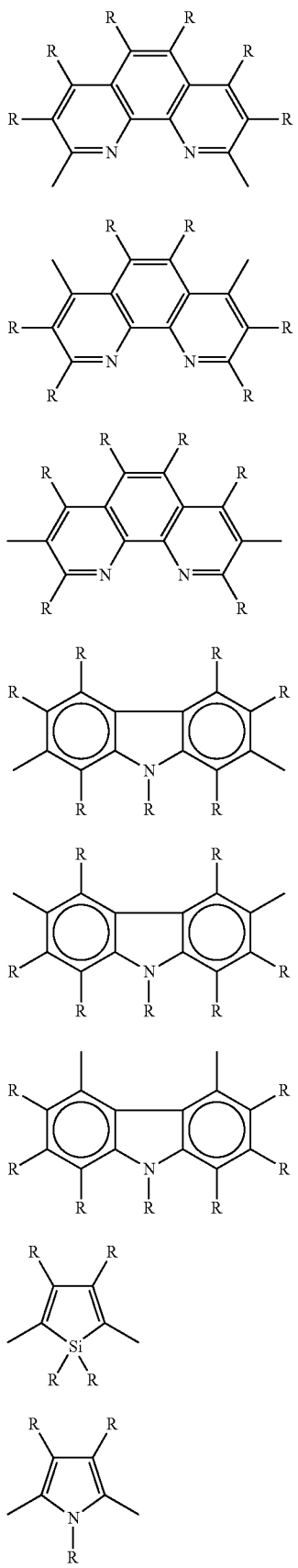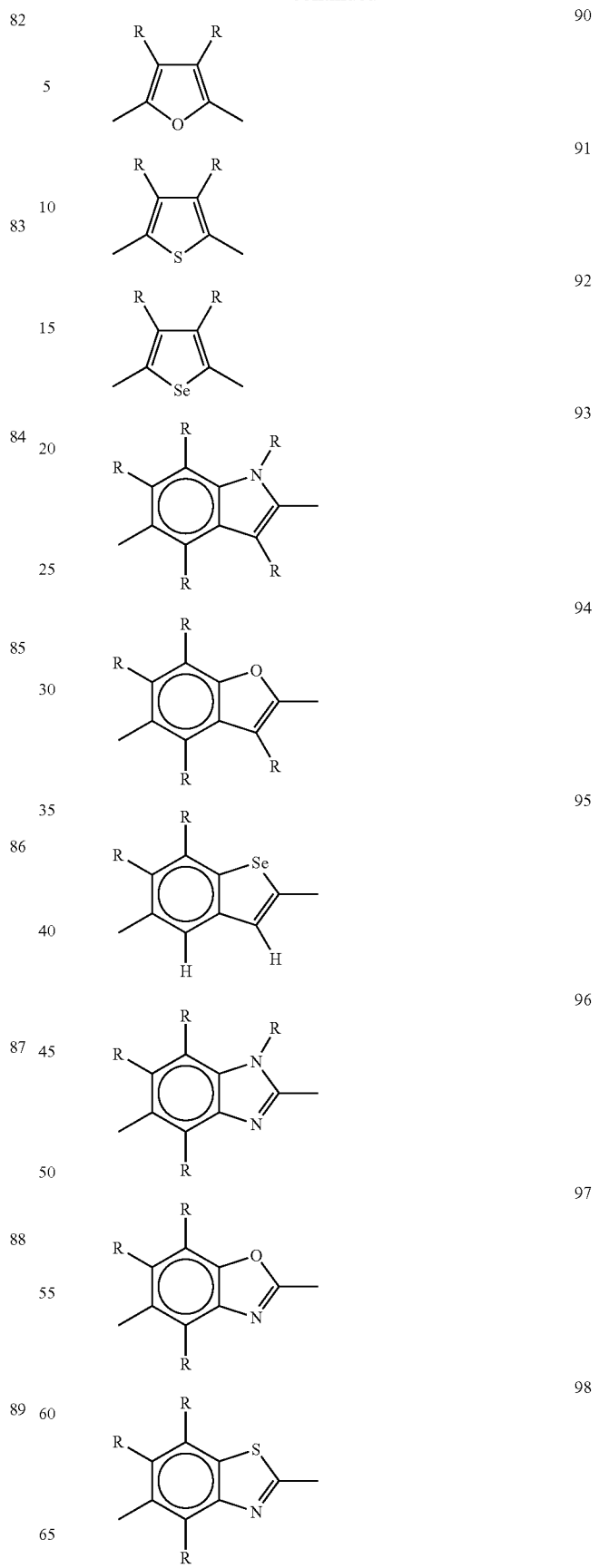

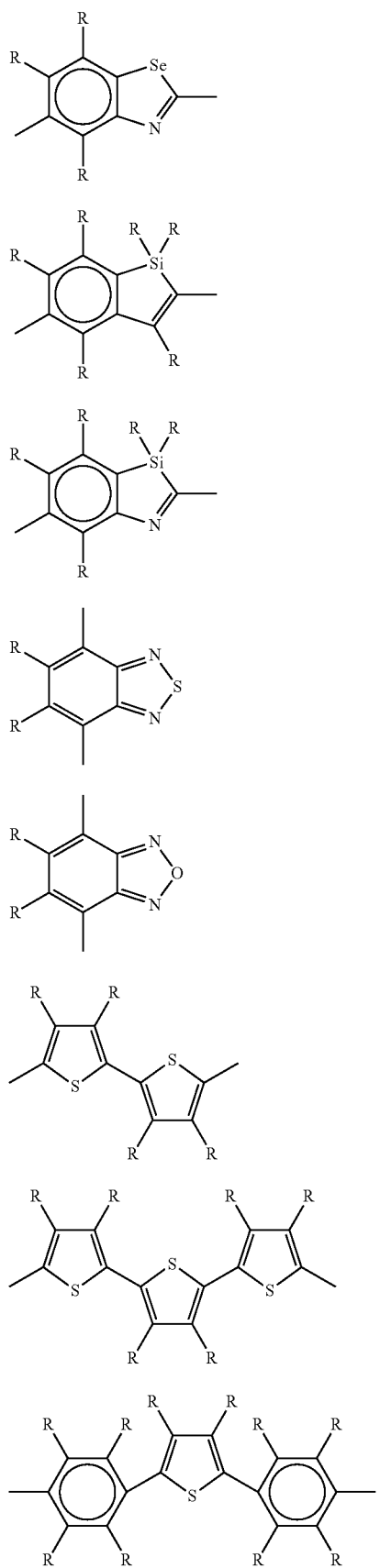
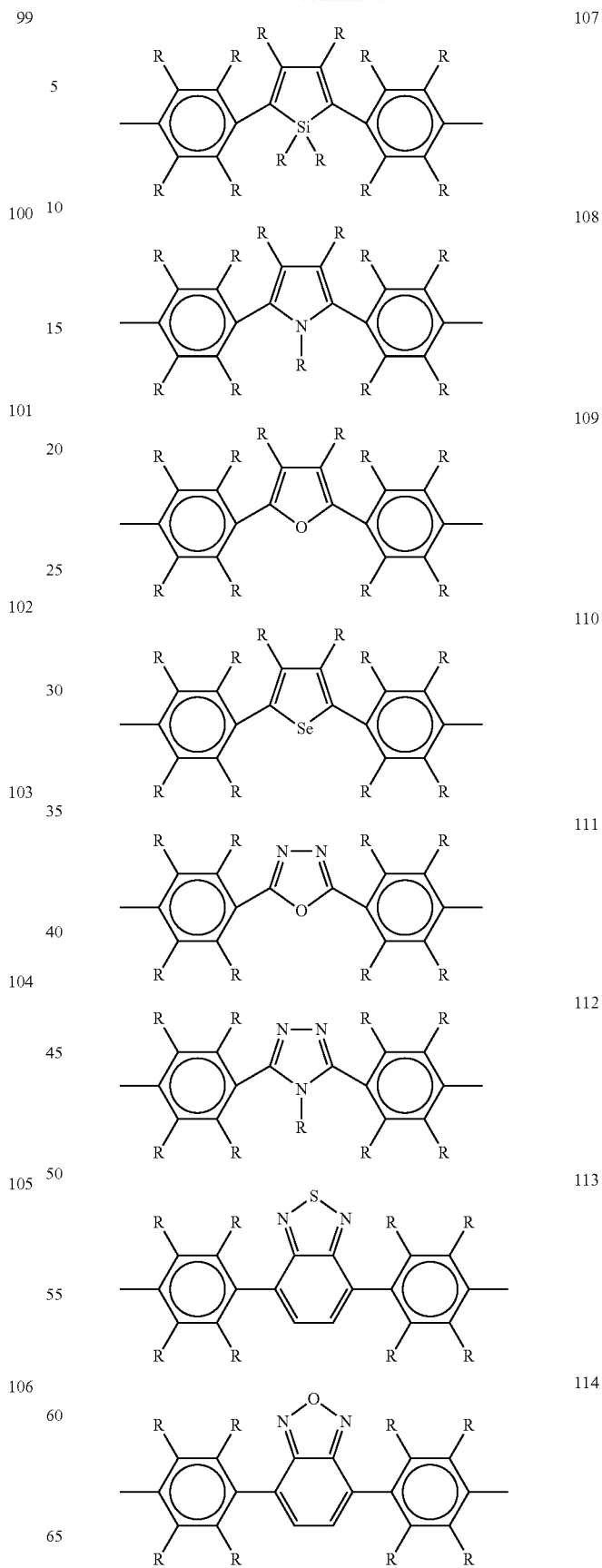

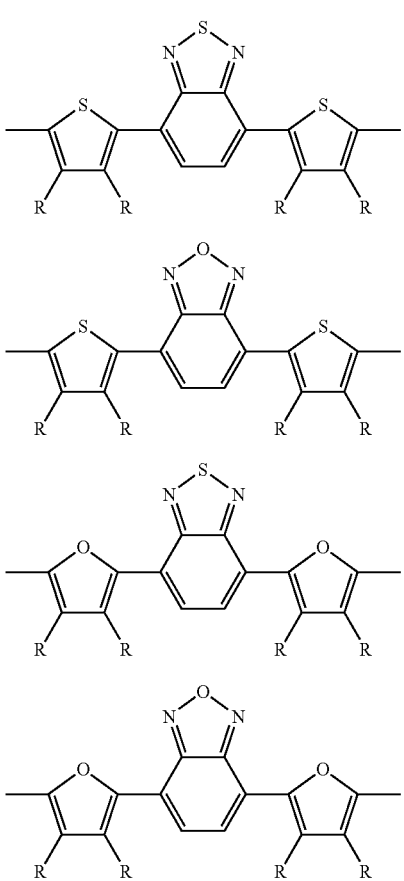

wherein R is as defined above.

The monovalent heterocyclic group represented by $Ar^{y3}$ is the same as those described and illustrated as the above monovalent heterocyclic group represented by R.

The aryl group represented by $Ar^{y1}$ and $Ar^{y2}$ in the above formula (A') is similar to those described and illustrated as the above arylene group represented by $Ar^{x1}$ and $Ar^{x2}$ in which one of two bonds is replaced by R.

The aryl group represented by $Ar^{y3}$ in the above formula (A') is the same as those described and illustrated as the above aryl group represented by R.

The monovalent heterocyclic group represented by $Ar^{y1}$ and $Ar^{y2}$ in the above formula (A') is similar to those described and illustrated as the above divalent heterocyclic group represented by $Ar^{x1}$ and $Ar^{x2}$ in which one of two bonds is replaced by R.

The monovalent heterocyclic group represented by $Ar^{y3}$ in the above formula (A') is the same as those described and illustrated as the above monovalent heterocyclic group represented by R.

Examples of the substituent that the group represented by $Ar^{x1}$ to $Ar^{x3}$ and $Ar^{y1}$ to $Ar^{y3}$ in the above formulas (A) and (A') may have include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group, and a nitro group. These substituents are the same as those described and illustrated as the above groups and atoms represented by R.

Examples of the divalent group represented by the above formula (A) include the following.

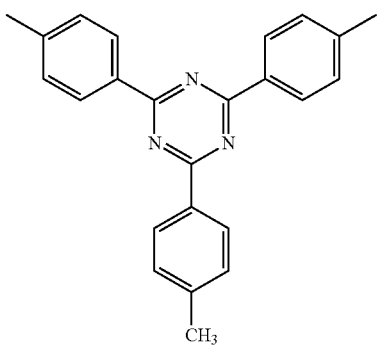

(A-1)

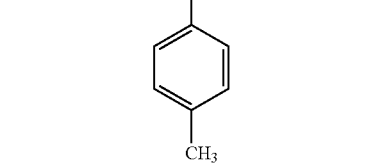

(A-2)

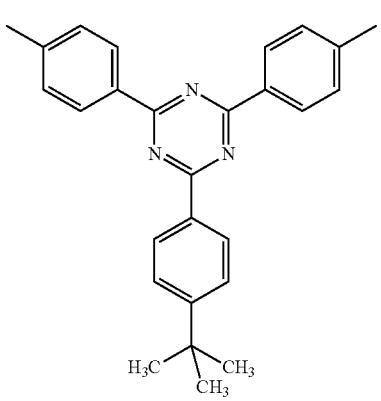

(A-3)

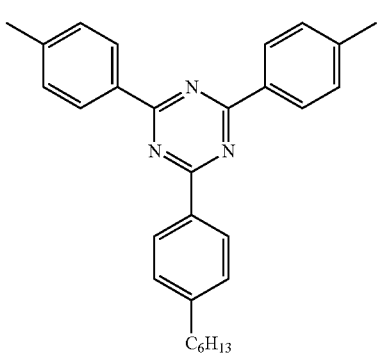

(A-4)

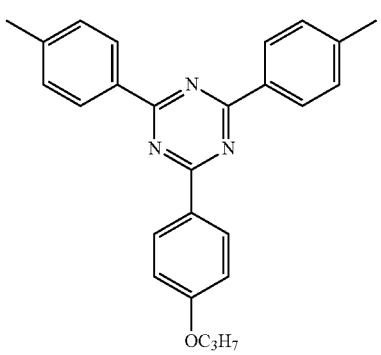

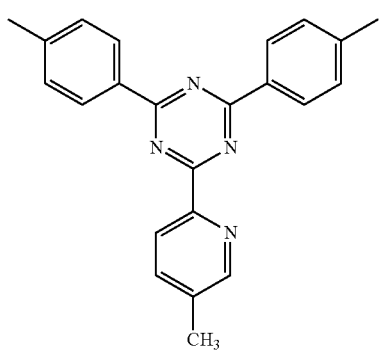
(A-5)
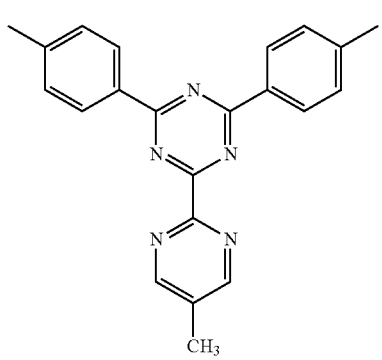
(A-6)
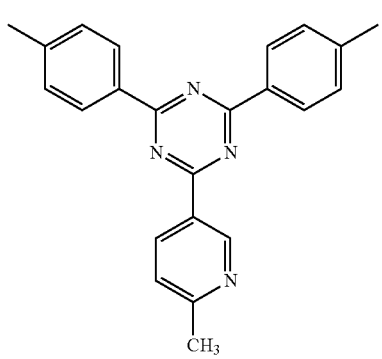
(A-7)
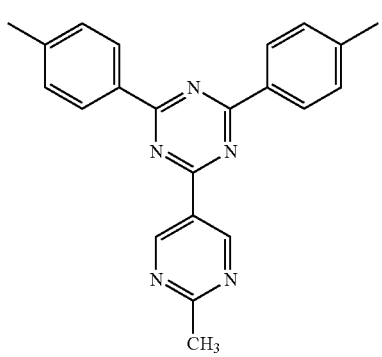
(A-8)
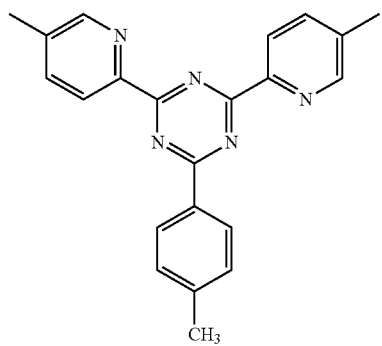
(A-9)
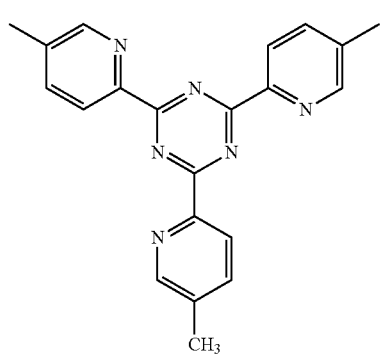
(A-10)
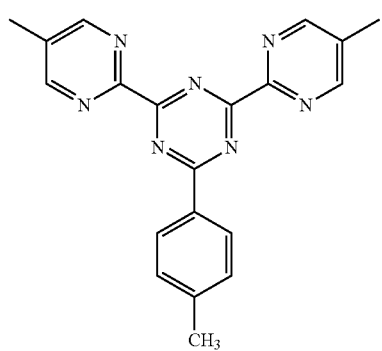
(A-11)
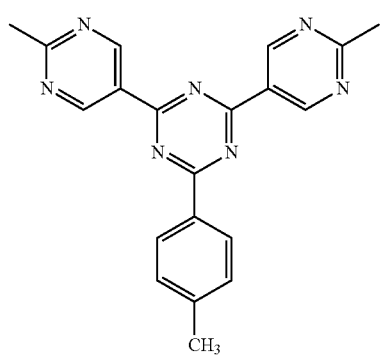
(A-12)

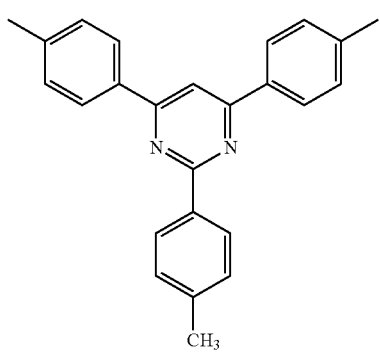 (A-13)
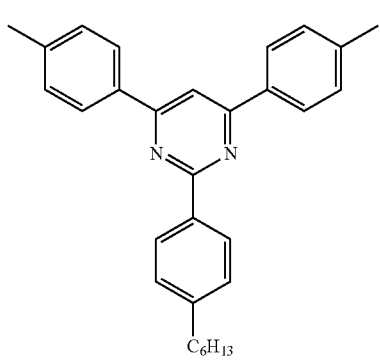 (A-14)
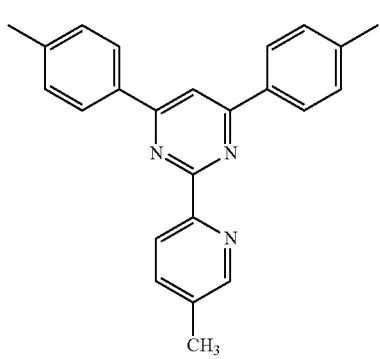 (A-15)
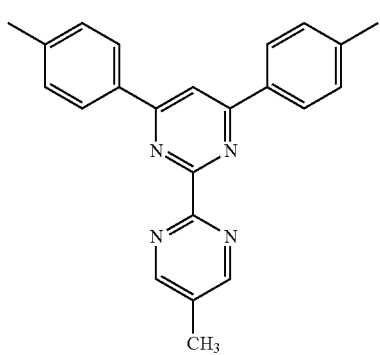 (A-16)
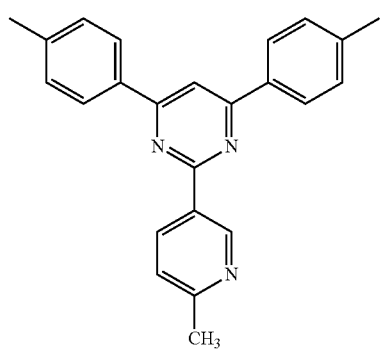 (A-17)
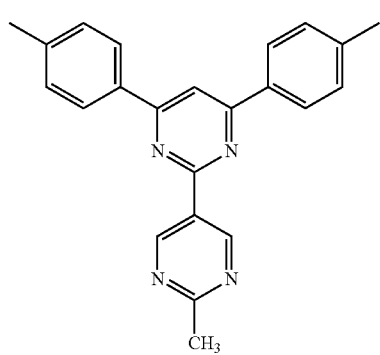 (A-18)
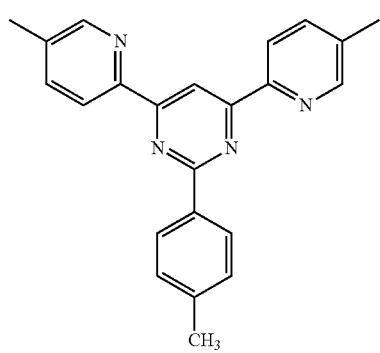 (A-19)
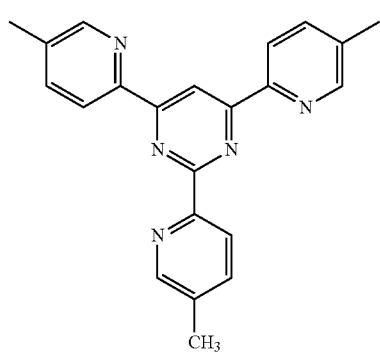 (A-20)

(A-21) 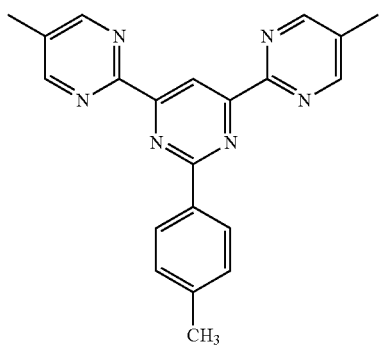
(A-24) 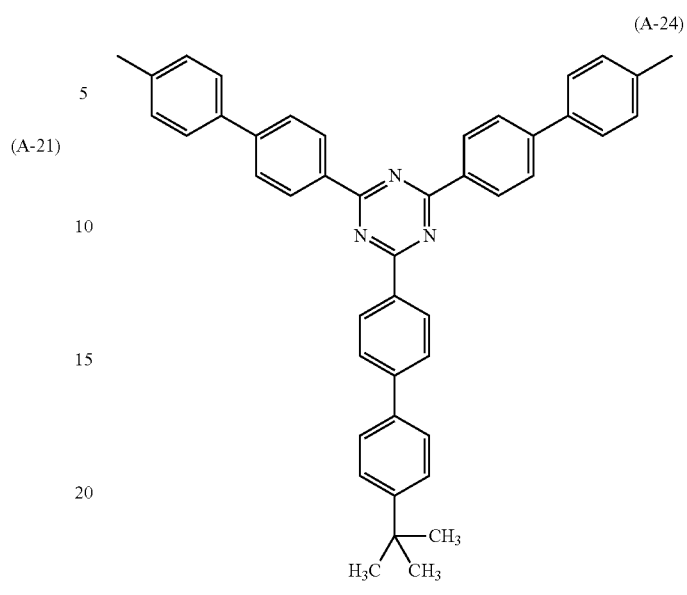
(A-22) 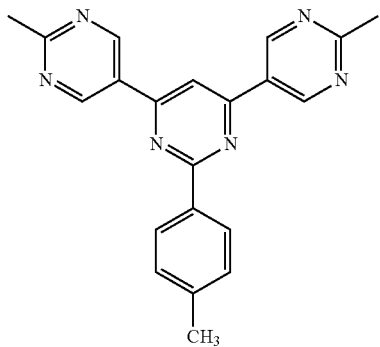
(A-25) 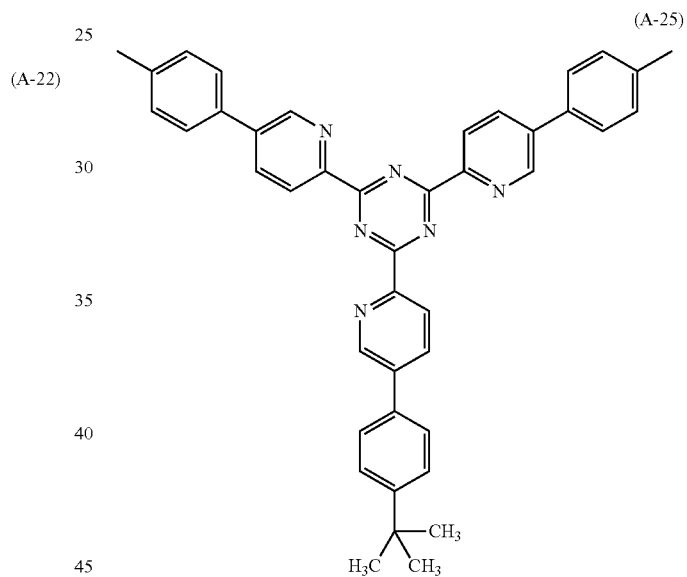
(A-23) 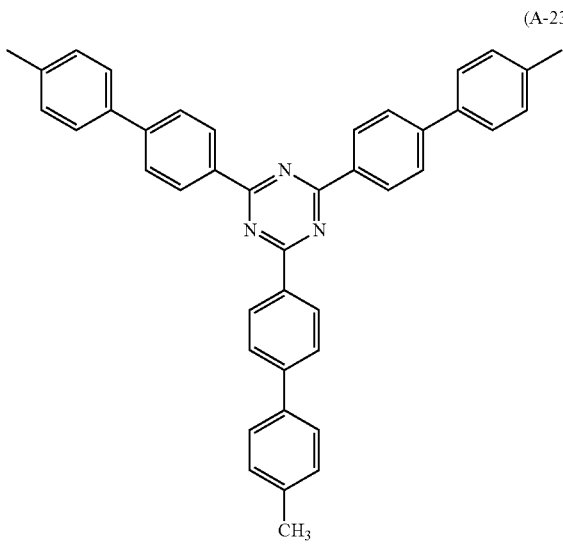
(A-26) 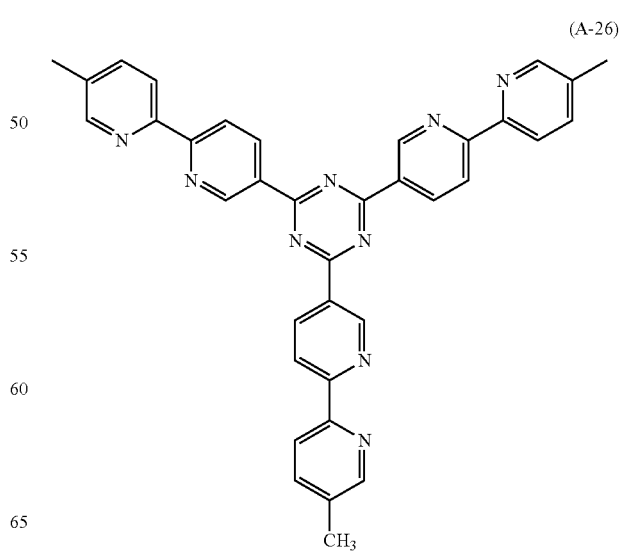

-continued
(A-27)
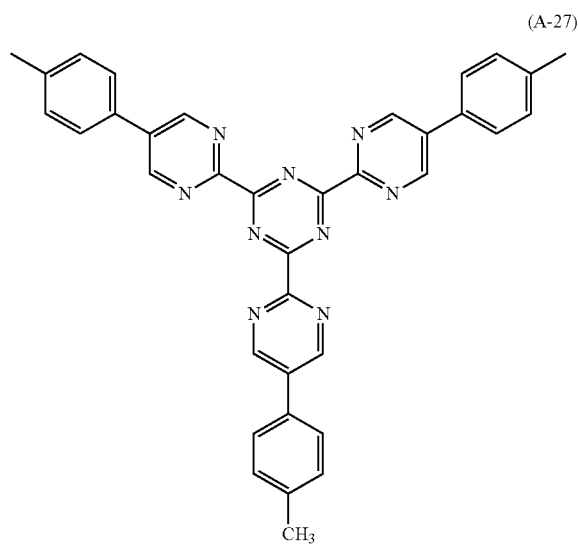
(A-28)
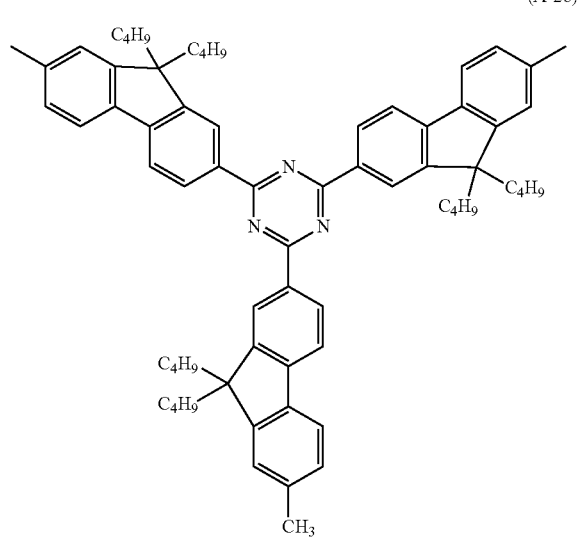
(A-29)
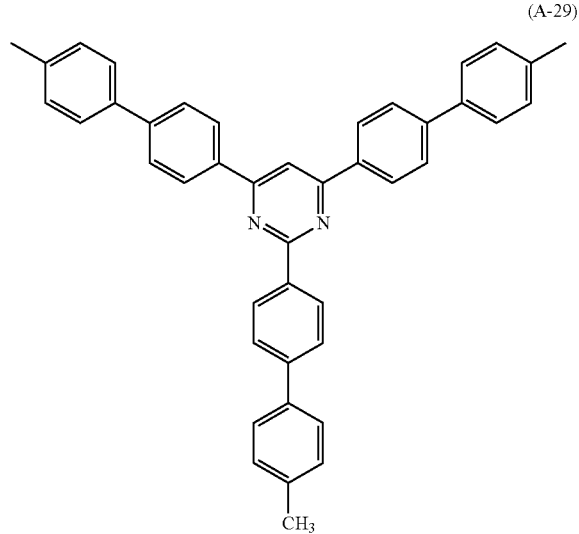
-continued
(A-30)
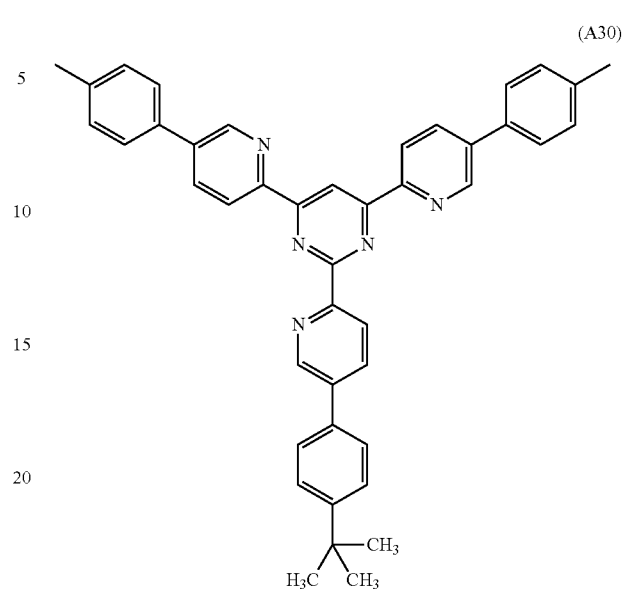
(A-31)
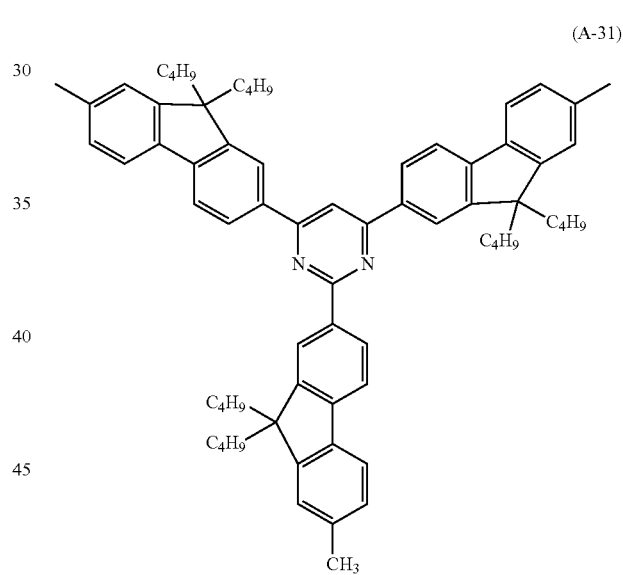
(A-32)
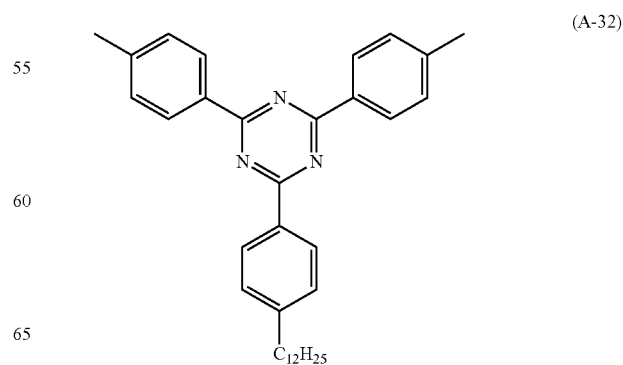

-continued (A-33)

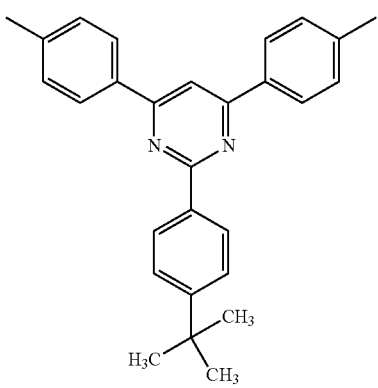

(A-34)

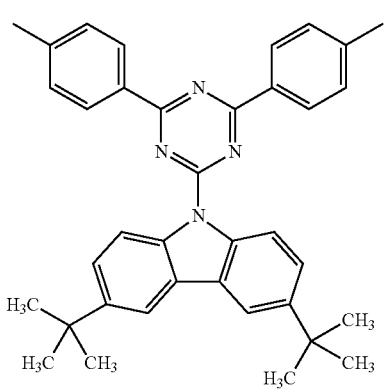

When the above organic compound is a polymer compound, a conjugated polymer is preferred in terms of a charge transport property when a thin film is made, and device properties, such as luminous efficiency and life, when used for a light-emitting device. Here, the conjugated polymer means a polymer compound in which delocalized π-electron pairs are present along the main chain skeleton of the polymer. For this delocalized electron, an unpaired electron or a lone electron pair may participate in resonance, instead of a double bond.

When the above organic compound is a polymer compound, linking may be performed by nonconjugated units, or these nonconjugated moieties may be included in repeating units, in a range in which the light emission property and the charge transport property are not impaired. Examples of the nonconjugated bond structures include structures represented by formulas shown below, and structures combining two or more of the structures represented by the formulas shown below. In the formulas shown below, R is as defined above. Ar represents an aromatic hydrocarbon ring or a heterocycle.

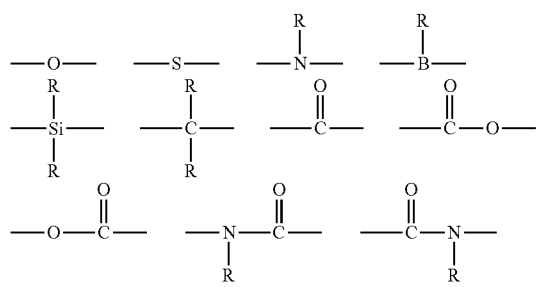

-continued

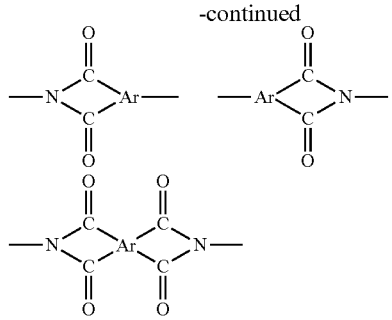

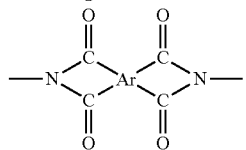

When the above organic compound is a polymer compound, the polymer compound may be a random copolymer, a block copolymer, or a graft copolymer, or may be a polymer having an intermediate structure thereof, for example, a random copolymer with a block property. In terms of obtaining a polymer light emitter with a high quantum yield of fluorescence or phosphorescence, a random copolymer with a block property, a block copolymer, or a graft copolymer is more preferred than a complete random copolymer. Further, the above organic compound also includes those having a branch in the main chain and having three or more end parts, and dendrimers.

The polymer compound having the divalent group represented by the above formula (A) as a repeating unit may further have a repeating unit represented by the following formula (B):

$$—(Ar^2)— \quad (B)$$

wherein $Ar^2$ represents an arylene group which may have a substituent, or a divalent heterocyclic group which may have a substituent.

Examples of the arylene group which may have a substituent, represented by $Ar^2$ in the above formula (B), include a phenylene group which may have a substituent, a naphthylene group which may have a substituent, and groups represented by the following formula (3a):

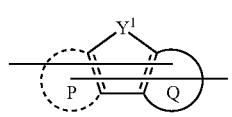

(3a)

wherein the P ring and the Q ring each independently represent an aromatic ring, and the P ring may be present or not; two bonds are each present in the P ring or the Q ring when the P ring is present, and two bonds are each present in a five-membered ring or a six-membered ring comprising $Y^1$ or the Q ring when the P ring is not present; the P ring, the Q ring, and the five-membered ring or the six-membered ring comprising $Y^1$ may each independently have at least one substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, and a cyano group; $Y^1$ represents $—C(R^{11})(R^{12})—$, $—C(R^{14})(R^{15})—C(R^{16})(R^{17})—$, or $—C(R^{32})=C(R^{33})—$; and $R^{11}$, $R^{12}$, $R^{14}$ to $R^{17}$, $R^{32}$, and $R^{33}$ each independently represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group, or a halogen atom.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the amino group, the substituted amino group, the silyl group, the substituted silyl group, the halogen atom, the acyl group, the acyloxy group, the imine residue, the amide group, the acid imide group, the monovalent heterocyclic group, the carboxyl group, the substituted carboxyl group, and the cyano group, which are the substituents that the P ring, the Q ring, and the five-membered ring or the six-membered ring comprising $Y^1$ in the above formulas (3a) may have, are the same as those described and illustrated as the above groups and atoms represented by R.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the amino group, the substituted amino group, the silyl group, the substituted silyl group, the silyloxy group, the substituted silyloxy group, the monovalent heterocyclic group, and the halogen atom represented by $R^{11}$, $R^{12}$, $R^{14}$ to $R^{17}$, $R^{32}$, and $R^{33}$ in the above formula (3a) are the same as those described and illustrated as the above groups and atoms represented by R.

The divalent heterocyclic group represented by $Ar^2$ in the above formula (B) refers to a remaining atomic group obtained by removing two hydrogen atoms from a heterocyclic compound, and the divalent heterocyclic group may have a substituent. The above heterocyclic compound refers to, among organic compounds having a cyclic structure, those in which the elements constituting the ring are not only a carbon atom and which have one or more atoms selected from the group consisting of an oxygen atom, a nitrogen atom, a silicon atom, a germanium atom, a tin atom, a phosphorus atom, a boron atom, a sulfur atom, a selenium atom, and a tellurium atom. In addition, the divalent heterocyclic group is preferably a divalent aromatic heterocyclic group. The moiety of the divalent heterocyclic group excluding the substituent usually has about 3 to 60 carbon atoms. The total number of carbon atoms of the divalent heterocyclic group including the substituent is usually about 3 to 100.

Examples of the divalent heterocyclic group represented by $Ar^2$ in the above formula (B) include groups represented by the following formula (3b):

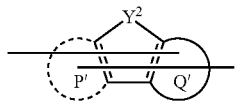

(3b)

wherein the P' ring and the Q' ring each independently represent an aromatic ring, and the P' ring may be present or not; two bonds are each present in the P' ring or the Q' ring when the P' ring is present, and two bonds are each present in a five-membered ring or a six-membered ring comprising $Y^2$ or the Q' ring when the P' ring is not present; the P' ring, the Q' ring, and the five-membered ring or the six-membered ring comprising $Y^2$ may each independently have at least one substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, and a cyano group; $Y^2$ represents —O—, —S—, —Se—, —B($R^6$)—, —Si($R^7$)($R^8$)—, —P($R^9$)—, —P$R^{10}$(=O)—, —N($R^{13}$)—, —O—C($R^{18}$)($R^{19}$)—, —S—C($R^{20}$)($R^{21}$)—, —N—C($R^{22}$)($R^{23}$)—, —Si($R^{24}$)($R^{25}$)—C($R^{26}$)($R^{27}$)—, —Si($R^{28}$)($R^{29}$)—Si($R^{30}$)($R^{31}$)—, —N=C($R^{34}$)—, or —Si($R^{35}$)=C($R^{36}$)—; and $R^6$ to $R^{10}$, $R^{13}$, $R^{18}$ to $R^{31}$, and $R^{34}$ to $R^{36}$ each independently represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group, or a halogen atom.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the amino group, the substituted amino group, the silyl group, the substituted silyl group, the halogen atom, the acyl group, the acyloxy group, the imine residue, the amide group, the acid imide group, the monovalent heterocyclic group, the carboxyl group, the substituted carboxyl group, and the cyano group, which are the substituents that the P' ring, the Q' ring, and the five-membered ring or the six-membered ring comprising $Y^2$ in the above formulas may have, are the same as those described and illustrated as the above groups and atoms represented by R.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the amino group, the substituted amino group, the silyl group, the substituted silyl group, the silyloxy group, the substituted silyloxy group, the monovalent heterocyclic group, and the halogen atom represented by $R^6$ to $R^{10}$, $R^{13}$, $R^{18}$ to $R^{31}$, and $R^{34}$ to $R^{36}$ in the above formula are the same as those described and illustrated as the above groups and atoms represented by R.

Examples of the groups represented by the above formula (3a) and the above formula (3b) include groups represented by the following formula (3-1), the following formula (3-2), or the following formula (3-3):

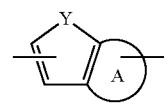

(3-1)

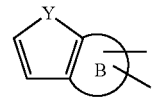

(3-2)

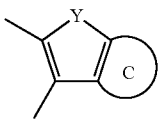

wherein the A ring, the B ring, and the C ring each independently represent an aromatic ring; the formulas (3-1), (3-2), and (3-3) may each have a substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, and a cyano group; and Y is as defined above;

and groups represented by the following formula (3-4) or the following formula (3-5):

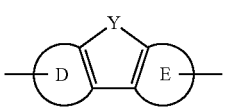

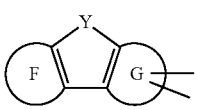

wherein the D ring, the E ring, the F ring, and the G ring each independently represent an aromatic ring which may have one or more substituents selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, and a cyano group; and Y is as defined above, and the groups represented by the above formula (3-4) or the above formula (3-5) are preferred.

In the above formulas, Y is preferably —S—, —O—, or —C($R^{11}$)($R^{12}$)—, in terms of high-efficiency light emission, and further preferably —S— or —O—. Here, $R^{11}$ and $R^{12}$ are as defined above.

Examples of the aromatic rings in the above formulas (3-1) to (3-5) include aromatic hydrocarbon rings, such as a benzene ring, a naphthalene ring, an anthracene ring, a tetracene ring, a pentacene ring, a pyrene ring, and a phenanthrene ring; and heteroaromatic rings, such as a pyridine ring, a bipyridine ring, a phenanthroline ring, a quinoline ring, an isoquinoline ring, a thiophene ring, a furan ring, and a pyrrole ring.

An alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, an acyloxy group, an imine residue, an amide group, an acid imide group, a monovalent heterocyclic group, a carboxyl group, and a substituted carboxyl group are preferred as the substituent that the groups represented by the above formulas (3-1) to (3-5) may have.

Among the groups represented by the above formulas (3-1) to (3-5), groups represented by the following formula (C):

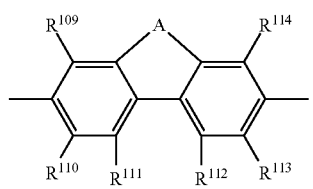

wherein $R^{109}$, $R^{110}$, $R^{111}$, $R^{112}$, $R^{113}$, and $R^{114}$ each independently represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, or a carboxyl group; $R^{109}$ and $R^{110}$, and $R^{112}$ and $R^{113}$ may each form a ring together; A represents —O—, —Si($R^{24}$)($R^{25}$)—, —C($R^{26}$)($R^{27}$)—, —P($R^9$)—, or —P$R^{10}$(=O)—; and $R^9$, $R^{10}$, and $R^{24}$ to $R^{27}$ are as defined above, are preferred.

Examples of the repeating unit represented by the above formula (B) include repeating units represented by the following formulas B-1 to B-8.

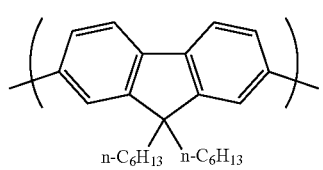

B-1

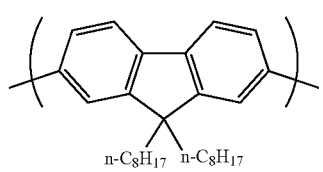

B-2

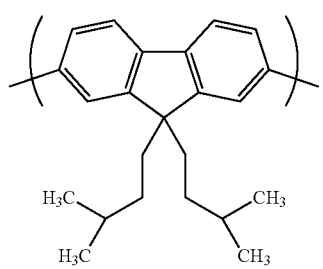

B-3

-continued

B-4
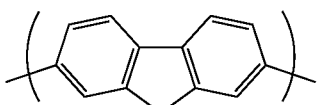

B-5
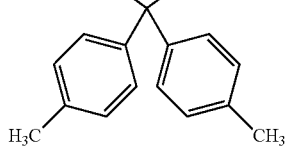

B-6
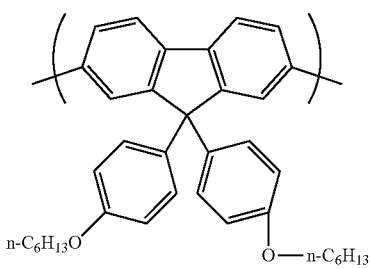

B-7
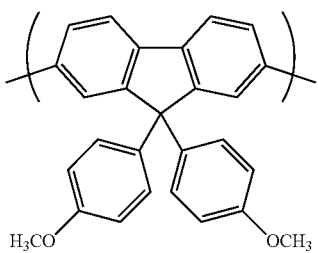

B-8
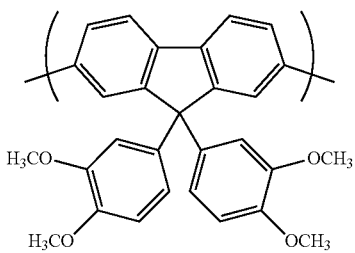

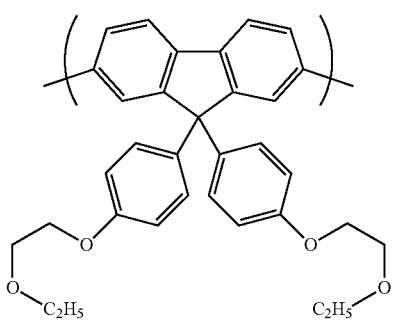

The polymer compound having the divalent group represented by the above formula (A) as a repeating unit may further have a divalent aromatic amine group as a repeating unit. As this divalent aromatic amine group, repeating units represented by the following formula (5):

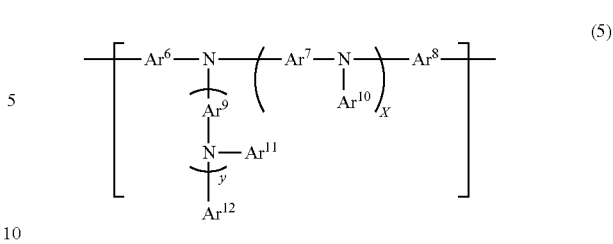
(5)

wherein $Ar^6$, $Ar^7$, $Ar^8$, and $Ar^9$ each independently represent an arylene group or a divalent heterocyclic group; $Ar^6$, $Ar^7$, and $Ar^8$ may be bonded to each other to form a ring; $Ar^{10}$, $Ar^{11}$ and $Ar^{12}$ each independently represent an aryl group or a monovalent heterocyclic group; $Ar^6$ to $Ar^{12}$ may have a substituent; and x and y are each independently 0 or 1, and $0 \leq x+y \leq 1$, are preferred.

The arylene group and the divalent heterocyclic group represented by $Ar^6$ to $Ar^9$ in the above formula (5) are the same as those described and illustrated as the above divalent heterocyclic group represented by Ar.

The aryl group and the monovalent heterocyclic group represented by $Ar^{10}$ to $Ar^{12}$ in the above formula (5) are the same as those described and illustrated as the above aryl group and monovalent heterocyclic group represented by R.

Examples of the substituent that the arylene group, the divalent heterocyclic group, the aryl group, and the monovalent heterocyclic group in the above formula (5) may have include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group, and a nitro group. These substituents are the same as those described and illustrated as the substituent that the ligand constituting the above metal complex may have.

Examples of the repeating units represented by the above formula (5) include repeating units represented by the following formulas C-1 to C-11.

C-1
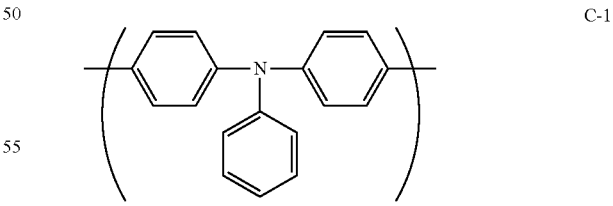

C-2
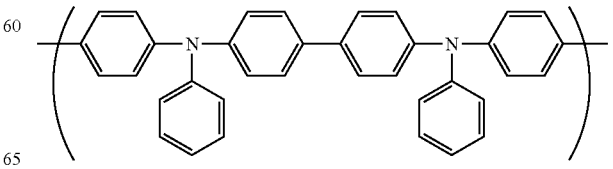

-continued

C-3
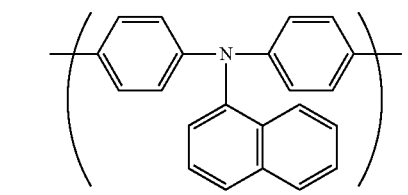

C-4
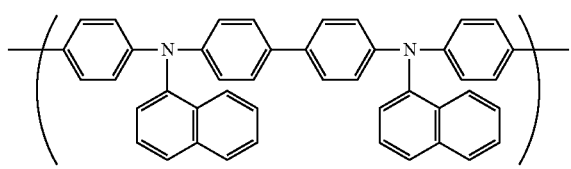

C-5
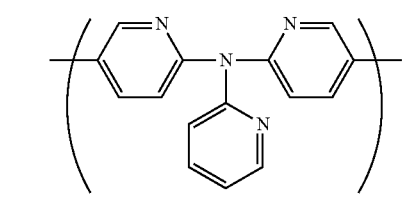

C-6
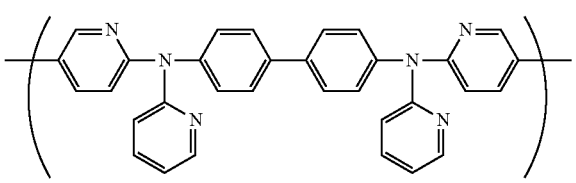

C-7
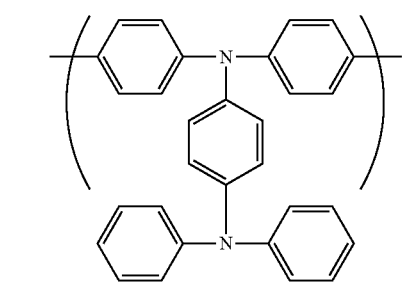

C-8
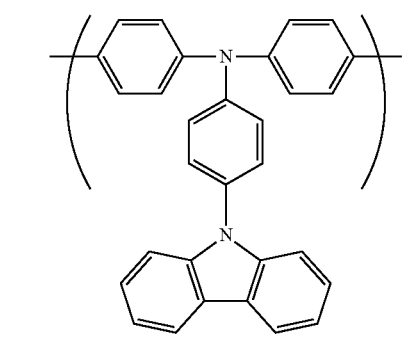

-continued

C-9
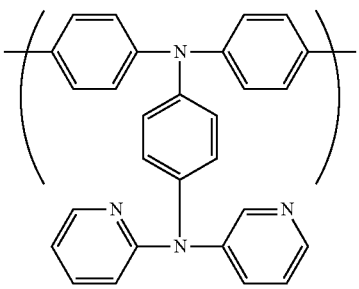

C-10
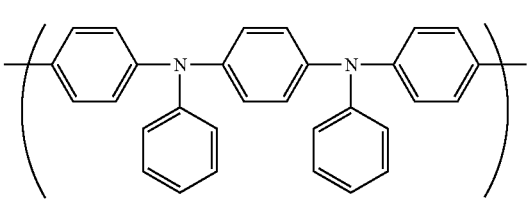

C-11
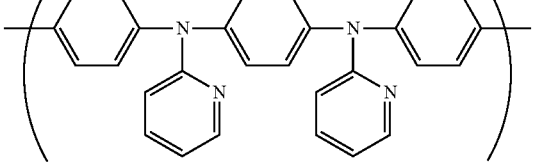

In the above formulas, hydrogen atoms in aromatic rings may be independently replaced by an alkyl group having 1 to 20 carbon atoms, an alkoxy group having 1 to 20 carbon atoms, a phenylalkyl group having 7 to 26 carbon atoms, a phenylalkoxy group having 7 to 26 carbon atoms, a phenyl group, a phenoxy group, an alkyl group-substituted phenyl group having 7 to 26 carbon atoms, an alkoxy group-substituted phenyl group having 7 to 26 carbon atoms, an alkylcarbonyl group having 2 to 21 carbon atoms, a formyl group, an alkoxycarbonyl group having 2 to 21 carbon atoms, or a carboxyl group. In addition, when two substituents are present, they may be bonded to each other to form a ring.

Examples of the phenylalkyl group include those having 7 to 26 carbon atoms, preferably 11 to 21 carbon atoms, and more preferably 14 to 18 carbon atoms, and specifically, a phenylmethyl group, a phenylethyl group, a phenylpropyl group, a phenylbutyl group, a phenylpentyl group, a phenylhexyl group, a phenylheptyl group, a phenyloctyl group, a phenylnonyl group, a phenyldecyl group, and a phenyldodecyl group.

Examples of the phenylalkoxy group include those having 7 to 26 carbon atoms, preferably 11 to 21 carbon atoms, and more preferably 14 to 18 carbon atoms, and specifically, a phenylmethoxy group, a phenylethoxy group, a phenylpropyloxy group, a phenylbutoxy group, a phenylpentyloxy group, a phenylhexyloxy group, a phenylheptyloxy group, a phenyloctyloxy group, a phenylnonyloxy group, a phenyldecyloxy group, and a phenyldodecyloxy group.

The alkyl group-substituted phenyl group refers to a group in which one or more hydrogen atoms in a phenyl group are replaced by an alkyl group having 1 to 20 carbon atoms, that is, a monoalkylphenyl group, a dialkylphenyl group, a trialkylphenyl group, a tetraalkylphenyl group, and a pentaalkylphenyl group. Examples of the alkyl group-substituted phenyl group include those having 7 to 26 carbon atoms, preferably 11 to 21 carbon atoms, and more preferably 14 to 18 carbon atoms, and specifically, a mono-, di-, tri-, tetra-, or pentamethylphenyl group; a mono-, di-, tri-, tetra-, or pentaethylphenyl group; a mono-, di-, tri-, tetra-, or pentapropylphenyl group; a mono-, di-, tri-, tetra-, or pentaisopropylphenyl group; a mono-, di-, tri-, tetra-, or pentabutylphenyl group; a mono-, di-, tri-, tetra-, or pentaisobutylphenyl group; a mono-, di-, tri-, tetra-, or penta-s-butylphenyl group; a mono-, di-, tri-, tetra-, or penta-t-butylphenyl group; a mono-, di-, tri-, tetra-, or pentapentylphenyl group; a mono-, di-, tri-, tetra-, or pentaisoamylphenyl group; a mono-, di-, tri-, tetra-, or pentahexylphenyl group; a mono-, di-, tri-, tetra-, or pentaheptylphenyl group; a mono-, di-, tri-, tetra-, or pentaoctylphenyl group; a mono-, di-, tri-, tetra-, or penta(2-ethylhexyl)phenyl group; a mono-, di-, tri-, tetra-, or pentanonylphenyl group; a mono-, di-, tri-, tetra-, or pentadecylphenyl group; a mono-, di-, tri-, tetra-, or penta(3,7-dimethyloctyl)phenyl group; and a mono-, di-, tri-, tetra-, or pentadodecylphenyl group.

The alkoxy group-substituted phenyl group refers to a group in which one or more hydrogen atoms in a phenyl group are replaced by an alkoxy group having 1 to 20 carbon atoms, that is, a monoalkoxyphenyl group, a dialkoxyphenyl group, a trialkoxyphenyl group, a tetraalkoxyphenyl group, and a pentaalkoxyphenyl group. Examples of the alkoxy group-substituted phenyl group include those having 7 to 26 carbon atoms, preferably 11 to 21 carbon atoms, and more preferably 14 to 18 carbon atoms, and specifically, a mono-, di-, tri-, tetra-, or pentamethoxyphenyl group; a mono-, di-, tri-, tetra-, or pentaethoxyphenyl group; a mono-, di-, tri-, tetra-, or pentapropyloxyphenyl group; a mono-, di-, tri-, tetra-, or pentaisopropyloxyphenyl group; a mono-, di-, tri-, tetra-, or pentabutoxyphenyl group; a mono-, di-, tri-, tetra-, or pentaisobutoxyphenyl group; a mono-, di-, tri-, tetra-, or penta-s-butoxyphenyl group; a mono-, di-, tri-, tetra-, or penta-t-butoxyphenyl group; a mono-, di-, tri-, tetra-, or pentapentyloxyphenyl group; a mono-, di-, tri-, tetra-, or pentahexyloxyphenyl group; a mono-, di-, tri-, tetra-, or pentaheptyloxyphenyl group; a mono-, di-, tri-, tetra-, or pentaoctyloxyphenyl group; a mono-, di-, tri-, tetra-, or penta(2-ethylhexyloxy)phenyl group; a mono-, di-, tri-, tetra-, or pentanonyloxyphenyl group; a mono-, di-, tri-, tetra-, or pentadecyloxyphenyl group; a mono-, di-, tri-, tetra-, or penta(3,7-dimethyloctyloxy)phenyl group; and a mono-, di-, tri-, tetra-, or pentadodecyloxyphenyl group.

Examples of the alkylcarbonyl group include those having 2 to 21 carbon atoms, preferably 5 to 15 carbon atoms, and more preferably 8 to 12 carbon atoms, and specifically, an acetyl group, a propionyl group, a butyryl group, an isobutyryl group, a pentanoyl group, a hexanoyl group, a heptanoyl group, an octanoyl group, a 2-ethylhexanoyl group, a nonanoyl group, a decanoyl group, a 3,7-dimethyloctanoyl group, and a dodecanoyl group.

Examples of the alkoxycarbonyl group include those having 2 to 21 carbon atoms, preferably 5 to 15 carbon atoms, and more preferably 8 to 12 carbon atoms, and specifically, a methoxycarbonyl group, an ethoxycarbonyl group, a propyloxycarbonyl group, an isopropyloxycarbonyl group, a butoxycarbonyl group, an isobutoxycarbonyl group, an s-butoxycarbonyl group, a t-butoxycarbonyl group, a pentyloxycarbonyl group, a hexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, and a dodecyloxycarbonyl group.

Among the repeating units represented by the above formula (5), repeating units represented by the following formula (6):

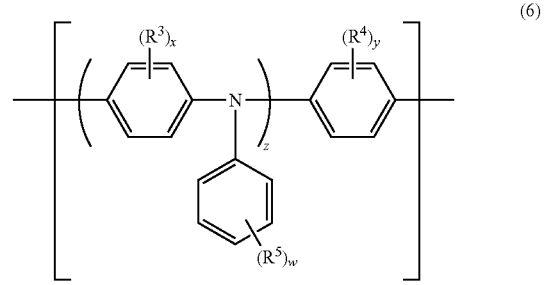

(6)

wherein $R^3$, $R^4$, and $R^5$ independently represent an alkyl group having 1 to 20 carbon atoms, an alkoxy group having 1 to 20 carbon atoms, a phenylalkyl group having 7 to 26 carbon atoms, a phenylalkoxy group having 7 to 26 carbon atoms, a phenyl group, a phenoxy group, an alkyl group-substituted phenyl group having 7 to 26 carbon atoms, an alkoxy group-substituted phenyl group having 7 to 26 carbon atoms, an alkylcarbonyl group having 2 to 21 carbon atoms, a formyl group, an alkoxycarbonyl group having 2 to 21 carbon atoms, or a carboxyl group; or $R^3$ and $R^4$ may form a ring together, instead of representing the above groups; x and y are independently an integer of 0 to 4, z is 1 or 2, and w is an integer of 0 to 5; and when a plurality of at least one of $R^3$, $R^4$, and $R^5$ are present, the plurality of groups may be the same or different, are preferred.

When $R^3$ and $R^4$ in the above formula (6) form a ring together, instead of representing the above groups, examples of the ring include $C_5$ to $C_{14}$ heterocycles which may have a substituent. Examples of the heterocycles include a morpholine ring, a thiomorpholine ring, a pyrrole ring, a piperidine ring, and a piperazine ring.

Examples of such repeating units represented by above formula (6) include repeating units represented by the following formulas (6-1) to (6-10).

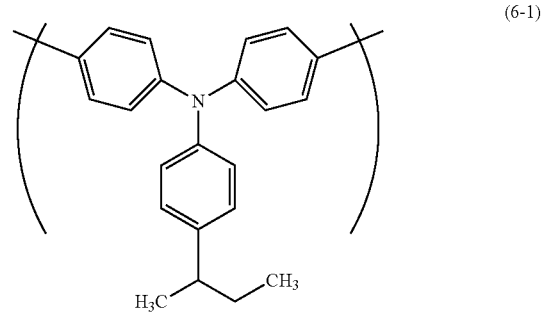

(6-1)

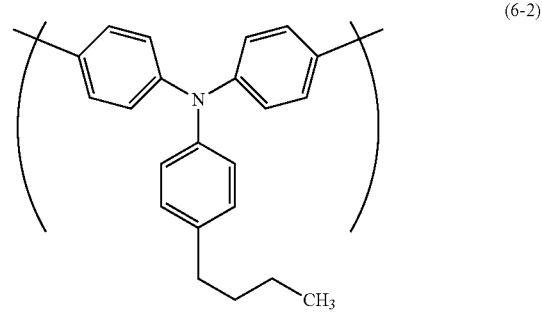

(6-2)

(6-3)
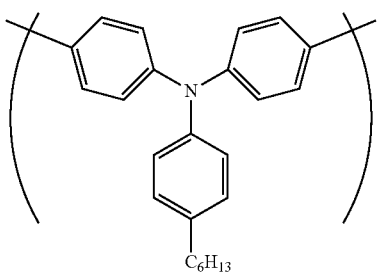
(6-4)
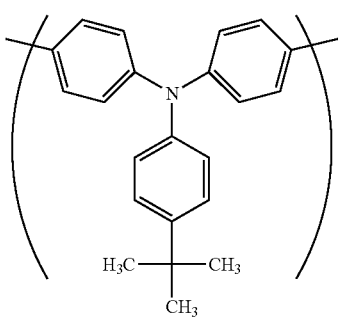
(6-5)
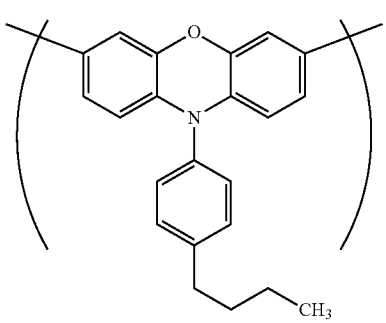
(6-6)
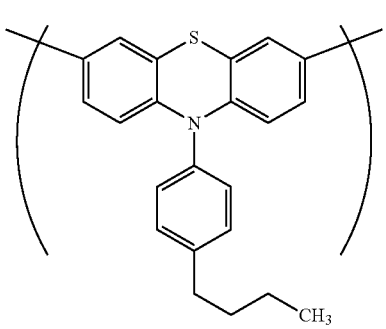
(6-7)
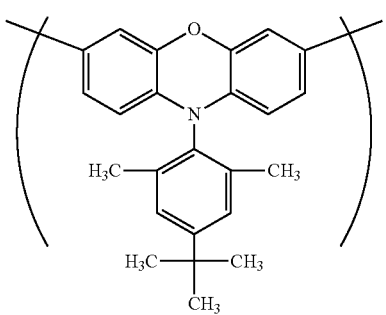
(6-8)
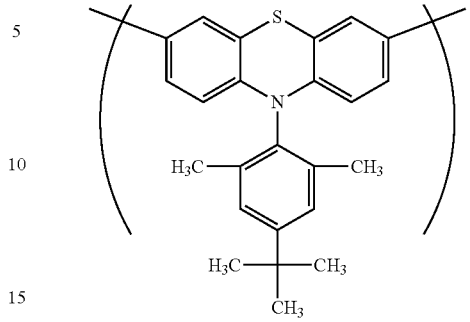
(6-9)
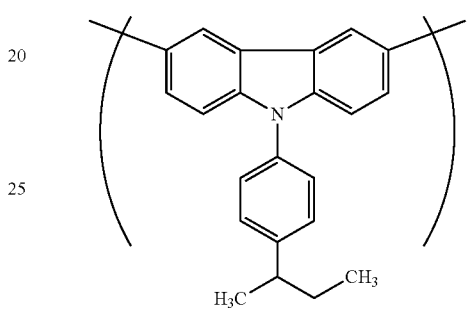
(6-10)
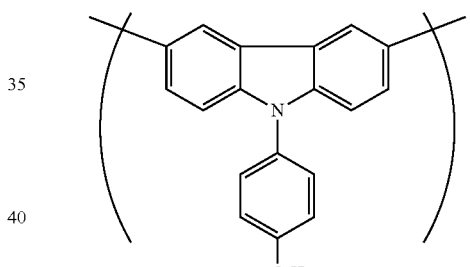
Examples of the organic compounds (low-molecular compounds) represented by the above formula (A') include the following.
(A'-1)
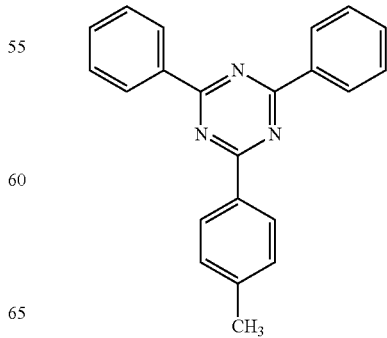

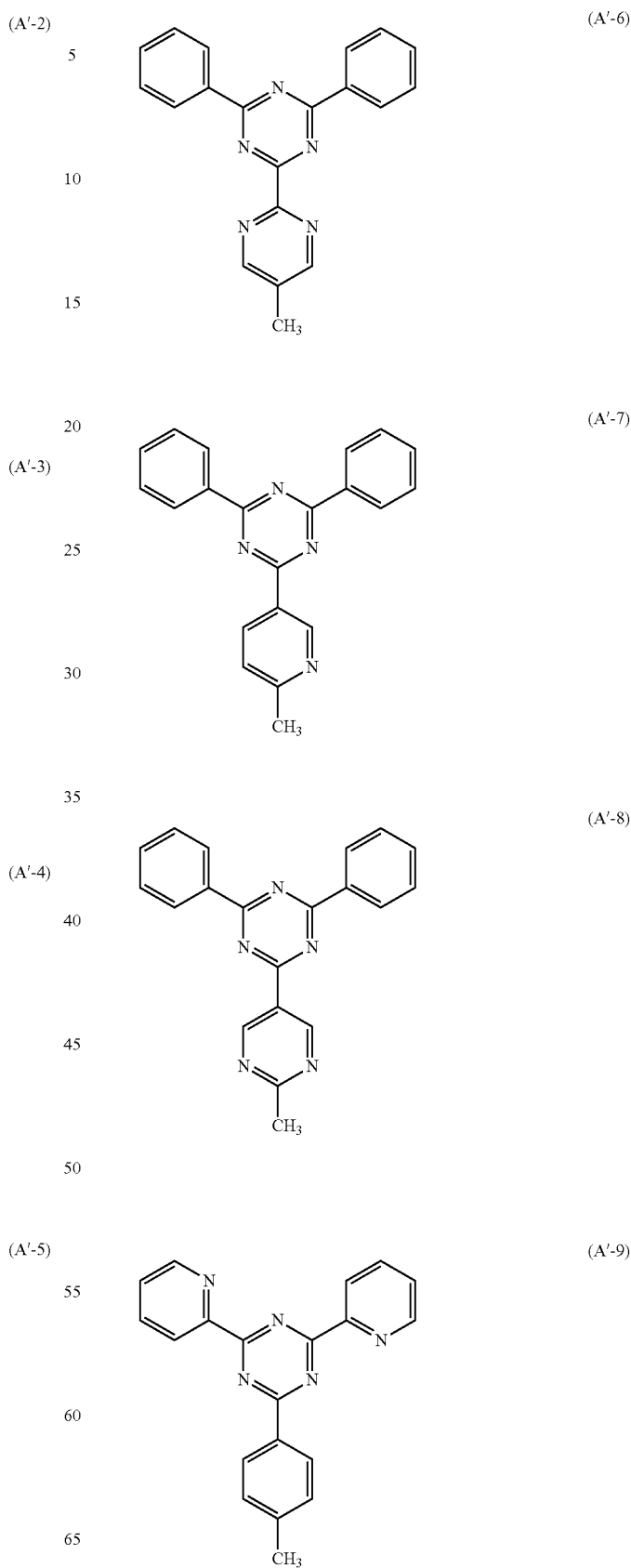

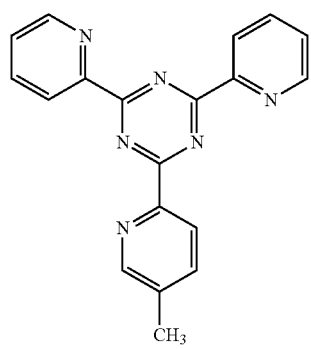 (A'-10)
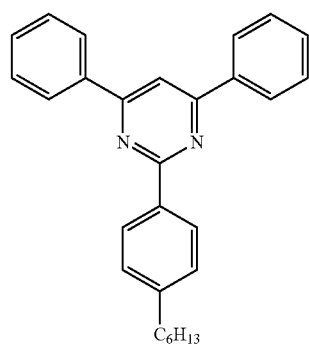 (A'-14)
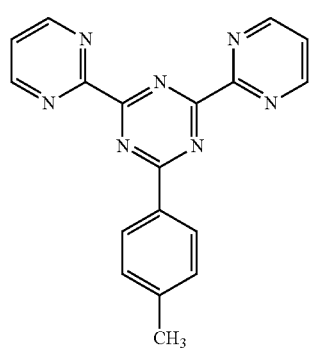 (A'-11)
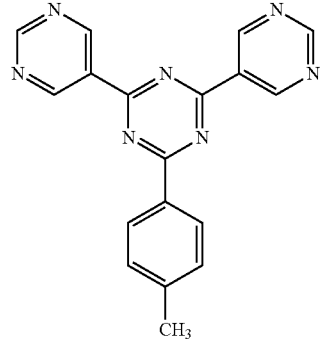 (A'-12)
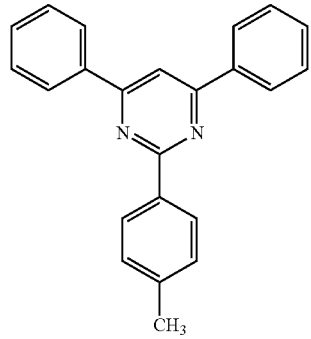 (A'-13)
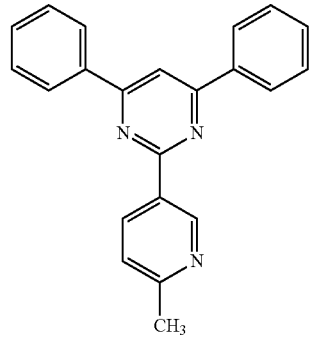 (A'-17)

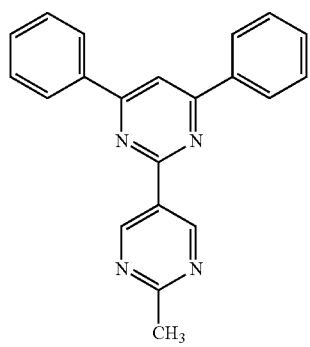 (A'-18)
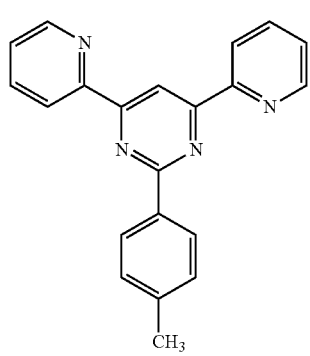 (A'-19)
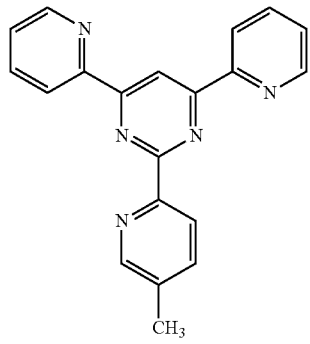 (A'-20)
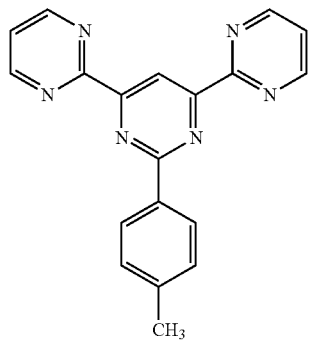 (A'-21)
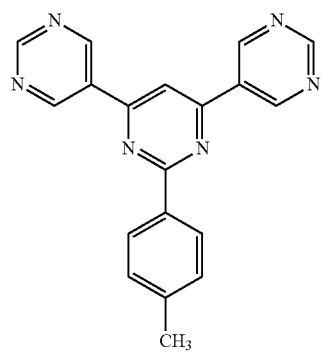 (A'-22)
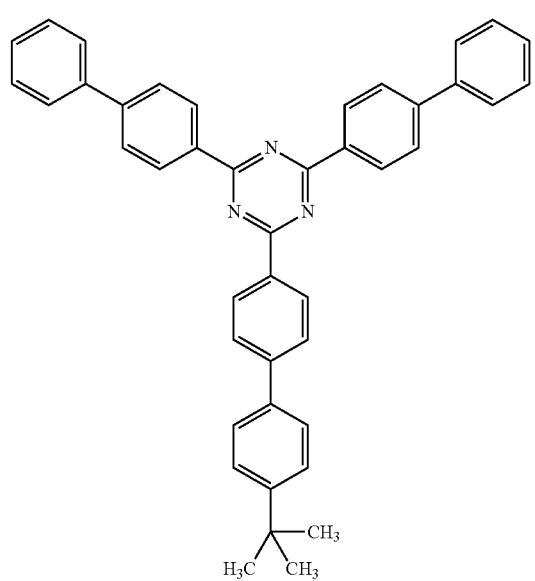 (A'-23)
(A'-24)

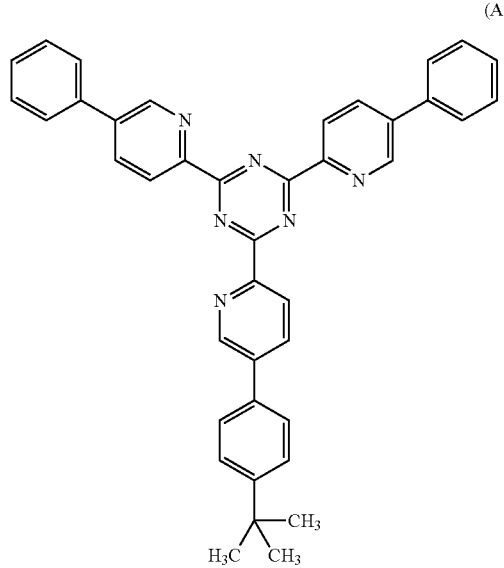
(A'-25)
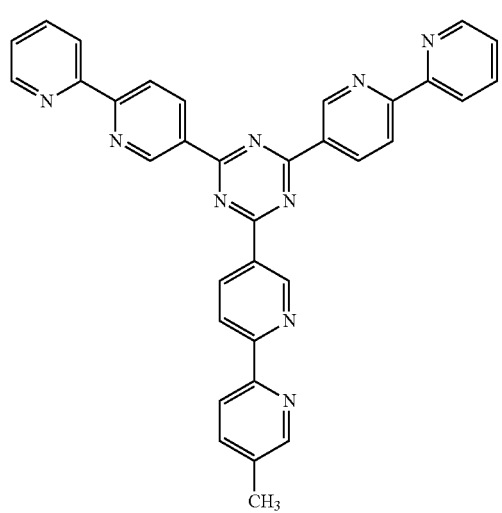
(A'-26)
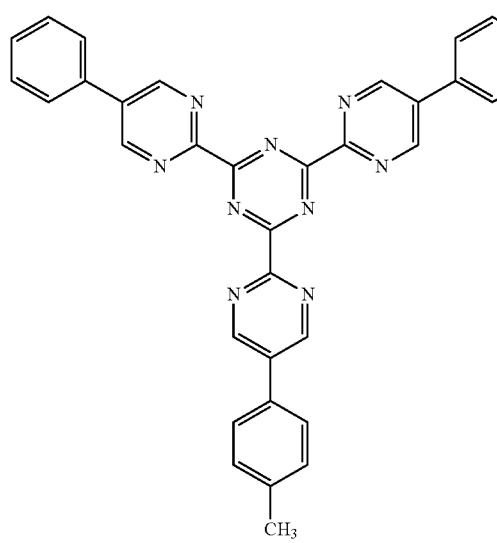
(A'-27)
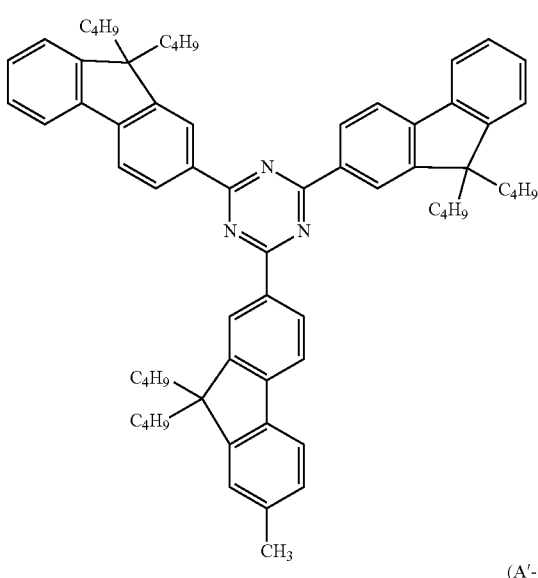
(A'-28)
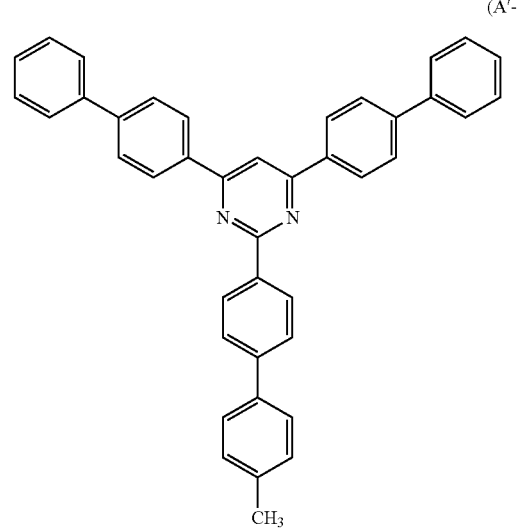
(A'-29)
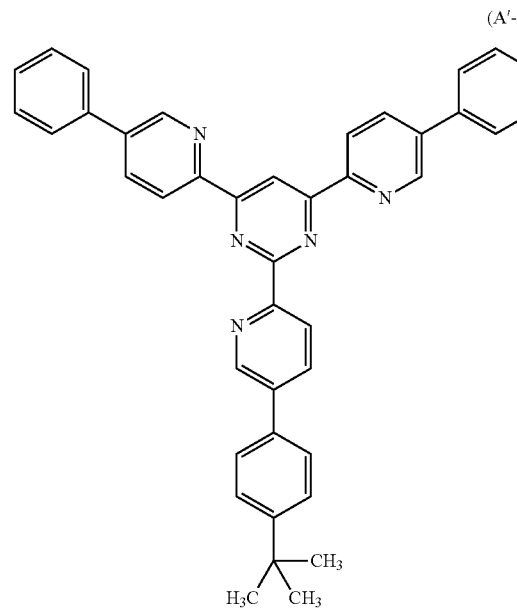
(A'-30)

(A'-31)

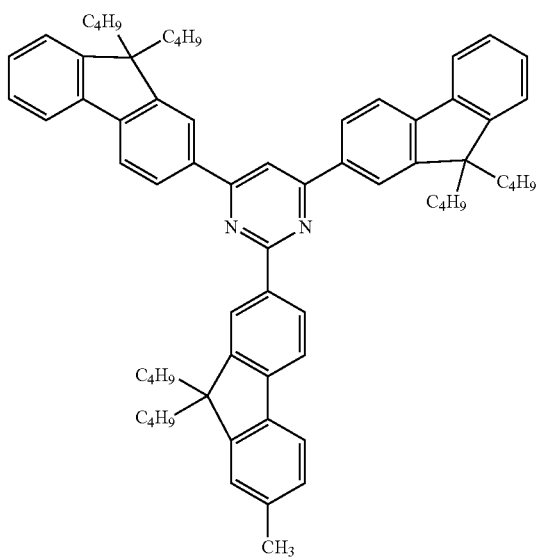

The absolute values of the LUMO energy levels of typical organic compounds, among the above organic compounds (A'-1) to (A'-31), are shown in the following table.

| Compound | LUMO(eV) |
|---|---|
| A'-1 | 1.76 |
| A'-2 | 1.75 |
| A'-5 | 1.87 |
| A'-6 | 1.99 |
| A'-7 | 1.92 |
| A'-8 | 2.11 |
| A'-9 | 1.94 |
| A'-10 | 1.92 |
| A'-11 | 2.02 |
| A'-12 | 2.50 |
| A'-13 | 1.61 |
| A'-15 | 1.60 |
| A'-16 | 1.58 |
| A'-17 | 1.73 |
| A'-18 | 1.87 |
| A'-19 | 1.80 |
| A'-20 | 1.77 |
| A'-21 | 2.07 |
| A'-22 | 2.35 |
| A'-23 | 1.87 |
| A'-24 | 1.87 |
| A'-25 | 1.99 |
| A'-26 | 2.32 |
| A'-27 | 2.02 |
| A'-28 | 1.84 |
| A'-29 | 1.82 |
| A'-30 | 1.88 |

The above organic compounds have a LUMO energy level value of preferably −1.00 to −2.50 eV and more preferably −1.30 to −2.40 eV, in terms of driving voltage reduction.

The above organic compounds may be used alone or in combination of two or more thereof.

—Combination—

In the composition of the present invention, the difference between the absolute value of the LUMO energy level of the above metal complex and the absolute value of the LUMO energy level of the above organic compound is less than 0.40 eV, preferably 0.35 eV or less, and more preferably 0.30 eV or less, but in terms of luminous efficiency, it is desired that the LUMO energy of the above metal complex is smaller than the LUMO energy of the above organic compound.

In the composition of the present invention, for example, the following modes are considered as a combination of a metal complex and an organic compound in which the difference between the absolute value of the LUMO energy level of the metal complex and the absolute value of the LUMO energy level of the organic compound is less than 0.40 eV.

1) A Combination of One Metal Complex and One Organic Compound

A combination in which the difference between the absolute value of the LUMO energy level of a metal complex and the absolute value of the LUMO energy level of an organic compound is less than 0.40 eV.

2) A Combination of One Metal Complex and Two or More Organic Compounds

A combination in which the difference between the absolute value of the LUMO energy level of a metal complex and the absolute value of the LUMO energy level of an organic compound having the maximum LUMO energy level among all organic compounds is less than 0.40 eV.

3) A Combination of Two or More Metal Complexes and One Organic Compound

A combination in which the difference between the absolute value of the LUMO energy level of a metal complex having the maximum LUMO energy level among all metal complexes and the absolute value of the LUMO energy level of an organic compound is less than 0.40 eV.

4) A Combination of Two or More Metal Complexes and Two or More Organic Compounds A combination in which the difference between the absolute value of the LUMO energy level of a metal complex having the maximum LUMO energy level among all metal complexes and the absolute value of the LUMO energy level of an organic compound having the maximum LUMO energy level among all organic compounds is less than 0.40 eV.

As used herein, the above LUMO energy level value is a value calculated by a computational scientific approach. As used herein, in the computational scientific approach, the structure optimization of the ground state is performed by the density functional method at the B3LYP level, using the quantum chemical calculation program Gaussian03, and the value of the LUMO energy level in the optimized structure is calculated. At this time, as the basis function, LANL2DZ is used for the central metal atom, and 6-31 g* is used for atoms other than the central metal atom.

For the above LUMO energy level, in a case where the above organic compound is a polymer compound and has a repeating unit, when trimers are formed with all combinations considered for the repeating unit of the above organic compound, and the absolute values of the LUMO energy levels of the trimers are obtained, the absolute value of the LUMO energy level whose absolute value is maximum is defined as the absolute value of the LUMO energy level of the organic compound (that is, when the LUMO energy level value is negative, the absolute value means the value without the negative sign. The same applies herein.).

In a case where the above organic compound is a low-molecular compound, or is a polymer compound and has no repeating unit, the absolute value of an LUMO energy level obtained by applying the above computational scientific approach to the organic compound itself is defined as the absolute value of the LUMO energy level of the organic compound.

Next, preferred combinations of the above metal complexes and the above organic compounds in the composition of the present invention, together with differences in the absolute value of the LUMO energy level, are shown in the following tables.

1) Cases where the organic compound is a low-molecular compound

| Metal complex | Organic compound | LUMO difference (eV) | Metal complex | Organic compound | LUMO difference (eV) |
|---|---|---|---|---|---|
| M-1 | (A'-1) | 0.14 | M-3 | (A'-18) | 0.05 |
| M-1 | (A'-2) | 0.13 | M-3 | (A'-19) | 0.12 |
| M-1 | (A'-5) | 0.25 | M-3 | (A'-20) | 0.15 |
| M-1 | (A'-6) | 0.37 | M-3 | (A'-21) | 0.15 |
| M-1 | (A'-7) | 0.30 | M-3 | (A'-24) | 0.05 |
| M-1 | (A'-9) | 0.32 | M-3 | (A'-25) | 0.05 |
| M-1 | (A'-10) | 0.30 | M-3 | (A'-26) | 0.07 |
| M-1 | (A'-13) | 0.01 | M-3 | (A'-28) | 0.10 |
| M-1 | (A'-15) | 0.02 | M-3 | (A'-29) | 0.08 |
| M-1 | (A'-16) | 0.04 | M-3 | (A'-30) | 0.10 |
| M-1 | (A'-17) | 0.11 | M-7 | (A'-1) | 0.32 |
| M-1 | (A'-18) | 0.25 | M-7 | (A'-2) | 0.33 |
| M-1 | (A'-19) | 0.18 | M-7 | (A'-5) | 0.21 |
| M-1 | (A'-20) | 0.15 | M-7 | (A'-6) | 0.09 |
| M-1 | (A'-24) | 0.25 | M-7 | (A'-7) | 0.16 |
| M-1 | (A'-25) | 0.25 | M-7 | (A'-8) | 0.03 |
| M-1 | (A'-26) | 0.37 | M-7 | (A'-9) | 0.14 |
| M-1 | (A'-29) | 0.22 | M-7 | (A'-10) | 0.16 |
| M-1 | (A'-30) | 0.20 | M-7 | (A'-11) | 0.06 |
| M-3 | (A'-1) | 0.16 | M-7 | (A'-17) | 0.35 |
| M-3 | (A'-2) | 0.17 | M-7 | (A'-18) | 0.21 |
| M-3 | (A'-5) | 0.05 | M-7 | (A'-19) | 0.28 |
| M-3 | (A'-6) | 0.07 | M-7 | (A'-20) | 0.31 |
| M-3 | (A'-7) | 0 | M-7 | (A'-21) | 0.01 |
| M-3 | (A'-8) | 0.19 | M-7 | (A'-23) | 0.27 |
| M-3 | (A'-9) | 0.02 | M-7 | (A'-24) | 0.21 |
| M-3 | (A'-10) | 0 | M-7 | (A'-25) | 0.21 |
| M-3 | (A'-11) | 0.10 | M-7 | (A'-26) | 0.09 |
| M-3 | (A'-13) | 0.31 | M-7 | (A'-27) | 0.24 |
| M-3 | (A'-15) | 0.32 | M-7 | (A'-28) | 0.06 |
| M-3 | (A'-16) | 0.34 | M-7 | (A'-29) | 0.24 |
| M-3 | (A'-17) | 0.19 | M-7 | (A'-30) | 0.26 |

2) Cases where the organic compound is a polymer compound

| Metal complex 1 | Metal complex 2 | Polymer compound (repeating unit) 1 | Polymer compound (repeating unit) 2 | LUMO difference (eV) |
|---|---|---|---|---|
| M-1 | — | F8 | (A-15) | 0.37 |
| M-1 | — | F8 | (A-16) | 0.34 |
| M-1 | — | F8 | (A-29) | 0.31 |
| M-1 | — | F8 | (A-24) | 0.39 |
| M-3 | — | F8 | (A-13) | 0.10 |
| M-3 | — | F8 | (A-15) | 0.07 |
| M-3 | — | F8 | (A-16) | 0.04 |
| M-3 | — | F8 | (A-17) | 0.24 |
| M-3 | — | F8 | (A-20) | 0.33 |
| M-3 | — | F8 | (A-29) | 0.01 |
| M-3 | — | F8 | (A-1) | 0.24 |
| M-3 | — | F8 | (A-2) | 0.22 |
| M-3 | — | F8 | (A-6) | 0.20 |
| M-3 | — | F8 | (A-24) | 0.09 |
| M-3 | — | F8 | (A-32) | 0.21 |
| M-3 | — | F8 | (A-33) | 0.10 |
| M-3 | — | F8 | (A-34) | 0.33 |
| M-7 | — | F8 | (A-13) | 0.06 |
| M-7 | — | F8 | (A-15) | 0.09 |
| M-7 | — | F8 | (A-16) | 0.12 |
| M-7 | — | F8 | (A-17) | 0.08 |
| M-7 | — | F8 | (A-18) | 0.24 |
| M-7 | — | F8 | (A-20) | 0.17 |
| M-7 | — | F8 | (A-29) | 0.15 |
| M-7 | — | F8 | (A-1) | 0.08 |
| M-7 | — | F8 | (A-2) | 0.06 |
| M-7 | — | F8 | (A-6) | 0.04 |
| M-7 | — | F8 | (A-8) | 0.39 |
| M-7 | — | F8 | (A-9) | 0.33 |
| M-7 | — | F8 | (A-10) | 0.30 |
| M-7 | — | F8 | (A-24) | 0.07 |
| M-7 | — | F8 | (A-32) | 0.05 |
| M-7 | — | F8 | (A-33) | 0.06 |
| M-7 | — | F8 | (A-34) | 0.17 |
| M-16 | — | F8 | (A-13) | 0.03 |
| M-16 | — | F8 | (A-15) | 0.06 |
| M-16 | — | F8 | (A-16) | 0.09 |
| M-16 | — | F8 | (A-17) | 0.11 |
| M-16 | — | F8 | (A-18) | 0.27 |
| M-16 | — | F8 | (A-20) | 0.20 |
| M-16 | — | F8 | (A-29) | 0.12 |
| M-16 | — | F8 | (A-1) | 0.11 |
| M-16 | — | F8 | (A-2) | 0.09 |
| M-16 | — | F8 | (A-6) | 0.07 |
| M-16 | — | F8 | (A-9) | 0.36 |
| M-16 | — | F8 | (A-10) | 0.33 |
| M-16 | — | F8 | (A-24) | 0.04 |
| M-16 | — | F8 | (A-32) | 0.08 |
| M-16 | — | F8 | (A-33) | 0.03 |
| M-16 | — | F8 | (A-34) | 0.20 |
| M-1 | M-16 | F8 | (A-13) | 0.03 |
| M-1 | M-16 | F8 | (A-15) | 0.06 |
| M-1 | M-16 | F8 | (A-16) | 0.09 |
| M-1 | M-16 | F8 | (A-17) | 0.11 |
| M-1 | M-16 | F8 | (A-18) | 0.27 |
| M-1 | M-16 | F8 | (A-20) | 0.20 |
| M-1 | M-16 | F8 | (A-29) | 0.12 |
| M-1 | M-16 | F8 | (A-1) | 0.11 |
| M-1 | M-16 | F8 | (A-2) | 0.09 |
| M-1 | M-16 | F8 | (A-6) | 0.07 |
| M-1 | M-16 | F8 | (A-9) | 0.36 |
| M-1 | M-16 | F8 | (A-10) | 0.33 |
| M-1 | M-16 | F8 | (A-24) | 0.04 |

*In the tables, "F8" means a repeating unit represented by the following formula:

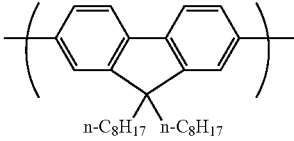

and "—" means that the metal complex or the repeating unit is not present.

Typical examples of the combinations of the above metal complexes and the above organic compounds are described supplementing the above tables. When the metal complex is M-6, M-8, M-14, or M-18, the organic compound is, for example, (A'-1) to (A'-31); when the metal complex is M-10, M-11, or M-12, the organic compound is, for example, (A'-1) to (A'-31); when the metal complex is M-20, the organic compound is, for example, a low-molecular compound of (A'-5) to (A'-12) and (A'-26) to (A'-28), or a polymer compound comprising a divalent group represented by any of (A-5) to (A-12) and (A-26) to (A-28), and a repeating unit (F8) represented by the following formula:

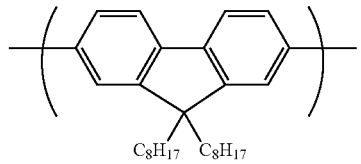

and in the case of the metal complex M-22, the organic compound is, for example, a low-molecular compound of (A'-5) to (A'-12) and (A'-26) to (A'-28), or a polymer compound comprising a divalent group represented by any of (A-5) to (A-12) and (A-26) to (A-28), and the repeating unit F8.

The composition of the present invention may comprise a charge transport material and/or a light-emitting material.

The above charge transport material is classified into a hole transport material and an electron transport material, and includes organic compounds (low-molecular organic compounds and/or polymer organic compounds).

Examples of the above hole transport material include those publicly known as the hole transport materials of organic electroluminescent devices, such as aromatic amines, carbazole derivatives, and polyparaphenylene derivatives. Examples of the above electron transport material include those publicly known as the electron transport materials of organic electroluminescent devices, for example, oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and metal complexes of 8-hydroxyquinoline and derivatives thereof. The low-molecular organic compounds of the above charge transport material mean host compounds and charge injection and transport compounds used in low-molecular organic electroluminescent devices, and specifically include compounds described in "Organic EL Display" (S. Tokito, C. Adachi and H. Murata, Ohmsha, Ltd.), p. 107; Monthly Display (vol. 9, No. 9, 2003, pp. 26-30), JP 2004-244400 A, JP 2004-277377 A, and the like. Although depending on the type of these charge transport materials, generally, in order to obtain good emission from the metal complex, it is preferred that the lowest triplet excitation energy of these charge transport materials is larger than the lowest triplet excitation energy of the metal complex.

Examples of the low-molecular organic compounds of the above charge transport material include the following compounds.

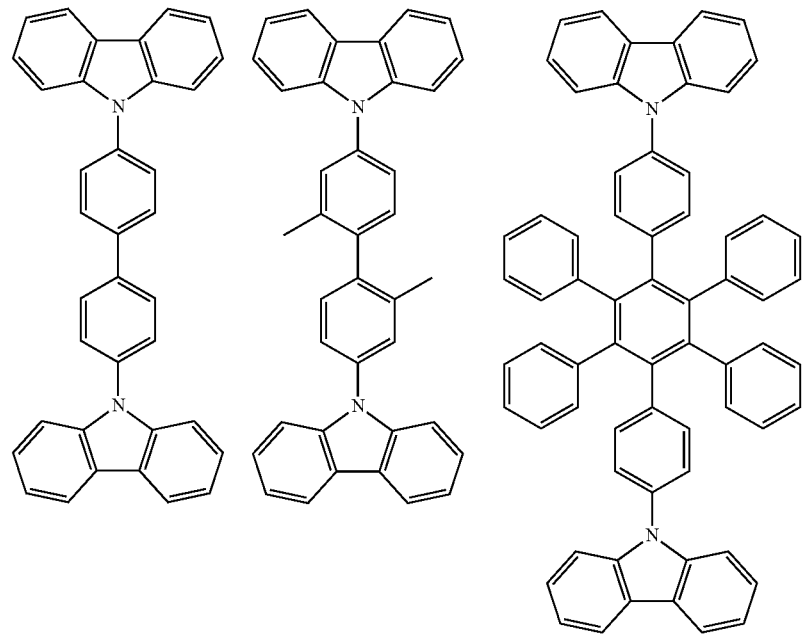

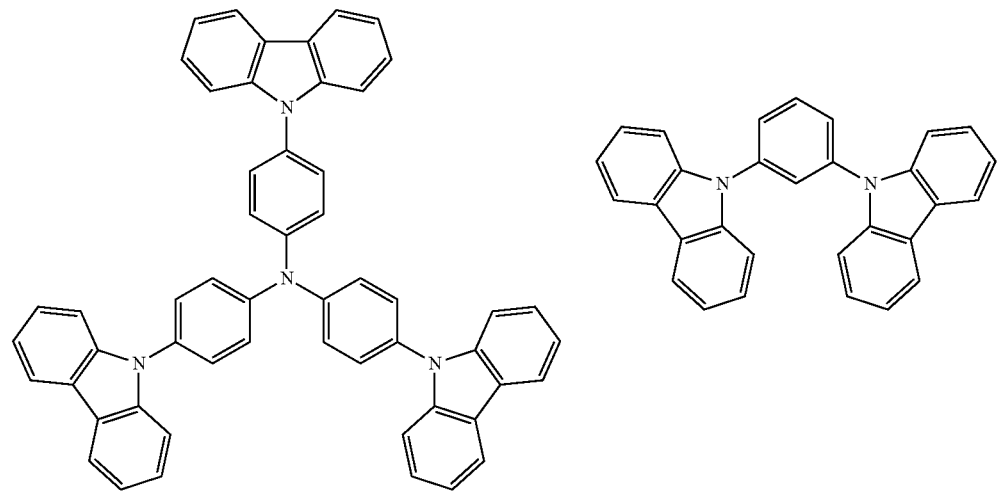

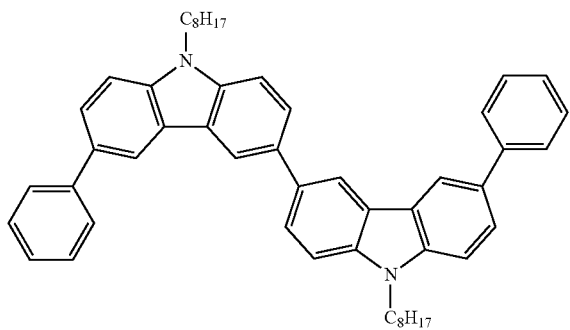
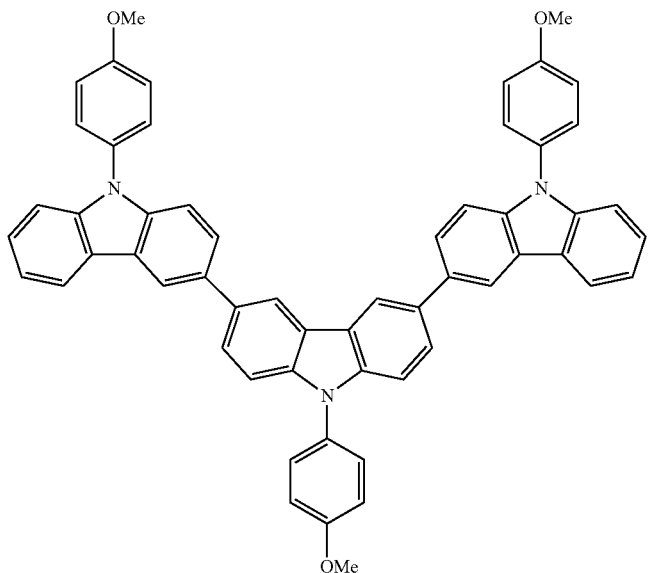
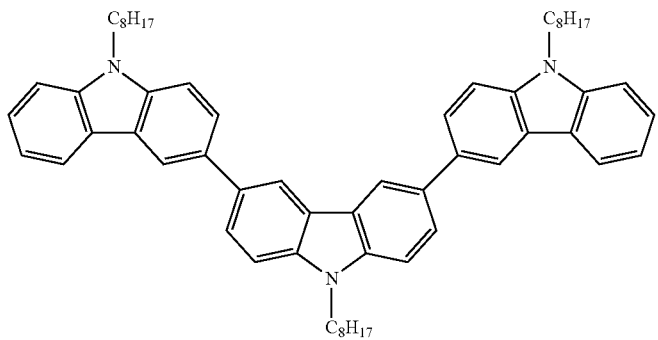
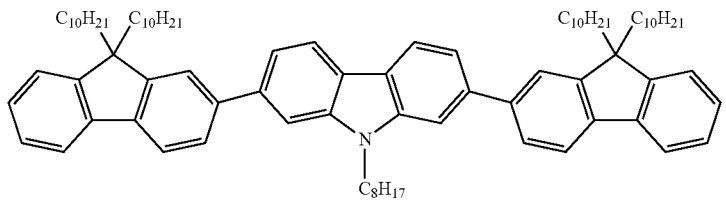

-continued
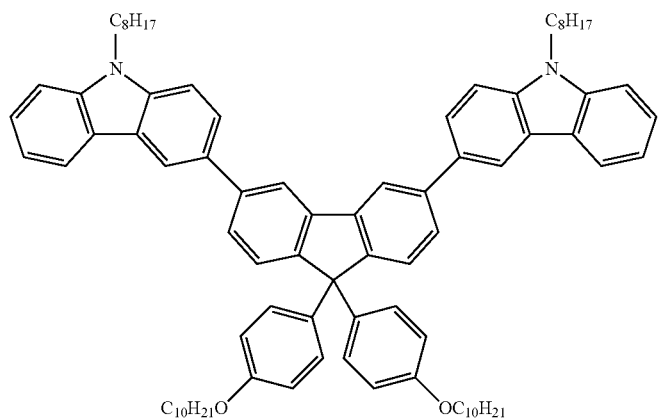
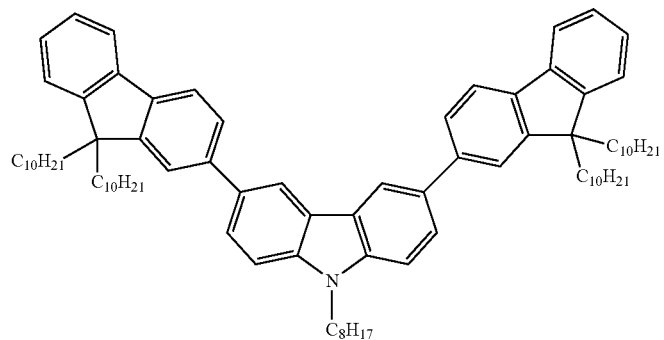
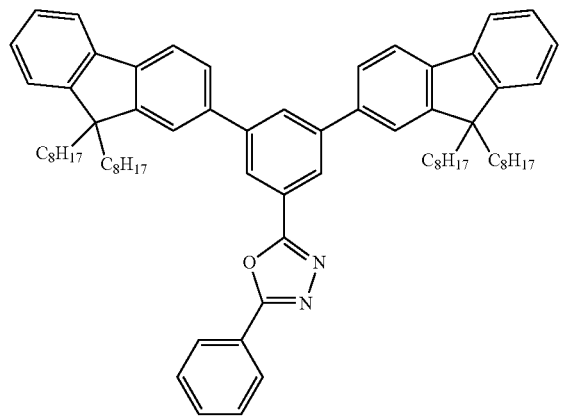
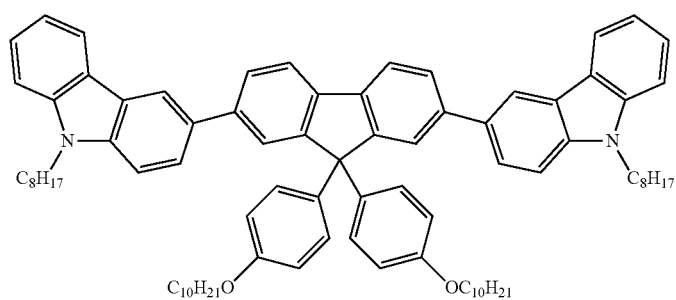

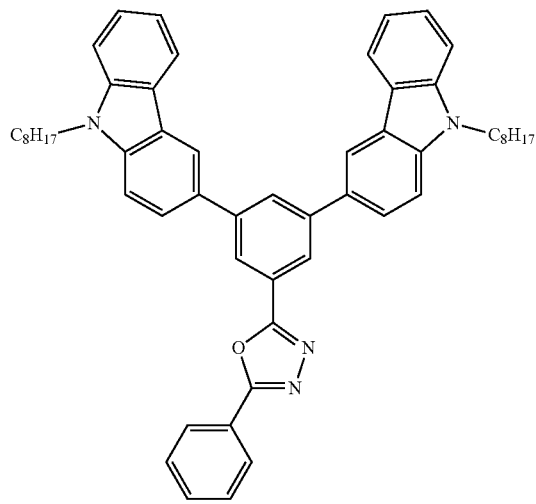
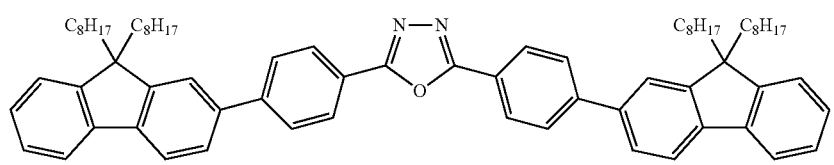
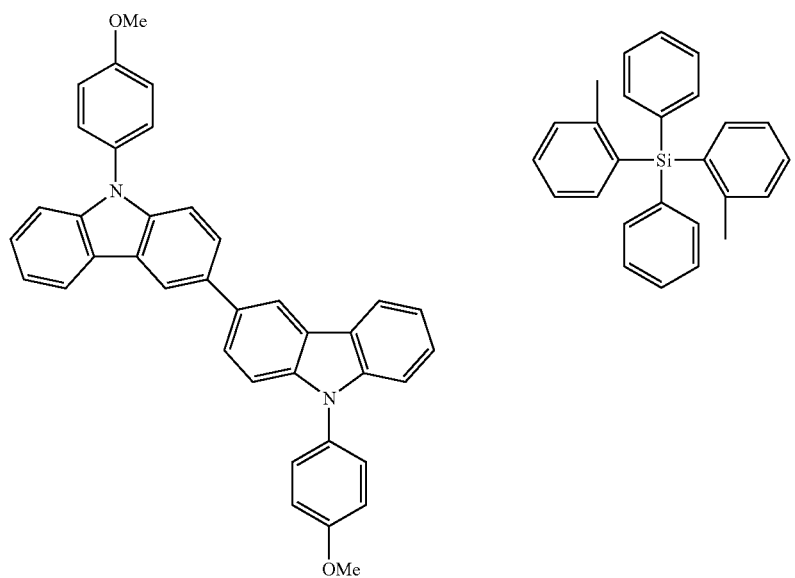
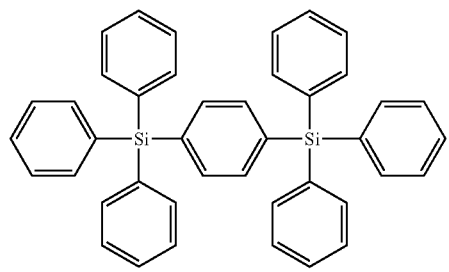

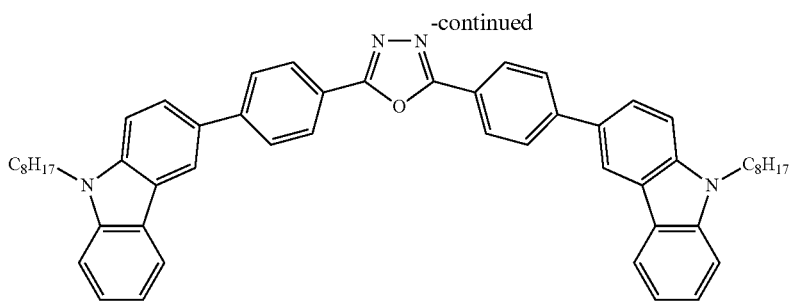

Examples of the polymer organic compounds of the above charge transport material include nonconjugated polymers and conjugated polymers. Examples of the nonconjugated polymers include polyvinylcarbazole. Examples of the conjugated polymers include polymers comprising an aromatic ring in the main chain, for example, those comprising a phenylene group which may have a substituent, fluorene which may have a substituent, dibenzothiophene which may have a substituent, dibenzofuran which may have a substituent, dibenzosilole which may have a substituent, or the like in the main chain as a repeating unit, and copolymers with these units; specifically, polymer compounds characterized by having a benzene ring which may have a substituent as a partial structure; and more specifically, polymers described in JP 2003-231741 A, JP 2004-059899 A, JP 2004-002654 A, JP 2004-292546 A, U.S. Pat. No. 5,708,130, WO99/54385, WO00/46321, WO02/077060, "Organic EL Display" (S. Tokito, C. Adachi and H. Murata, Ohmsha, Ltd.), p. 111; Monthly Display (vol. 9, No. 9, 2002), pp. 47-51, and the like.

Examples of the polymer organic compounds of the above charge transport material include, in addition, polymers comprising a repeating unit represented by the above formula (3a) or (3b), for example, those comprising the following groups (that is, in the following illustration, those without parentheses), and those comprising the following structures as a repeating unit.

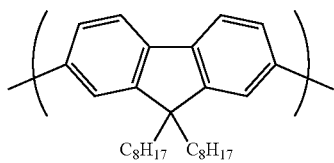

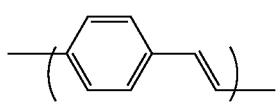

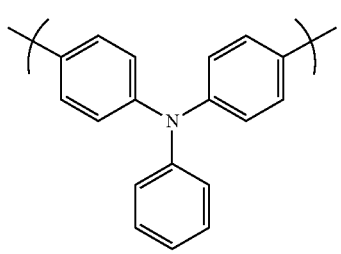

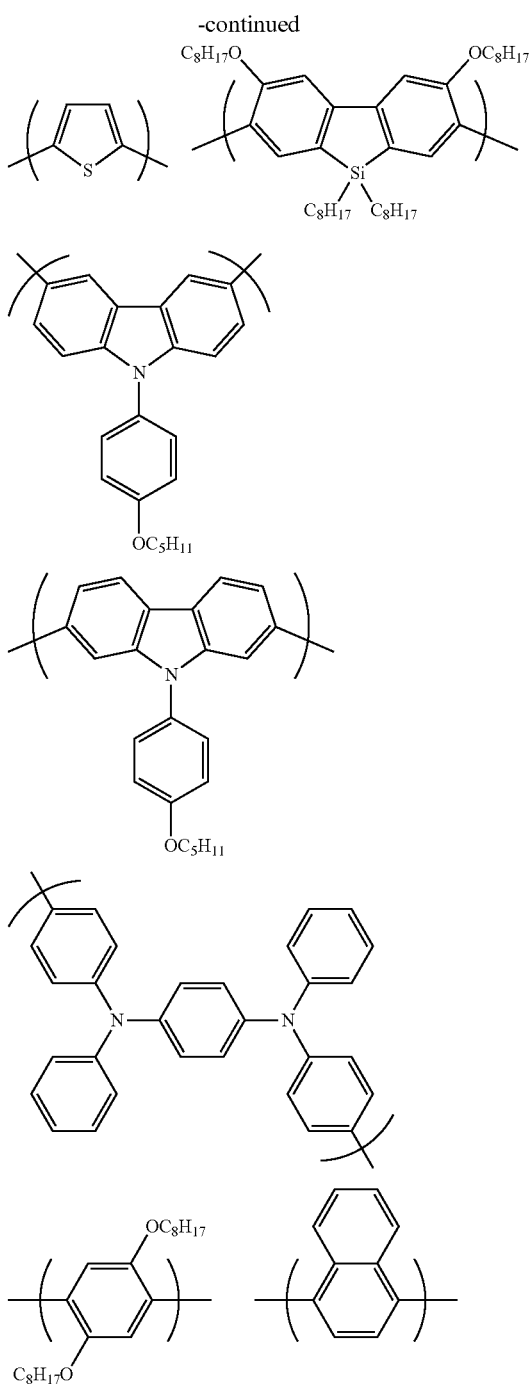

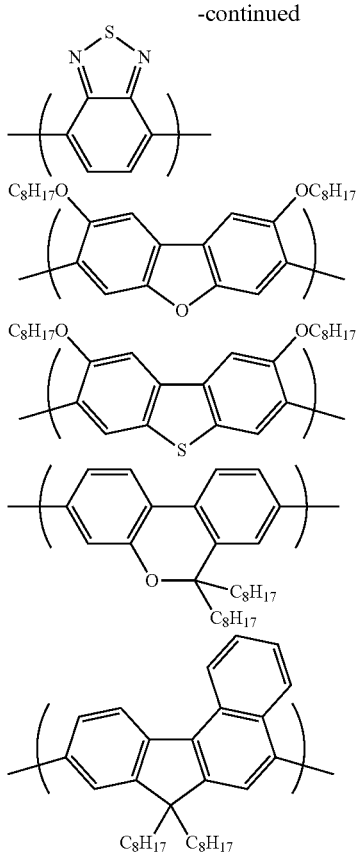

It is preferred that the lowest triplet excitation energy of the low-molecular organic compound or the polymer organic compound of the above charge transport material (TH) and the lowest triplet excitation energy of the metal complex (TM) satisfy the relationship of: TH>TM−0.2 (eV).

When the polymer organic compound of the above charge transport material is used, the polystyrene equivalent number-average molecular weight of the polymer organic compound is preferably $1 \times 10^3$ to $1 \times 10^8$, and further preferably $1 \times 10^4$ to $1 \times 10^6$. In addition, the polystyrene equivalent weight-average molecular weight of the polymer is preferably $1 \times 10^3$ to $1 \times 10^8$, and further preferably $5 \times 10^4$ to $5 \times 10^6$.

As the above light-emitting material, those publicly known can be used, and examples thereof include low-molecular light-emitting materials, such as naphthalene derivatives, anthracene and derivatives thereof, perylene and derivatives thereof, dyes, such as polymethine dyes, xanthene dyes, coumarin dyes, and cyanine dyes, metal complexes of 8-hydroxyquinoline and derivatives thereof, aromatic amines, tetraphenylcyclopentadiene and derivatives thereof, and tetraphenylbutadiene and derivatives thereof.

In the composition of the present invention, the amount of the above metal complex formulated is different according to the type of the organic compound combined and the property desired to be optimized, but is usually 0.05 to 100 parts by weight, and preferably 0.1 to 30 parts by weight, when the amount of the above organic compound is 100 parts by weight.

The composition of the present invention may comprise a solvent or a dispersion medium. As this solvent or dispersion medium, one that uniformly dissolves or disperses the components of the thin film and is stable can be appropriately selected from publicly known solvents and used. Examples of this solvent include chlorine solvents (chloroform, methylene chloride, 1,2-dichloroethane, 1,1,2-trichloroethane, chlorobenzene, o-dichlorobenzene, and the like), ether solvents (tetrahydrofuran, dioxane, and the like), aromatic hydrocarbon solvents (benzene, toluene, xylene, and the like), aliphatic hydrocarbon solvents (cyclohexane, methylcyclohexane, n-pentane, n-hexane, n-heptane, n-octane, n-nonane, n-decane, and the like), ketone solvents (acetone, methyl ethyl ketone, cyclohexanone, and the like), ester solvents (ethyl acetate, butyl acetate, ethyl cellosolve acetate, and the like), polyhydric alcohols and derivatives thereof (ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol, and the like), alcohol solvents (methanol, ethanol, propanol, isopropanol, cyclohexanol, and the like), sulfoxide solvents (dimethyl sulfoxide and the like), and amide solvents (N-methyl-2-pyrrolidone, N,N-dimethylformamide, and the like). These solvents may be used alone or in combination of two or more thereof.

When the composition comprising the above solvent or dispersion medium is applied to an ink jet method, the composition may contain a further additive in order to make the ejection property of the composition and its reproducibility good. Examples of the further additive include high boiling point solvents (anisole, bicyclohexylbenzene, and the like) for suppressing evaporation from the nozzle. The composition comprising the above solvent or dispersion medium preferably has a viscosity of 1 to 100 mPa·s at 25° C.

<Compound>

The compound of the present invention is a compound having a residue of a metal complex represented by the above formula (1), and a residue of an organic compound, wherein the difference between the absolute value of the LUMO energy level of the metal complex and the absolute value of the LUMO energy level of the organic compound as calculated by a computational scientific approach is less than 0.40 eV.

The compound of the present invention is typically a polymer compound, and examples of the polymer compound include:

1. polymer compounds having a residue of a metal complex in the main chain of a polymer organic compound;

2. polymer compounds having a residue of a metal complex at an end of a polymer organic compound; and 3. polymer compounds having a residue of a metal complex in the side chain of a polymer organic compound. The case of having a residue of a metal complex in the main chain also includes, in addition to those in which a metal complex is incorporated in the main chain of a linear polymer, those in which three or more polymer chains are bonded from a metal complex.

Examples of the above organic compound include those comprising a residue of a metal complex having a structure represented by the above formula (1) or the like, having a polystyrene equivalent number-average molecular weight of $1 \times 10^3$ to $1 \times 10^8$, and having the residue of a metal complex having a structure represented by the above formula (1) or the like in their side chain, main chain, or end, or two or more thereof.

The polymer compounds having a residue of a metal complex in the main chain of a polymer organic compound are represented, for example, by either of the following formulas:

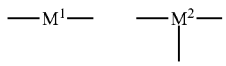

wherein $M^1$ and $M^2$ represent a residue of a metal complex, and a ligand of the metal complex has a bond of the residue; the $M^1$ and $M^2$ are bonded to a repeating unit forming the polymer main chain via the bond; and a solid line represents a molecular chain.

The polymer compounds having a residue of a metal complex at an end of a polymer organic compound are represented, for example, by the following formula:

wherein $M^3$ represents a monovalent residue of a metal complex, and a ligand of the metal complex has the bond of the residue; the $M^3$ is bonded to X via the bond; X represents a single bond, an alkenylene group which may be substituted, an alkynylene group which may be substituted, an arylene group which may be substituted, or a divalent heterocyclic group which may be substituted; and a solid line represents a molecular chain.

The polymer compounds having a residue of a metal complex in the side chain of a polymer organic compound are represented, for example, by the formula: —Ar'—. In the formula, Ar' represents a divalent aromatic group, or a divalent heterocyclic group having one or more atoms selected from the group consisting of an oxygen atom, a silicon atom, a germanium atom, a tin atom, a phosphorus atom, a boron atom, a sulfur atom, a selenium atom, and a tellurium atom, the Ar' has one to four groups represented by -L-X, X represents a monovalent residue of a metal complex, L represents a single bond, —O—, —S—, —C(=O)—, —C(=O)O—, —S(=O)—, —S(=O$_2$)—, —Si($R^{68}$)($R^{69}$)—, N($R^{70}$)—, —B($R^{71}$)—, —P($R^{72}$)—, —P(=O)($R^{73}$)—, an alkylene group which may be substituted, an alkenylene group which may be substituted, an alkynylene group which may be substituted, an arylene group which may be substituted, or a divalent heterocyclic group which may be substituted, and when the alkylene group, the alkenylene group, or the alkynylene group comprises a —CH$_2$— group, one or more —CH$_2$— groups included in the alkylene group, one or more —CH$_2$— groups included in the alkenylene group, or one or more —CH$_2$— groups included in the alkynylene group may each be substituted with a group selected from the group consisting of —O—, —S—, —C(=O)—, —C(=O)O—, —S(=O)—, —S(=O$_2$)—, —Si($R^{74}$)($R^{75}$)—, N($R^{76}$)—, —B($R^{77}$)—, —P($R^{78}$)—, and —P(=O)($R^{79}$)—. $R^{68}$, $R^{69}$, $R^{70}$, $R^{71}$, $R^{72}$, $R^{73}$, $R^{74}$, $R^{75}$, $R^{76}$, $R^{77}$, $R^{78}$, and $R^{79}$ each independently represent a group selected from the group consisting of a hydrogen atom, an alkyl group, an aryl group, a monovalent heterocyclic group, and a cyano group. Ar' may further have a substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, and a cyano group, other than the group represented by -L-X. When Ar' has a plurality of substituents, they may be the same or different.]

In the above formula, the alkyl group, the aryl group, the monovalent heterocyclic group, and the cyano group represented by $R^{68}$, $R^{69}$, $R^{70}$, $R^{71}$, $R^{72}$, $R^{73}$, $R^{74}$, $R^{75}$, $R^{76}$, $R^{77}$, $R^{78}$, and $R^{79}$, and the alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the amino group, the substituted amino group, the silyl group, the substituted silyl group, the halogen atom, the acyl group, the acyloxy group, the imine residue, the amide group, the acid imide group, the monovalent heterocyclic group, the carboxyl group, the substituted carboxyl group, and the cyano group, which are the substituents that Ar' may have, are the same as those described and illustrated as the above substituent represented by R.

Examples of the divalent aromatic group in the above formula include a phenylene group, a pyridinylene group, a pyrimidylene group, and a naphthylene group.

The divalent heterocyclic group in the above formula is the same as those described and illustrated as the above divalent heterocyclic group represented by $Ar^{x1}$ and $Ar^{x2}$.

The compound of the present invention is preferably a conjugated polymer with an excellent carrier (electron or hole) transport property.

In the compound of the present invention, the absolute value of the LUMO energy level of the metal complex and the absolute value of the LUMO energy level of the organic compound are defined as the following (1) to (3).

(1) A Case where the Compound of the Present Invention is a Polymer Compound (Copolymer) Having a Repeating Unit Having a Residue of a Metal Complex The absolute value of the LUMO energy level of the metal complex: the absolute value of the LUMO energy level of a monomer of the repeating unit having the residue of the metal complex.

The absolute value of the LUMO energy level of the organic compound: when trimers are formed for all combinations considered for other repeating units of the polymer compound, and the absolute values of the LUMO energy levels of the trimers are obtained, the absolute value of the LUMO energy level whose absolute value is maximum.

(2) A Case where the Compound of the Present Invention is a Polymer Compound Having a Residue of a Metal Complex at an End The absolute value of the LUMO energy level of the metal complex: the absolute value of the LUMO energy level of a metal complex obtained by replacing a bond in the residue of the metal complex by a hydrogen atom.

The absolute value of the LUMO energy level of the organic compound: when trimers are formed for all combinations considered for the repeating unit of the polymer compound, and the absolute values of the LUMO energy levels of the trimers are obtained, the absolute value of the LUMO energy level whose absolute value is maximum.

(3) A Case where the Compound of the Present Invention is Other than the Above (1) and (2)

The absolute value of the LUMO energy level of the metal complex: the absolute value of the LUMO energy level of a metal complex obtained by replacing a bond in the residue of the metal complex by a hydrogen atom.

The absolute value of the LUMO energy level of the organic compound: the absolute value of the LUMO energy level of an organic compound obtained by replacing a bond in a moiety in the compound other than the residue of the metal complex by a hydrogen atom.

<Device>

The device of the present invention is formed using the composition of the present invention, and is, for example, a device having electrodes comprising an anode and a cathode, and a layer provided between the electrodes and comprising the above metal complex and the above organic compound. In addition, it is also possible to form a film using the composition of the present invention and fabricate the device of the present invention using this film. As a typical one thereof, a case where the device of the present invention is a light-emitting device will be described below.

The light-emitting device of the present invention comprises a pair of electrodes comprising an anode and a cathode, and a thin film comprising one layer (single-layer type) or a plurality of layers (multilayer type) having at least a light-emitting layer held between the electrodes. At least one layer of the thin film layer is formed using the composition of the present invention. The total content of the above metal complex and the above organic compound in the above thin film is usually 0.1 to 100% by weight, preferably 0.1 to 30% by weight, more preferably 0.5 to 15% by weight, and particularly preferably 1 to 10% by weight, with respect to the weight of the entire light-emitting layer.

When the light-emitting device of the present invention is the above single-layer type, the above thin film is a light-emitting layer, and this light-emitting layer contains the above metal complex. In addition, when the light-emitting device of the present invention is the multilayer type, for example, the following layer configurations are used.

(a) anode/hole injection layer (hole transport layer)/light-emitting layer/cathode
(b) anode/light-emitting layer/electron injection layer (electron transport layer)/cathode
(c) anode/hole injection layer (hole transport layer)/light-emitting layer/electron injection layer (electron transport layer)/cathode The anode of the light-emitting device of the present invention supplies holes to the hole injection layer, the hole transport layer, the light-emitting layer, or the like, and it is effective that the anode has a work function of 4.5 eV or more. Metals, alloys, metal oxides, electrically conductive compounds, mixtures thereof, and the like can be used for the material of the anode. Specific examples thereof include conductive metal oxides, such as tin oxide, zinc oxide, indium oxide, and indium tin oxide (ITO), metals, such as gold, silver, chromium, and nickel, further, mixtures or laminates of these conductive metal oxides and metals, inorganic conductive substances, such as copper iodide and copper sulfide, organic conductive materials, such as polyanilines, polythiophenes (PEDOT and the like), and polypyrrole, and laminates of these and ITO.

The cathode of the light-emitting device of the present invention supplies electrons to the electron injection layer, the electron transport layer, the light-emitting layer, or the like. A metal, an alloy, a metal halide, a metal oxide, an electrically conductive compound, or a mixture thereof can be used as the material of the cathode. Examples of the material of the cathode include alkali metals (lithium, sodium, potassium, and the like) and fluorides and oxides thereof, alkaline earth metals (magnesium, calcium, barium, cesium, and the like) and fluorides and oxides thereof, gold, silver, lead, aluminum, alloys and mixed metals (a sodium-potassium alloy, a sodium-potassium mixed metal, a lithium-aluminum alloy, a lithium-aluminum mixed metal, a magnesium-silver alloy, a magnesium-silver mixed metal, and the like), and rare-earth metals (indium, ytterbium, and the like).

The hole injection layer and the hole transport layer of the light-emitting device of the present invention need only have any of the function of injecting holes from the anode, the function of transporting holes, and the function of blocking electrons injected from the cathode. Examples of the material of these layers include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, porphyrin compounds, polysilane compounds, poly(N-vinylcarbazole) derivatives, and organic silane derivatives, and polymers comprising these, and include, in addition, conductive polymer oligomers, such as aniline copolymers, thiophene oligomers, and polythiophene. These materials may be of one component alone, or a plurality of components may be used in combination. In addition, the above hole injection layer and the above hole transport layer may be a single-layer structure comprising one or two or more of the above materials, or may be a multilayer structure comprising a plurality of layers of the same composition or different compositions.

The electron injection layer and the electron transport layer of the light-emitting device of the present invention need only have any of the function of injecting electrons from the cathode, the function of transporting electrons, and the function of blocking holes injected from the anode. Examples of the material of these layers include triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, aromatic ring tetracarboxylic anhydrides, such as naphthalene and perylene, phthalocyanine derivatives, various metal complexes typified by metal complexes of 8-quinolinol derivatives, and metal complexes comprising metal phthalocyanine, benzoxazole, or benzothiazole as a ligand, and organic silane derivatives. In addition, the above electron injection layer and the above electron transport layer may be a single-layer structure comprising one or two or more of the above materials, or may be a multilayer structure comprising a plurality of layers of the same composition or different compositions.

In addition, in the light-emitting device of the present invention, inorganic compounds that are insulators or semiconductors can also be used as the material of the electron injection layer and the electron transport layer. When the electron injection layer and the electron transport layer are composed of an insulator or a semiconductor, it is possible to effectively prevent a current leak to improve an electron injection property. At least one metal compound selected from the group consisting of alkali metal chalcogenides, alkaline-earth metal chalcogenides, alkali metal halides, and alkaline-earth metal halides can be used as such an insulator. Preferred examples of the alkali metal chalcogenides include CaO, BaO, SrO, BeO, BaS, and CaSe. In addition, examples of the semiconductor constituting the electron injection layer and the electron transport layer include oxides, nitrides, or oxynitrides comprising at least one element selected from the group consisting of Ba, Ca, Sr, Yb, Al, Ga, In, Li, Na, Cd, Mg, Si, Ta, Sb, and Zn. These oxides, nitrides, and oxynitrides may be used alone or in combination of two or more thereof.

A reducing dopant may be added to the interface region between the cathode and the thin film in contact with the cathode. At least one compound selected from the group consisting of alkali metals, alkaline-earth metal oxides, alkaline-earth metals, rare-earth metals, alkali metal oxides, alkali metal halides, alkaline-earth metal oxides, alkaline-earth metal halides, rare-earth metal oxides, rare-earth metal halides, alkali metal complexes, alkaline-earth metal complexes, and rare-earth metal complexes are preferred as the reducing dopant.

The light-emitting layer of the light-emitting device of the present invention has the function of being able to inject holes from the anode or the hole injection layer and inject electrons from the cathode or the electron injection layer during voltage application, the function of moving the injected charges (electrons and holes) by the force of the electric field, and the function of providing a place for the recombination of the electrons and the holes, leading to emission. The light-emitting layer of the light-emitting device of the present invention preferably contains at least the above metal complex and the above organic compound and may contain a host material with the above metal complex and the above organic compound as guest materials. Examples of the above host material include those having a fluorene skeleton, those having a carbazole skeleton, those having a diarylamine skeleton, those having a pyridine skeleton, those having a pyrazine skeleton, those having a triazine skeleton, and those having an arylsilane skeleton. The T1 (lowest triplet excited state energy level) of the above host material is preferably larger than that of the guest materials, and further preferably, their difference is larger than 0.2 eV. The above host material may be a low-molecular compound or a polymer compound. In addition, by mixing the above host material and the light-emitting material, such as the above metal complex, and applying the mixture, or performing the codeposition or the like of them, a light-emitting layer in which the above host material is doped with the above light-emitting material can be formed.

In the light-emitting device of the present invention, examples of a method for forming the above layers include vacuum deposition methods (a resistance heating deposition method, an electron beam method, and the like), a sputtering method, an LB methods, a molecular lamination method, application methods (a casting method, a spin coating method, a bar coating method, a blade coating method, a roll coating method, gravure printing, screen printing, an ink jet method, and the like). It is preferred that film formation is performed by application, among these, in that the manufacturing process can be simplified. In the above application method, the layer can be formed by dissolving the above metal complex and the above organic compound in a solvent to prepare an application liquid, and applying and drying the application liquid on the desired layer (or electrode). The host material and/or a resin as a binder may be contained in the application liquid, and the resin can be in a state dissolved or dispersed in the solvent. A nonconjugated polymer (for example, polyvinylcarbazole) or a conjugated polymer (for example, a polyolefin polymer) can be used as the above resin. More specifically, the above resin can be selected, for example, from polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethylcellulose, vinyl acetate, ABS resins, polyurethane, melamine resins, unsaturated polyester resins, alkyd resins, epoxy resins, silicon resins, and the like according to the purpose. The solution may contain an antioxidant, a viscosity-adjusting agent, and the like as optional components according to the purpose.

The preferred film thickness of each layer of the light-emitting device of the present invention is different according to the type of the material and the layer configuration, but is usually preferably several nm to 1 µm because generally, if the film thickness is too thin, defects, such as pinholes, occur easily, and on the contrary, if the film thickness is too thick, high applied voltage is necessary and the luminous efficiency worsens.

Examples of the uses of the light-emitting device of the present invention include surface light sources, lights, light sources, light sources for signs, light sources for backlight, display apparatuses, and printer heads. For the above display apparatuses, publicly known drive techniques, drive circuits, and the like can be used, and configurations, such as a segment type and a dot matrix type, can be selected.

EXAMPLES

Examples are shown below to describe the present invention in more detail, but the present invention is not limited to these.

Synthesis Example 1

Synthesis of Metal Complex (MC-1)

Synthesis of 5-bromo-2-phenylpyridine 2,5-dibromopyridine (7.11 g, 30 mmol), toluene (130 mL), phenylboric acid (4.57 g, 37.5 mmol), and tetrakis(triphenylphosphine)palladium(0) (1.73 g, 1.5 mmol) were weighed into a reaction container, and the reactants were dissolved, while being stirred at 50° C. under a nitrogen gas flow. A 2 M aqueous sodium carbonate solution (30 mL) was added to the solution, and the mixture was stirred at 80° C. for 6 hours. The organic layer of the obtained reaction solution was recovered, and washed with an aqueous sodium carbonate solution and a saturated saline solution. The organic layer was dried with sodium sulfate, filtered, and then distilled off. The residue was purified by silica gel column chromatography (hexane/toluene), and the solvent was distilled off to obtain 5-bromo-2-phenylpyridine (6.21 g, 26.5 mmol).

Synthesis of Metal Complexes (Complexes 1 and 2)

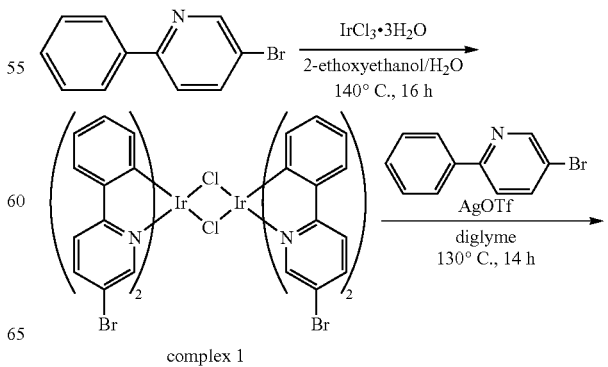

complex 1

-continued

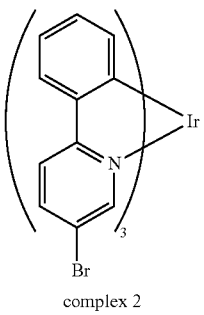
complex 2

5-bromo-2-phenylpyridine (7.39 g, 30 mmol), iridium chloride trihydrate (4.76 g, 13.5 mmol), 2-ethoxyethanol (58 mL), and water (19 mL) were weighed into a reaction container, and heated at 140° C. under a nitrogen gas flow for 16 hours. After air cooling, the obtained reaction mixture was filtered off, and washed with water, methanol, and hexane in this order to obtain a metal complex represented by the above formula (complex 1, 9.10 g, 6.58 mmol) as a yellow solid.

The metal complex (complex 1, 6.94 g, 5.0 mmol), 5-bromo-2-phenylpyridine (7.32 g, 30.0 mmol), and diglyme (43 mL) were weighed into a reaction container, and silver trifluoromethanesulfonate (2.57 g, 10.0 mmol) was added. The mixture was stirred at 130° C. for 14 hours. The obtained reactant was filtered, and the solid was dissolved in methylene chloride (1.3 L). This solution was filtered off, and the filtrate was concentrated to about 150 mL. The precipitated solid was recovered by filtration and washed with hexane to obtain a metal complex represented by the above formula (complex 2, 6.35 g, 7.1 mmol).

LC-MS (positive) m/z: 890 ([M+H]$^+$)

$^1$H NMR (300 MHz, DMSO-d$_6$)

δ 6.51 (d, J=7.8 Hz, 3H), δ 6.72 (m, 3H), δ 6.84 (m, 3H), δ7.66 (d, J=2.0 Hz, 3H), δ 7.80 (d, J=7.8 Hz, 3H), δ 8.05 (dd, J=2.0, 8.8 Hz, 3H), δ8.14 (d, J=8.8 Hz, 3H)

Synthesis of Metal Complex (Complex 3)

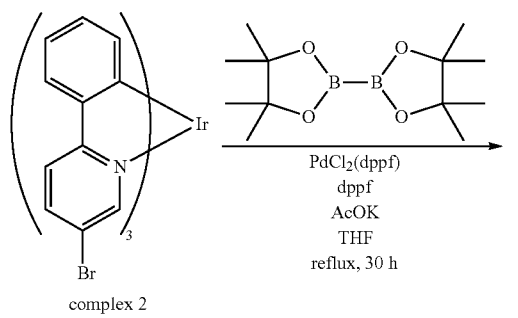

Under a nitrogen gas flow, the metal complex (complex 2, 3.27 g, 3.7 mmol), potassium acetate (3.27 g, 33.3 mmol), bis(pinacolato)diboron (3.38 g, 13.3 mmol), 1,1'-bis(diphenylphosphino)ferrocene (245 mg, 0.44 mmol), [1,1'-bis(diphenylphosphino)ferrocene]dichloropalladium(II) (361 mg, 0.44 mmol), and tetrahydrofuran (400 mL) were weighed into a reaction container, and refluxed for 30 hours. The obtained reaction solution was concentrated, and dissolved by adding methylene chloride (150 mL). Then, the solution was filtered. The filtrate was purified by silica gel chromatography (methylene chloride). The solvent was distilled off, and the residue was washed with diethyl ether to obtain a metal complex represented by the above formula (complex 3, 2.55 g, 2.47 mmol).

LC-MS (positive) m/z: 1072 ([M+K]$^+$)

$^1$H NMR (300 MHz, CDCl$_3$)

δ 1.21 (s, 36H), δ 6.87 (m, 9H), δ 7.69 (d, J=7.7 Hz, 3H), δ7.82 (s, 3H), δ 7.86 (m, 6H)

Synthesis of 2,4-di(4'-tert-butylphenyl)-6-chloro-1,3,5-triazine

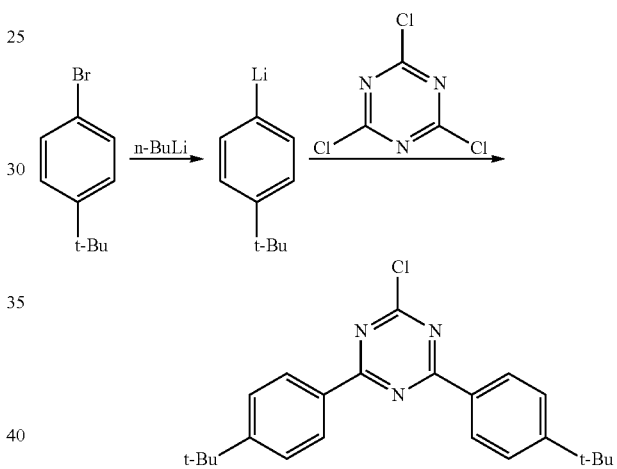

Under an argon gas flow, a reaction container was charged with 1-bromo-4-tert-butylbenzene (125 g, 587 mmol) and tetrahydrofuran (470 mL) and cooled to −70° C. An n-butyllithium/hexane solution (1.6 M, 367 mL, 587 mmol) was dropped into the mixture at −70° C. over 90 minutes, and after the completion of the dropping, the mixture was stirred at −70° C. for 2 hours to obtain a 4-tert-butylphenyllithium/THF solution. Under an argon gas flow, another reaction container was charged with cyanuric chloride (50.8 g, 276 mmol) and tetrahydrofuran (463 mL) and cooled to −70° C. The 4-tert-butylphenyllithium/THF solution previously prepared was slowly dropped into the mixture, with cooling so that the reaction temperature was −60° C. or less. After the completion of the dropping, the reaction solution was stirred at −40° C. for 4 hours and at room temperature for 4 hours. Water (50 mL) was added to this reaction mixture to complete the reaction, and the tetrahydrofuran was distilled off. Water (1 L) and chloroform (2 L) were added to the residue to extract the organic layer. Further, the organic layer was washed with water (1 L), and then, the solvent was distilled off. The residue was dissolved in acetonitrile (600 mL), and the insoluble solid was removed by hot filtration. The obtained filtrate was concentrated to about 100 mL and cooled to −70° C. The precipitated solid was recovered by filtration. The recovered solid was dissolved in a chloroform (200 mL)/hexane (600 mL) mixed solvent and purified by silica gel column chromatography (developing solvent: chloroform/hexane). The solvent was distilled off, and the residue was recrystallized from acetonitrile to obtain 2,4-di(4'-tert-butylphenyl)-6-chloro-1,3,5-triazine (41.3 g, 109 mmol).

LC-MS (APPI, positive) m/z: 380 ([M+H]$^+$)

$^1$H NMR (300 MHz, CDCl$_3$)

δ 1.39 (s, 18H), δ 7.56 (d, J=8.4 Hz, 4H), δ 8.54 (d, J=8.4 Hz, 4H)

Synthesis of Metal Complex (MC-1)

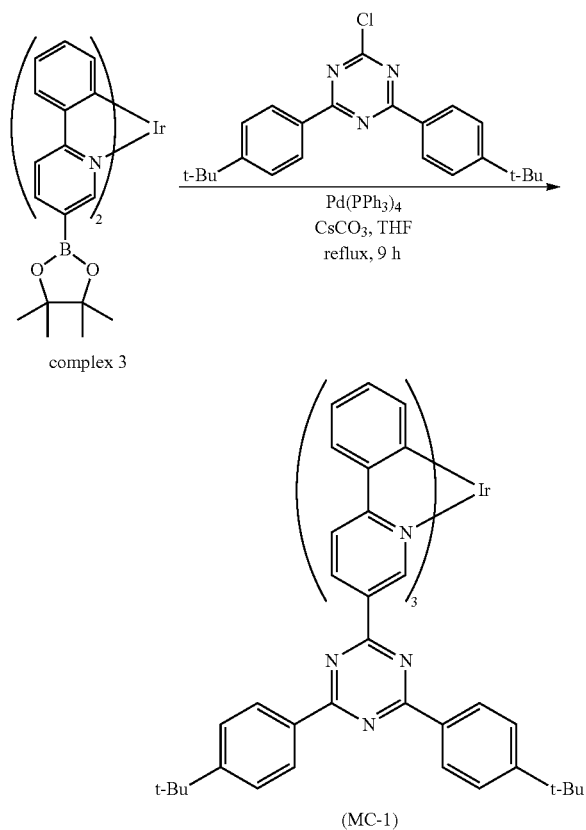

complex 3

(MC-1)

Under a nitrogen gas flow, the metal complex (complex 3, 546 mg, 0.53 mmol), 2,4-di(4'-tert-butylphenyl)-6-chloro-1,3,5-triazine (702 mg, 1.85 mmol), cesium carbonate (1.73 g, 5.31 mmol), tetrakis(triphenylphosphine)palladium(0) (196 mg, 0.17 mmol), and tetrahydrofuran (53 mL) were weighed into a reaction container, and refluxed for 9 hours. The obtained reaction solution was concentrated, and toluene was added to the concentrate to dissolve it. The solution was filtered, and the filtrate was purified twice by silica gel chromatography (first time, developing solvent: toluene, second time, developing solvent: hexane/toluene=1/1). The solvent was distilled off, and the residue was washed with methanol to obtain a metal complex represented by the above formula (MC-5, 257 mg, 0.15 mmol).

LC-MS (APCI, positive) m/z: 1686 ([M+H]$^+$)

$^1$H NMR (300 MHz, CDCl$_3$)

δ 1.20 (s, 54H), δ 6.96 (m, 9H), δ 7.39 (d, J=8.4 Hz, 12H), 67.83 (d, J=7.5 Hz, 3H), δ 8.18 (d, J=8.4 Hz, 3H), δ 8.36 (d, J=8.4 Hz, 12H), δ 9.14 (d, J=8.4 Hz, 3H), δ 9.33 (s, 3H)

[Analysis Conditions 1]

A polymer compound (polymer) to be measured was dissolved in tetrahydrofuran at a concentration of about 0.05% by weight, and 50 μL of the solution was injected into an SEC. Tetrahydrofuran was used as the mobile phase of the SEC and flowed at a flow velocity of 0.6 mL/min. As the columns, two TSKgel SuperHM-H (manufactured by Tosoh Corporation) and one TSKgel SuperH2000 (manufactured by Tosoh Corporation) were connected in series and used. For the detector, a differential refractive index detector (trade name: RID-10A, manufactured by SHIMADZU CORPORATION) was used.

[Analysis Conditions 2]

A polymer compound (polymer) to be measured was dissolved in tetrahydrofuran at a concentration of about 0.05% by weight, and 10 μL of the solution was injected into an SEC. Tetrahydrofuran was used as the mobile phase of the SEC and flowed at a flow velocity of 2.0 mL/min. PLgel MIXED-B (manufactured by Polymer Laboratories) was used as the column. For the detector, an UV-VIS detector (SPD-10Avp, manufactured by SHIMADZU CORPORATION) was used.

The measurement of LC-MS was performed by the following method. A measurement sample was dissolved in chloroform or tetrahydrofuran at a concentration of about 2 mg/mL, and about 1 μL of the solution was injected into an LC-MS (trade name: 1100LCMSD, manufactured by Agilent Technologies). For the mobile layer of the LC-MS, ion-exchange water to which about 0.1% by weight of acetic acid was added, and acetonitrile to which about 0.1% by weight of acetic acid was added were used, with the ratio changed, and flowed at a flow rate of 0.2 mL/min. For the column, L-column 2 ODS (3 nm)(manufactured by Chemicals Evaluation and Research Institute, Japan, inner diameter: 2.1 mm, length: 100 mm, particle diameter: 3 nm) was used.

The measurement of NMR was performed by the following method. 5 to 10 mg of a measurement sample was dissolved in about 0.5 mL of deuterated chloroform or deuterated dimethyl sulfoxide, and the measurement was performed using NMR (trade name: MERCURY 300, manufactured by Varian, Inc.).

Synthesis Example 2

Synthesis of Polymer 1

2.65 g (5.0 mmol) of 9,9-dioctylfluorene-2,7-ethylene glycol diborate ester, 1.98 g (purity: 96.9%, 3.5 mmol) of 9,9-dioctyl-2,7-dibromofluorene, 0.53 g (1.0 mmol) of 2,4-bis(4-bromophenyl)-6-(4-n-butylphenyl)-1,3,5-triazine, 0.37 g (0.5 mmol) of N,N'-bis(4-bromophenyl)-N,N'-bis(2,6-dimethyl-4-tert-butylphenyl)-1,4-phenylenediamine, 0.65 g of methyltrioctylammonium chloride (trade name: Aliquat336, manufactured by Aldrich), and 50 mL of toluene were added to a 200 mL separable flask. Under a nitrogen atmosphere, 3.5 mg of bistriphenylphosphinepalladium dichloride was added thereto, and the mixture was heated to 95° C. The obtained solution was heated to 105° C., while 13.5 mL of a 17.5 weight % aqueous sodium carbonate solution was dropped into the obtained solution, and then, the mixture was stirred for 3 hours. Next, 0.61 g of phenylboric acid, 3.5 mg of bistriphenylphosphinepalladium dichloride, and 50 mL of toluene were added thereto, and the mixture was stirred at 105° C. for 16 hours.

The aqueous phase was removed from the obtained solution, and then, 3.04 g of sodium N,N-diethyldithiocarbamate trihydrate and 30 mL of ion-exchange water were added thereto, and the mixture was stirred at 85° C. for 2 hours. The organic phase was separated from the aqueous phase, and then, the organic phase was washed with 65 mL of ion-exchange water (twice), 65 mL of a 3 weight % aqueous acetic acid solution (twice), and 65 mL of ion-exchange water (twice) in this order.

When the organic phase was dropped into 800 mL of methanol, a precipitate formed. Therefore, this precipitate was filtered and dried to obtain a solid. This solid was dissolved in 300 mL of toluene, and the solution was passed through a silica gel/alumina column through which toluene was previously passed. When the passed eluate was dropped into 1500 mL of methanol, a precipitate formed. Therefore, this precipitate was filtered and dried to obtain 3.48 g of a polymer (hereinafter referred to as a "polymer 1"). The polystyrene equivalent number-average molecular weight Mn of the polymer 1 measured under the analysis conditions 1 was $1.4 \times 10^5$, and the polystyrene equivalent weight-average molecular weight Mw was $3.7 \times 10^5$.

Synthesis Example 3

Synthesis of Polymer 2

3.18 g (6.0 mmol) of 9,9-dioctylfluorene-2,7-ethylene glycol diborate ester, 3.06 g (5.4 mmol) of 9,9-dioctyl-2,7-dibromofluorene, 0.44 g (0.6 mmol) of N,N'-bis(4-bromophenyl)-N,N'-bis(2,6-dimethyl-4-tert-butylphenyl)-1,4-phenylenediamine, 0.82 g of methyltrioctylammonium chloride (trade name: Aliquat336, manufactured by Aldrich), and 60 mL of toluene were added to a 200 mL separable flask. Under a nitrogen atmosphere, 4.2 mg of bistriphenylphosphinepalladium dichloride was added thereto, and the mixture was heated to 85° C. The obtained solution was heated to 105° C., while 16.3 mL of a 17.5 weight % aqueous sodium carbonate solution was dropped into the obtained solution, and then, the mixture was stirred for 1.5 hours. Next, 0.74 g of phenylboric acid, 4.2 mg of bistriphenylphosphinepalladium dichloride, and 30 mL of toluene were added, and the mixture was stirred at 105° C. for 17 hours.

The aqueous phase was removed from the obtained solution, and then, 3.65 g of sodium N,N-diethyldithiocarbamate trihydrate and 36 mL of ion-exchange water were added thereto, and the mixture was stirred at 85° C. for 2 hours. The organic phase was separated from the aqueous phase, and then, the organic phase was washed with 80 mL of ion-exchange water (twice), 80 mL of a 3 weight % aqueous acetic acid solution (twice), and 80 mL of ion-exchange water (twice) in this order.

When the organic phase was dropped into 930 mL of methanol, a precipitate formed. Therefore, this precipitate was filtered and dried to obtain a solid. This solid was dissolved in 190 mL of toluene, and the solution was passed through a silica gel/alumina column through which toluene was previously passed. When the passed eluate was dropped into 930 mL of methanol, a precipitate formed. Therefore, this precipitate was filtered and then dried to obtain 4.17 g of a polymer (hereinafter referred to as a "polymer 2"). The polystyrene equivalent number-average molecular weight Mn of the polymer 2 measured under the analysis conditions 1 was $2.7 \times 10^5$, and the polystyrene equivalent weight-average molecular weight Mw was $7.1 \times 10^5$.

Synthesis Example 4

Synthesis of Polymer C

Hole Transport Polymer Compound 5.25 g (9.9 mmol) of a compound A represented by the following formula:

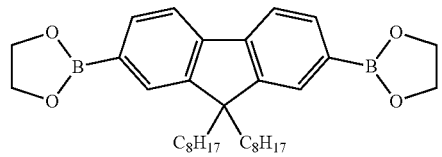

4.55 g (9.9 mmol) of a compound B represented by the following formula:

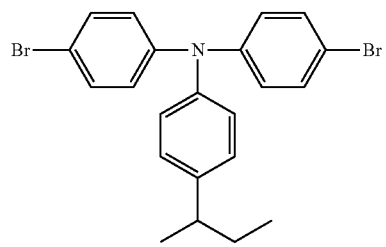 [SMILES: CCC(C)c1ccc(N(c2ccc(Br)cc2)c2ccc(Br)cc2)cc1]

0.91 g of methyltrioctylammonium chloride (trade name: Aliquat336, manufactured by Aldrich), and 69 ml of toluene were added to a flask, to which Dimroth was connected, to obtain a monomer solution. Under a nitrogen atmosphere, the monomer solution was heated, and 2 mg of palladium acetate and 15 mg of tris(2-methylphenyl)phosphine were added at 80° C. 9.8 g of a 17.5 weight % aqueous sodium carbonate solution was injected into the obtained monomer solution, and then, the mixture was stirred at 110° C. for 19 hours. Next, 121 mg of phenylboric acid dissolved in 1.6 ml of toluene was added thereto, and the mixture was stirred at 105° C. for 1 hour.

The organic phase was separated from the aqueous phase, and then, 300 ml of toluene was added to the organic phase. The organic phase was washed with 40 ml of a 3 weight % aqueous acetic acid solution (twice) and 100 ml of ion-exchange water (once) in this order, and separated from the aqueous phase. 0.44 g of sodium N,N-diethyldithiocarbamate trihydrate and 12 ml of toluene were added to the organic phase, and the mixture was stirred at 65° C. for 4 hours.

The obtained toluene solution of the reaction product was passed through a silica gel/alumina column through which toluene was previously passed. When the obtained solution was dropped into 1400 ml of methanol, a precipitate formed. Therefore, this precipitate was filtered and dried to obtain a solid. This solid was dissolved in 400 ml of toluene. When the solution was dropped into 1400 ml of methanol, a precipitate formed. Therefore, this precipitate was filtered and dried to obtain 6.33 g of a polymer (hereinafter referred to as a "polymer C"). The polystyrene equivalent number-average molecular weight Mn of the polymer C measured under the analysis conditions 1 was $8.8 \times 10^4$, and the polystyrene equivalent weight-average molecular weight Mw was $3.2 \times 10^5$.

It is presumed that the polymer C has repeating units represented by the following formulas:

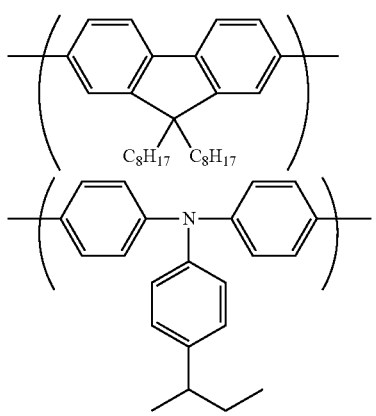

from the charged raw materials at 1:1 (molar ratio).

Synthesis Example 5

Synthesis of Polymer 3

Under an inert atmosphere, F8-diboric acid (2387 mg, 4.50 mmol), F8-diBr (1505 mg, 2.70 mmol), and F5 (dipentylfluorene)-diBr (836 mg, 1.80 mmol) were dissolved in toluene (50 ml), and the temperature was increased to 45° C. Then, palladium acetate (3 mg, 0.0135 mmol) and tris o-methoxyphenylphosphine (19 mg, 0.054 mmol) were added, and the mixture was stirred for 5 minutes. Then, a 32.78 weight % aqueous bistetraethylammonium carbonate solution (20.2 ml) was added, and the temperature was increased. The mixture was heated and refluxed for about 4 hours. Then, t-butylphenylboronic acid (401 mg) was added thereto, and the mixture was heated and refluxed overnight. The obtained reaction liquid was cooled to 65° C. Then, a 5 weight % aqueous sodium diethyldithiocarbamate solution (50 ml) was added, and the mixture was stirred for 4 hours. The aqueous layer was separated. Again, a 5 weight % aqueous sodium diethyldithiocarbamate solution (50 ml) was added to the reaction liquid, and the mixture was stirred for 4 hours. The aqueous layer was separated. Then, the organic layer was cooled to room temperature, and washed twice with 2N hydrochloric acid water (100 ml), twice with a 10 weight % aqueous sodium acetate solution (100 ml), and six times with water (100 ml) for separation. The obtained organic layer was passed through a filter loaded with cerite (100 g). Then, the filter was washed with toluene (2500 ml), and the toluene solution was recovered. The toluene solution was concentrated to a total amount of 200 ml. Then, when the toluene solution was dropped into methanol (2000 ml), a precipitate precipitated. Therefore, the precipitate was filtered off. This precipitate was dissolved in toluene (200 ml) again. Then, when the obtained toluene solution was dropped into methanol (2000 ml), a precipitate precipitated. Therefore, the precipitate was filtered off. Further, this precipitate was dissolved in toluene (200 ml). Then, when the obtained toluene solution was dropped into methanol (2000 ml), a precipitate precipitated. Therefore, the precipitate was filtered off. The obtained precipitate was dried under reduced pressure to obtain 2.55 g of a polymer (hereinafter referred to as a "polymer 3"). The polystyrene equivalent weight-average molecular weight Mw of the polymer 3 measured under the analysis conditions 1 was $4.8 \times 10^5$, and the polystyrene equivalent number-average molecular weight Mn was $1.8 \times 10^5$.

The polymer 3 is presumed to be a polymer having repeating units represented by the following formulas:

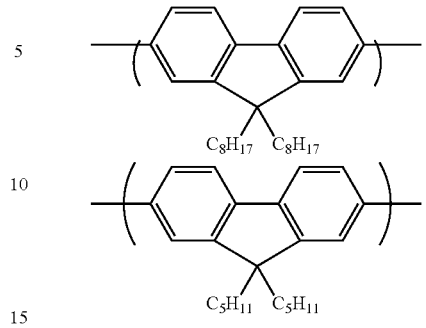

from the charged raw materials at 80:20 (molar ratio).

Synthesis Example 6

Synthesis of Polymer 4

Synthesis of E-1,3-bis(4-bromophenyl)-2-propene-1-one (Compound 3)

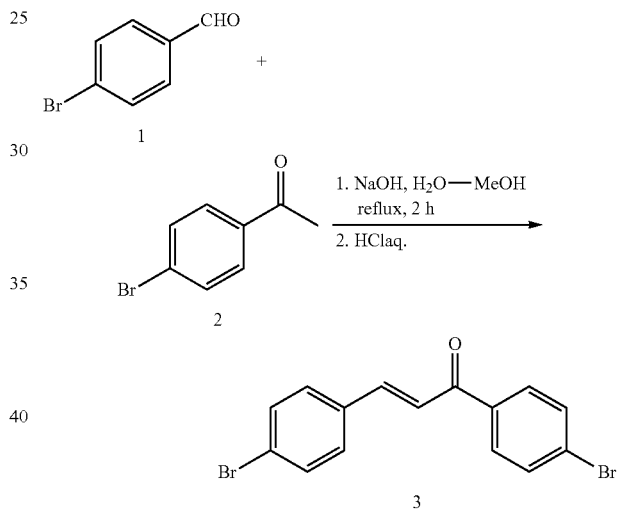

75 g (0.40 mol) of p-bromobenzaldehyde (compound 1), 80 g (0.40 mol) of p-bromoacetophenone (compound 2), and 400 mL of methanol were added to a 2 L three-neck flask, and after replacement by an argon gas, the mixture was stirred using a mechanical stirrer. 1.7 g (0.04 mol) of sodium hydroxide dissolved in 400 mL of water was added to the obtained solution. The obtained suspension was heated, refluxed for 2 hours, and then cooled to room temperature, and 24 mL of 2 M HClaq. was added to make the solution acidic. A sufficient amount of chloroform (about 10 L) was added to a large amount of a yellow precipitate to dissolve the yellow precipitate, and the obtained solution was washed twice with water. The organic layer was distilled off under reduced pressure, and the obtained yellow precipitate was dispersed in a large amount of methanol. Further, a suitable amount of water was added (water was added at methanol:water=about 1:1), and the formed precipitate was filtered off, washed with methanol, and then heated and dried in a vacuum oven to obtain 138.1 g of yellow E-1,3-bis(4-bromophenyl)-2-propene-1-one (compound 3) (yield: 95%).

$^1$H NMR (300 MHz, CDCl$_3$); δ (TMS, ppm) 7.90-7.87 (m, 2H, Ar—H), 7.75 (d, j=1.8 Hz, 1H, CH=C), 7.67-7.64 (m, 2H, Ar—H), 7.58-7.52 (m, 4H, Ar—H), 7.47 (d, j=1.8 Hz, 1H, CH=C).

$^{13}$C NMR (75 MHz, CDCl$_3$); δ (TMS, ppm) 144.2, 137.0, 133.9, 132.6, 132.3, 130.3, 130.1, 128.4, 125.4, 122.2.

LC-MS (APPI); m/z=365 [M+H]$^+$.

Synthesis of p-Hexylbenzamidine Hydrochloride (Compound 5)

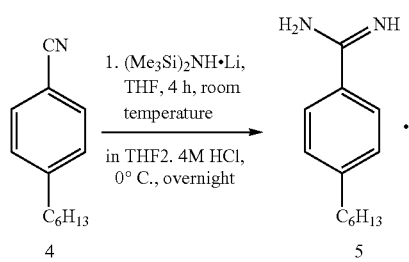

In a glove box, 16.2 g (83.7 mmol) of p-hexylbenzonitrile (compound 4), ca. 20 mL of dry THF, and 100 mL (100 mmol) of a tetrahydrofuran solution of 1 M lithium bistrimethylsilylamide were weighed into a 500 mL four-neck flask, and stirred at room temperature under a nitrogen atmosphere for 4 hours. The mixture was cooled to 0° C. using an ice bath, and 100 mL of a 4 M hydrochloric acid dioxane solution was slowly dropped. The mixture was stirred under ice cooling for 4 hours, and further allowed to stand under ice cooling overnight. On the next day, 350 mL of diethyl ether was added, and the mixture was exposed to ultrasonic waves. Then, the supernatant was discarded by decantation. 500 mL of diethyl ether was added to the obtained precipitate. When the mixture was stirred, while being exposed to ultrasonic waves, an oily object solidified. Therefore, this was filtered off. When the precipitate was repeatedly washed with diethyl ether, a gray powder was obtained. Therefore, this was collected, and dried in a vacuum oven for 2 hours to obtain 23 g of p-hexylbenzamidine hydrochloride (compound 5) (yield: quant.).

$^1$H NMR (300 MHz, DMSO-d$_6$); δ (TMS, ppm) 9.63 (brs, 2H, NH), 9.44 (brs, 2H, NH), 7.91 (d, j=8.0 Hz, 2H, Ar—H), 7.45 (d, j=8.0 Hz, 1H, Ar—H), 2.70 (t, j=7.5 Hz, 2H, ArCH$_2$—), 2.70 (t, j=7.5 Hz, 2H, ArCH$_2$—), 1.66-1.56 (m, 2H, ArCH$_2$ CH$_2$—), 1.66-1.56 (m, 2H, ArCH$_2$ CH$_2$—), 1.30 (brs, 6H, —CH$_2$—), 0.88 (t, j=6.2 Hz, 3H, —CH$_3$).

$^{13}$C NMR (75 MHz, DMSO-d$_6$); δ (TMS, ppm) 166.2, 149.8, 129.6, 128.9, 125.6, 35.73, 31.79, 31.26, 29.01, 22.79, 14.71.

Synthesis of 4,6-bis(4-bromophenyl)-2-(4-hexylphenyl)pyrimidine (Compound D)

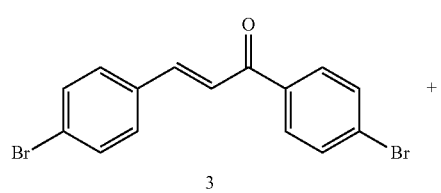

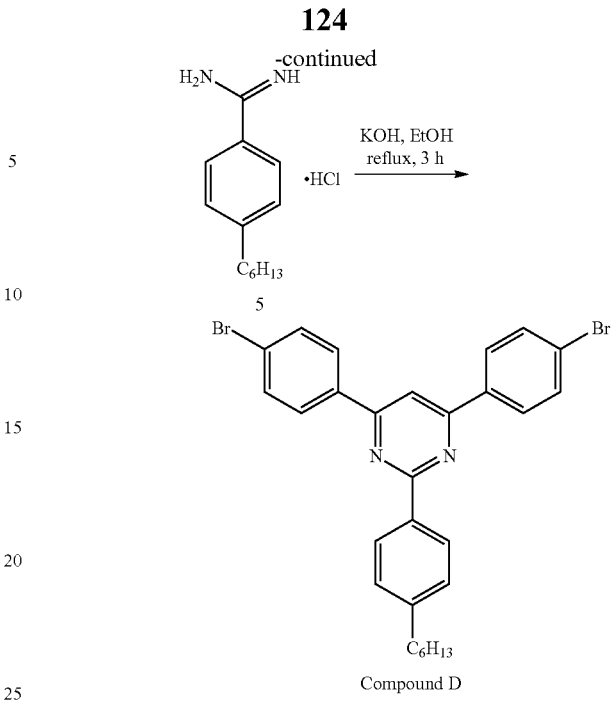

Under an argon gas atmosphere, 76 g (0.206 mol) of E-1,3-bis(4-bromophenyl)-2-propene-1-one (compound 3), 21 g (0.103 mol) of p-hexylbenzamidine hydrochloride (compound 5), and 700 mL of ethanol were taken into a 3 L four-neck flask, and 12 g (0.206 mol) of potassium hydroxide dissolved in 1.3 L of ethanol was added to the obtained suspension. The mixture was refluxed for 4 hours, while being stirred by a mechanical stirrer. At this time, the color of the suspension changed gradually from orange to ocher through green. Then, the obtained solution was distilled off under reduced pressure until the amount of the solution was about half. The solution was sufficiently ice-cooled, and then, the precipitate was filtered off. The obtained precipitate was washed well with water, and dried in a vacuum oven overnight to obtain 48.7 g of an unpurified compound D (gray powder: purity 82%). This compound D was recrystallized using about 1 L of glacial acetic acid. The obtained precipitate was dissolved in diethyl ether, and the solution was washed once with saturated sodium hydrogen carbonate (aq) and twice with water. The diethyl ether was distilled off under reduced pressure to obtain 38.6 g of a purified compound D (white powder, purity: 99.44%). In order to further enhance the purity, this compound D was dispersed in methanol, water was added, and the precipitate was filtered off. Then, this precipitate was recrystallized by glacial acetic acid again. The obtained precipitate was dissolved in diethyl ether, and the solution was washed once with saturated sodium hydrogen carbonate (aq) and twice with water. The diethyl ether was distilled off under reduced pressure to obtain 29 g of the compound D having a purity of 99.50% (white powder) (yield: 51%).

$^1$H NMR (300 MHz, CDCl$_3$); δ (TMS, ppm) 8.54 (d, j=7.8 Hz, 2H, Ar—H), 8.10 (d, j=8.4 Hz, 4H, Ar—H), 7.82 (s, 1H, Ar—H), 7.65 (d, j=8.4 Hz, 4H, Ar—H), 7.32 (d, j=7.9 Hz, 2H, Ar—H), 2.70 (t, j=7.6 Hz, 2H, ArCH$_2$—), 1.72-1.62 (m, 2H, ArCH$_2$ CH$_2$—), 1.33 (brs, 6H, —CH$_2$—), 0.89 (t, j=9.2 Hz, 3H, —CH$_3$), $^{13}$C NMR (75 MHz, CDCl$_3$); δ (TMS, ppm) 165.1, 163.9, 146.5, 136.5, 135.5, 132.4, 129.0, 128.9, 128.7, 125.8, 109.4, 36.26, 32.04, 31.59, 29.28, 22.94, 14.42.

LC-MS (APPI); m/z=549 [m+h]$^+$.

125

Synthesis of Polymer 4

1.866 g (purity: 99.9%, 3.51 mmol) of 9,9-dioctylfluorene-2,7-ethylene glycol diborate ester, 1.392 g (purity: 96.9%, 2.46 mmol) of 9,9-dioctyl-2,7-dibromofluorene, 0.389 g (purity: 99.5%, 0.70 mmol) of 4,6-bis(4-bromophenyl)-2-(4-n-hexylphenyl)-pyrimidine, 0.260 g (purity: 99.9%, 0.35 mmol) of N,N'-bis(4-bromophenyl)-N,N'-bis(2,6-dimethyl-4-tert-butylphenyl)-1,4-phenylenediamine, 0.51 g of methyltrioctylammonium chloride (trade name: Aliquat336, manufactured by Aldrich), and 64 mL of toluene were added to a 200 mL separable flask. The obtained mixed liquid was heated to 100° C. under a nitrogen atmosphere. 2.5 mg of bistriphenylphosphinepalladium dichloride was added thereto. 9.81 g of a 17.5 weight % aqueous sodium carbonate solution was dropped into the obtained solution, and then, the mixture was stirred for 3 hours. Next, 0.043 g of phenylboric acid, 1.3 mg of bistriphenylphosphinepalladium dichloride, 4 mL of toluene, and 9.88 g of a 17.5 weight % aqueous sodium carbonate solution were added thereto, and the mixture was stirred at 100° C. for 17 hours. The aqueous layer was removed from the obtained solution, and then, 1.96 g of sodium N,N-diethyldithiocarbamate trihydrate and 39 mL of ion-exchange water were added, and the mixture was stirred at 85° C. for 2 hours. From the obtained solution, the organic layer was separated from the aqueous layer, and then, the organic layer was washed with 46 mL of ion-exchange water (three times), 46 mL of a 3 weight % aqueous acetic acid solution (three times), and 46 mL of ion-exchange water (three times) in this order. When the obtained organic layer was dropped into 600 mL of methanol, a precipitate formed. This precipitate was filtered and then dried to obtain a solid. This solid was dissolved in 200 mL of toluene to prepare a solution, and this solution was passed through a silica gel/alumina column through which toluene was previously passed. When the passed eluate was dropped into 1400 mL of methanol, a precipitate formed. This precipitate was filtered and then dried to obtain 2.38 g of a polymer (hereinafter referred to as a "polymer 4"). The polystyrene equivalent number-average molecular weight Mn of the polymer 4 measured under the analysis conditions 1 was $1.7 \times 10^5$, and the polystyrene equivalent weight-average molecular weight Mw of the polymer 4 was $4.7 \times 10^5$.

It is presumed that the polymer 4 has repeating units represented by the following formulas:

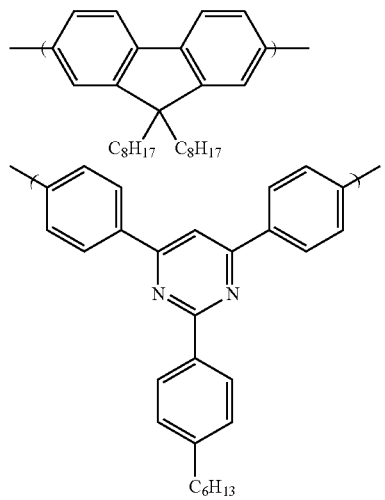

126

-continued

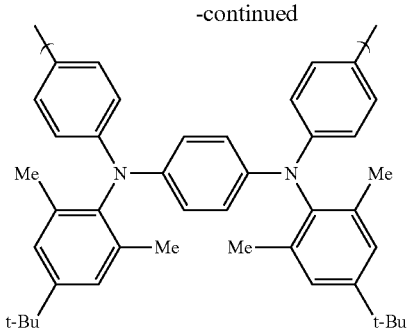

from the charged raw materials at 85:10:5 (molar ratio).

Synthesis Example 7

Synthesis of Organic Compound F

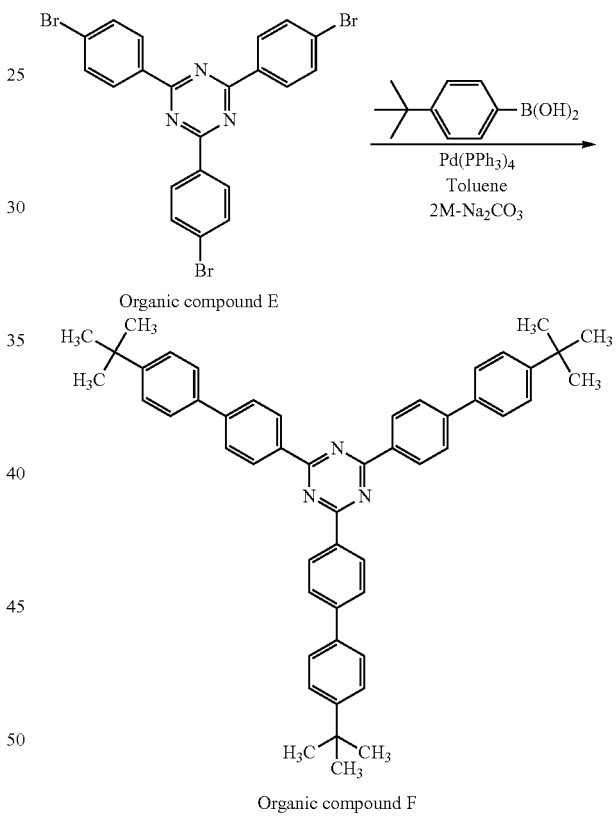

Organic compound F

Under a nitrogen atmosphere, 8.06 g (14.65 mmol) of an organic compound E (white crystal), 9.15 g (49.84 mmol) of 4-t-butylphenylboronic acid, 1.54 g (1.32 mmol) of Pd(PPh$_3$)$_4$, 500 ml of previously nitrogen-bubbled toluene, and 47.3 ml of previously nitrogen-bubbled ethanol were charged, stirred, heated, and refluxed. 47.3 ml of a 2 M aqueous sodium carbonate solution previously nitrogen-bubbled was dropped into the obtained reaction liquid, and the mixture was further heated, and refluxed. The obtained reaction liquid was allowed to cool and then separated. The aqueous phase was removed, and the organic phase was washed with diluted hydrochloric acid and water in this order and separated. The organic layer was dried with anhydrous magnesium sulfate, filtered, and concentrated. The obtained crude product was passed through a silica gel column, and acetonitrile was added to the obtained filtrate. The obtained crystal was dried under reduced pressure to obtain 8.23 g of a white crystal (hereinafter referred to as an "organic compound F").

$^1$H-NMR (270 MHz/CDCl$_3$):

δ1.39 (s, 27H), 7.52 (d, 6H), 7.65 (d, 6H), 7.79 (d, 6H), 8.82 (d, 6H)

Example 1

Using a poly(ethylenedioxythiophene)/polystyrene-sulfonic acid solution (trade name: AI4083, Bayer), a 65 nm thick film was formed by spin coating on a glass substrate provided with a 150 nm thick ITO film by a sputtering method, and dried on a hot plate at 200° C. for 10 minutes.

Next, a film having a thickness of about 20 nm was formed by the spin coating of a 0.8 weight % xylene solution of the polymer C, and then heat-treated on the hot plate at 180° C. for 60 minutes.

Next, the polymer 1 dissolved in a xylene solvent at a concentration of 1.5% by weight, and the metal complex (MC-1) dissolved in a xylene solvent at a concentration of 1.5% by weight were mixed at a weight ratio of 92.5:7.5 to prepare a composition (hereinafter referred to as a "composition 1"). A film was formed by the spin coating of the composition 1 at a rotation speed of 3000 rpm. The film thickness was about 80 nm. The film was dried under a nitrogen gas atmosphere at 130° C. for 10 minutes, and then, about 5 nm of barium and then about 80 nm of aluminum were deposited as a cathode to fabricate an EL device. The deposition of the metals was started after the degree of vacuum reached 1×10$^{-4}$ Pa or less.

When voltage was applied to the obtained EL device, EL emission having a peak at 600 nm derived from the metal complex (MC-1) was obtained from this device. The device started emission from 2.6 V, and showed an emission of 1000 cd/m$^2$ at 5.3 V, and the maximum luminous efficiency was 22.32 cd/A.

For the above polymer 1 and metal complex (MC-1), when the structure optimization of the ground state was performed by the density functional method at the B3LYP level, using the quantum chemical calculation program Gaussian03, and the absolute value of the LUMO energy level in the optimized structure was calculated, their difference in the absolute value of the LUMO energy level was calculated as 0.01 eV.

Example 2

An EL device was fabricated as in Example 1, except that a solution of the polymer 4 dissolved in a xylene solvent at a concentration of 1.0% by weight was used instead of the solution of the polymer 1 dissolved in a xylene solvent at a concentration of 1.5% by weight in Example 1. When voltage was applied to the obtained EL device, EL emission having a peak at 600 nm derived from the metal complex (MC-1) was obtained. The device started emission from 2.67 V, and showed 1000 cd/m$^2$ at 6.9 V, and the maximum luminous efficiency was 24.97 cd/A.

For the polymer 4 and the metal complex (MC-1), when the structure optimization of the ground state was performed by the density functional method at the B3LYP level, using the quantum chemical calculation program Gaussian03, and the absolute value of the LUMO energy level in the optimized structure was calculated, their difference in the absolute value of the LUMO energy level was calculated as 0.13 eV.

Example 3

An EL device was fabricated as in Example 1, except that a solution obtained by mixing a solution of the polymer 2 dissolved in a xylene solvent at a concentration of 1.5% by weight and a solution of the organic compound F dissolved in a xylene solvent at a concentration of 1.5% by weight at a weight ratio of 70:30 was used instead of the solution of the polymer 1 dissolved in a xylene solvent at a concentration of 1.5% by weight in Example 1. When voltage was applied to the obtained EL device, EL emission having a peak at 600 nm derived from the metal complex (MC-1) was obtained. The device started emission from 2.94 V, and showed 1000 cd/m$^2$ at 6.2 V, and the maximum luminous efficiency was 21.31 cd/A.

For the organic compound E and the metal complex (MC-1), when the structure optimization of the ground state was performed by the density functional method at the B3LYP level, using the quantum chemical calculation program Gaussian03, and the absolute value of the LUMO energy level in the optimized structure was calculated, their difference in the absolute value of the LUMO energy level was calculated as 0.28 eV.

Example 4

An EL device was fabricated as in Example 1, except that a solution obtained by mixing a solution of the polymer 2 dissolved in a xylene solvent at a concentration of 1.5% by weight and a solution of the organic compound F dissolved in a xylene solvent at a concentration of 1.5% by weight at a weight ratio of 80:20 was used instead of the solution of the polymer 1 dissolved in a xylene solvent at a concentration of 1.5% by weight in Example 1. When voltage was applied to the obtained EL device, EL emission having a peak wavelength of 605 nm derived from the metal complex (MC-1) was obtained. The device started emission from 3.01 V, and showed 1000 cd/m$^2$ at 7.14 V, and the maximum luminous efficiency was 19.39 cd/A.

Example 5

Synthesis of Metal Complex (MC-2)

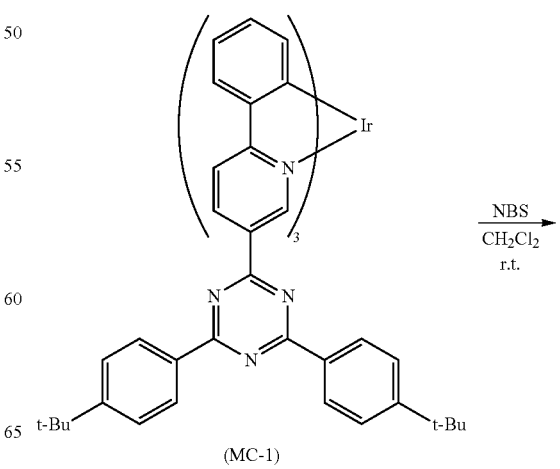

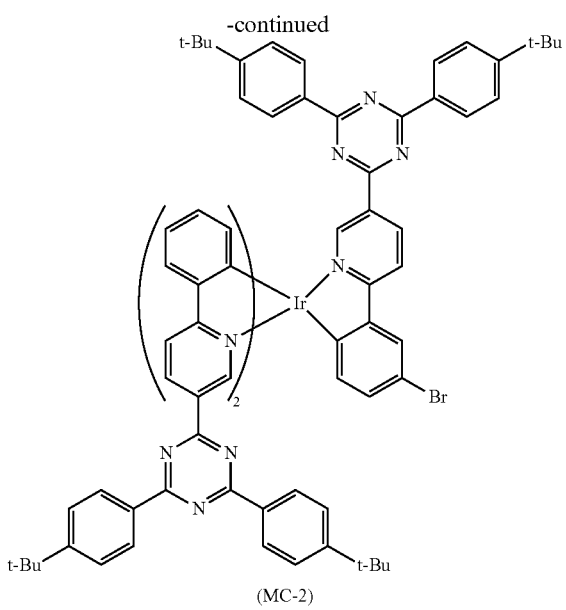

(MC-2)

Under an argon gas flow, the metal complex (MC-1, 2.03 g, 1.20 mmol) and methylene chloride (200 mL) were weighed into a reaction container, and the metal complex was dissolved. N-bromosuccinimide (221 mg, 1.24 mmol) was added to the solution, and the mixture was stirred at room temperature for 4 hours. The solvent was distilled off, and toluene (50 mL) was added to the residue to dissolve the residue. The obtained toluene solution was purified by silica gel chromatography (developing solvent: toluene). The eluted solution was recovered, and the solvent was distilled off. Then, a hexane/toluene (2/1)(volume ratio) mixed solution (400 mL) was added to the residue to dissolve a metal complex MC-2, the product. The thus obtained solution was purified by silica gel chromatography again (developing solvent: hexane/toluene=2/1 (volume ratio)). The second eluted component was recovered, and the solvent was distilled off. Then, the residue was washed with methanol to obtain a metal complex (MC-2, 1.55 g 0.88 mmol).

Metal Complex (MC-2)

LC-MS (APCI, positive) m/z: 1765 ([M+H]$^+$)

$^1$H NMR (300 MHz, CDCl$_3$)

δ 1.20 (s, 54H), δ 6.85-7.00 (m, 10H), δ 7.39 (d, J=7.8 Hz, 12H), δ 7.83 (d, J=7.3 Hz, 2H), δ 7.91 (s, 1H), δ 8.14 (d, J=8.8 Hz, 1H), δ 8.19 (d, J=8.6 Hz, 2H), δ8.36 (d, J=7.8 Hz, 12H), δ 9.16 (m, 3H), δ 9.28 (s, 1H), δ 9.33 (s, 2H).

Synthesis of Polymer 5

1.502 g (purity: 99.9%, 2.83 mmol) of 9,9-dioctylfluorene-2,7-ethylene glycol diborate ester, 1.392 g (purity: 96.9%, 2.15 mmol) of 9,9-dioctyl-2,7-dibromofluorene, 0.157 g (purity: 99.3%, 0.28 mmol) of 2,4-bis(4-bromophenyl)-6-(4-n-hexylphenyl)-1,3,5-triazine, 0.209 g (purity: 99.9%, 0.28 mmol) of N,N'-bis(4-bromophenyl)-N,N'-bis(2,6-dimethyl-4-tert-butylphenyl)-1,4-phenylenediamine, 0.201 g (purity: 99.4%, 0.11 mmol) of the metal complex (MC-2), 0.42 g of methyltrioctylammonium chloride (trade name: Aliquat336, manufactured by Aldrich), and 56 mL of toluene were added to a 200 mL separable flask. The obtained mixed liquid was heated to 100° C. under a nitrogen atmosphere. 2.0 mg of bistriphenylphosphinepalladium dichloride was added thereto. 7.83 g of a 17.5 weight % aqueous sodium carbonate solution was dropped into the obtained solution, and then, the mixture was stirred for 3 hours. Next, 0.035 g of phenylboric acid, 1.1 mg of bistriphenylphosphinepalladium dichloride, 3 mL of toluene, and 7.80 g of a 17.5 weight % aqueous sodium carbonate solution were added, and the mixture was stirred at 100° C. for 16 hours.

The aqueous layer was removed from the obtained solution, and then, 1.57 g of sodium N,N-diethyldithiocarbamate trihydrate and 31 mL of ion-exchange water were added, and the mixture was stirred at 85° C. for 2 hours. From the obtained solution, the organic layer was separated from the aqueous layer, and then, the organic layer was washed with 37 mL of ion-exchange water (three times), 37 mL of a 3 weight % aqueous acetic acid solution (three times), and 37 mL of ion-exchange water (three times) in this order. Then, when the organic layer was dropped into 500 mL of methanol, a precipitate formed. This precipitate was filtered and then dried to obtain a solid. This solid was dissolved in 40 mL of toluene to prepare a solution, and this solution was passed through a silica gel/alumina column through which toluene was previously passed. When the passed eluate was dropped into 600 mL of methanol, a precipitate formed. This precipitate was filtered and then dried to obtain 1.68 g of a polymer (hereinafter referred to as a "polymer 5"). The polystyrene equivalent number-average molecular weight Mn of the polymer 5 measured under the analysis conditions 2 was 2.1×10$^4$, and the polystyrene equivalent weight-average molecular weight Mw of the polymer 5 was 6.3×10$^4$.

It is presumed that the polymer 5 has repeating units represented by the following formulas:

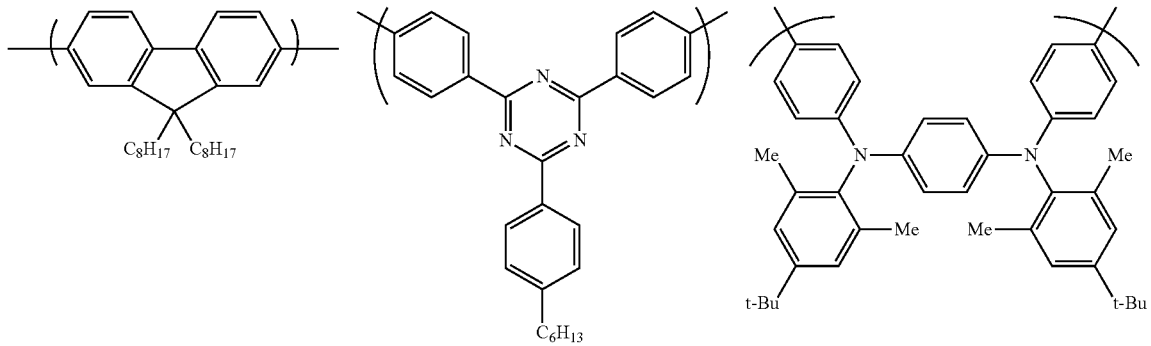

-continued

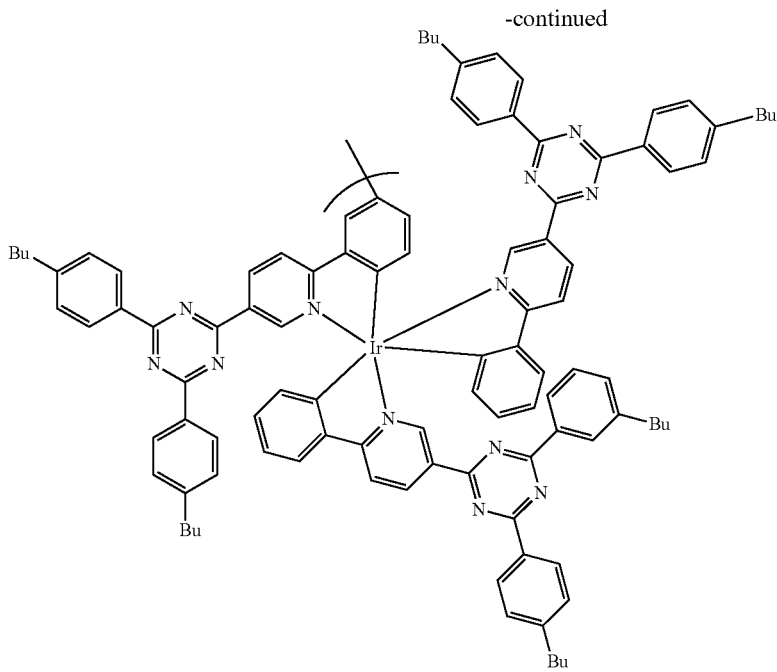

from the charged raw materials at 88:5:5:2 (molar ratio).

The polymer 5 had a residue of a metal complex and a residue of an organic compound, and the absolute values of the LUMO energy levels of the metal complex and the organic compound were obtained by the following method. Specifically, the structure optimization of the ground state was performed by the density functional method at the B3LYP level, using the quantum chemical calculation program Gaussian03, and the absolute value of the LUMO energy level in the optimized structure was calculated. As a result, the absolute value of the LUMO energy level of the metal complex was calculated as 2.15 eV, and the absolute value of the LUMO energy level of the organic compound was calculated as 2.14 eV.

Then, an EL device was fabricated as in Example 1, except that a solution of the polymer 5 dissolved in a xylene solvent at a concentration of 1.8% by weight was used instead of the composition 1 in Example 1. When voltage was applied to the obtained EL device, EL emission having a peak wavelength of 605 nm derived from the metal complex (MC-2) was obtained. The device started emission from 2.70 V, and showed 1000 cd/m² at 6.2 V, and the maximum luminous efficiency was 18.38 cd/A.

For the polymer 5 and the metal complex (MC-2), when the structure optimization of the ground state was performed by the density functional method at the B3LYP level, using the quantum chemical calculation program Gaussian03, and the absolute value of the LUMO energy level in the optimized structure was calculated, the difference between the absolute value of the LUMO energy level of the organic compound and the absolute value of the LUMO energy level derived from the metal complex was calculated as 0.01 eV.

Comparative Example 1

An EL device was fabricated as in Example 1, except that the polymer 2 was used instead of the polymer 1 in Example 1. When voltage was applied to the obtained EL device, EL emission having a peak wavelength of 605 nm derived from the metal complex (MC-1) was obtained. The device started emission from 3.7 V, and showed an emission of 1000 cd/m² at 10.3 V, and the maximum luminous efficiency was 9.71 cd/A.

For the above polymer 2 and metal complex (MC-1), when the structure optimization of the ground state was performed by the density functional method at the B3LYP level, using the quantum chemical calculation program Gaussian03, and the absolute value of the LUMO energy level in the optimized structure was calculated, their difference in the absolute value of the LUMO energy level was calculated as 1.15 eV.

Comparative Example 2

An EL device was fabricated as in Example 1, except that the polymer 3 was used instead of the polymer 1 in Example 1. When voltage was applied to the obtained EL device, EL emission having a peak wavelength of 605 nm derived from the metal complex (MC-1) was obtained. The device started emission from 3.61 V, and showed an emission of 1000 cd/m² at 9.3 V, and the maximum luminous efficiency was 5.93 cd/A.

For the above polymer 3 and metal complex (MC-1), when the structure optimization of the ground state was performed by the density functional method at the B3LYP level, using the quantum chemical calculation program Gaussian03, and the absolute value of the LUMO energy level in the optimized structure was calculated, their difference in the absolute value of the LUMO energy level was calculated as 0.77 eV.

INDUSTRIAL APPLICABILITY

The composition and the like of the present invention are particularly useful for the manufacture of a light-emitting device, such as an organic electroluminescent device.

The invention claimed is:

1. A composition comprising a metal complex represented by the following formula (1), and an organic compound, wherein a difference between an absolute value of a lowest unoccupied molecular orbital energy level of the metal complex and an absolute value of a lowest unoccupied molecular orbital energy level of the organic compound as calculated by a computational scientific approach wherein calculations are performed by a density functional method at B3LYP level with LANL2DZ basis function for the central metal atom and 6-31 g*basis function for atoms other than the central metal atom using Gaussian03 quantum chemical calculation program is less than 0.40 eV:

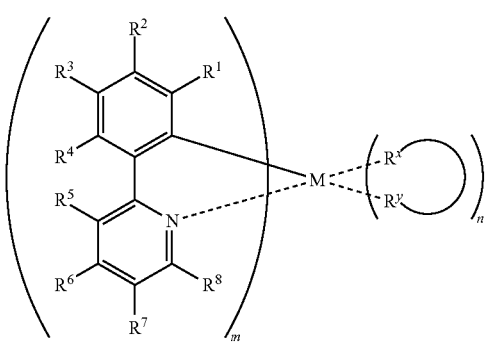
(1)

wherein M is a metal atom of ruthenium, rhodium, palladium, osmium, iridium, or platinum, and $R^1$, $R^2$, $R^3$, $R^4$, $R^5$, $R^6$, $R^7$, and $R^8$ each independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylalkynyl group, a substituted carboxyl group, or a cyano group, or $R^3$ and $R^4$, or $R^5$ and $R^6$ may be bonded to form a ring, wherein $R^3$ is not a monovalent heterocyclic group, provided that $R^2$ is a hydrogen atom and $R^7$ is a group represented by the following formula (2-7):

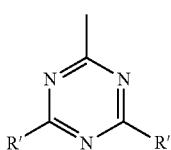
(2-7)

wherein R' is a hydrogen atom, a halogen atom, and alkyl group, an alkoxy group, an alkylthio group, an aryl group, an aryloxy group, an arylthio group, an arylalkyl group, an arylalkoxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylalkynyl group, a substituted carboxyl group, or a cyano group; and a plurality of R' may be the same or different, m is an integer of 1 to 3, and n is an integer of 0 to 2; a moiety represented by the following formula (3):

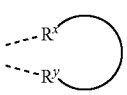
(3)

represents a monoanionic bidentate ligand; and $R^x$ and $R^y$ are atoms bonded to the metal atom M and each independently represent a carbon atom, an oxygen atom, or a nitrogen atom.

2. The composition according to claim 1, wherein the organic compound is a compound represented by the following formula (A'):

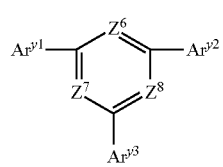
(A')

wherein $Ar^{y1}$, $Ar^{y2}$, and $Ar^{y3}$ each independently represent an aryl group or a monovalent heterocyclic group; $Z^6$ to $Z^8$ each independently represent a carbon atom or a nitrogen atom, provided that at least two of $Z^6$ to $Z^8$ are nitrogen atoms; and when any of $Z^6$ to $Z^8$ is a carbon atom, a hydrogen atom bonded to the carbon atom may be replaced by a substituent, or a compound having a residue of the foregoing compound.

3. The composition according to claim 2, wherein the compound having a residue of a compound represented by the formula (A') is a compound having a divalent group represented by the following formula (A):

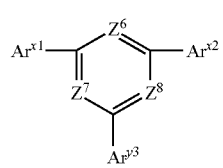
(A)

wherein $Ar^{x1}$ and $Ar^{x2}$ represent an arylene group or a divalent heterocyclic group; and $Ar^{y3}$ and $Z^6$ to $Z^8$ are as defined above.

4. The composition according to claim 2, wherein the $Z^6$ to the $Z^8$ are nitrogen atoms.

5. The composition according to claim 3, wherein the compound having a divalent group represented by the formula (A) is a polymer compound having a divalent group represented by the formula (A) as a repeating unit.

6. The composition according to claim 5, wherein the polymer compound having a divalent group represented by the formula (A) as a repeating unit further has a repeating unit represented by the following formula (B):

(B)

wherein $Ar^2$ represents an arylene group which may have a substituent, or a divalent heterocyclic group which may have a substituent.

7. The composition according to claim 1, wherein the metal complex represented by the formula (1) is a metal complex represented by the following formula (1a):

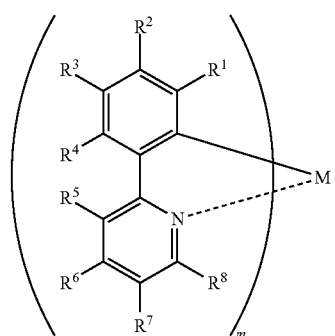
(1a)

wherein M, $R^1$, $R^2$, $R^3$, $R^4$, $R^5$, $R^6$, $R^7$, and $R^8$, and m are as defined above.

8. The composition according to claim 1, wherein the M is a platinum atom or an iridium atom.

9. The composition according to claim 1, showing phosphorescence emission in which at least one peak wavelength of a photoluminescence emission spectrum is 550 nm to 800 nm.

10. The composition according to claim 1, comprising a solvent or a dispersion medium.

11. A film comprising a composition according to claim 1.

12. A device comprising a composition according to claim 1.

13. The device according to claim 12, wherein the device is a light-emitting device.

14. A surface light source comprising a device according to claim 13.

15. A light comprising a device according to claim 13.

16. A compound having a residue of a metal complex represented by the following formula (1), and a residue of an organic compound, wherein a difference between an absolute value of a lowest unoccupied molecular orbital energy level of the metal complex and an absolute value of a lowest unoccupied molecular orbital energy level of the organic compound as calculated by a computational scientific approach wherein calculations are performed by a density functional method at B3LYP level with LANL2DZ basis function for the central metal atom and 6-31 g*basis function for atoms other than the central metal atom using Gaussian03 quantum chemical calculation program is less than 0.40 eV:

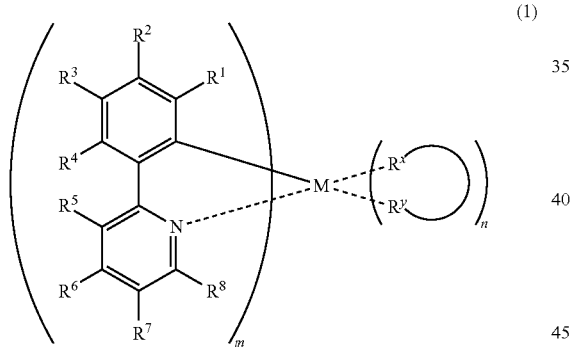

(1)

wherein M is a metal atom of ruthenium, rhodium, palladium, osmium, iridium, or platinum, and $R^1$, $R^2$, $R^3$, $R^4$, $R^5$, $R^6$, $R^7$, and $R^8$ each independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylalkynyl group, a substituted carboxyl group, or a cyano group, or $R^3$ and $R^4$, or $R^5$ and $R^6$ may be bonded to form a ring, wherein $R^3$ is not a monovalent heterocyclic group, provided that $R^2$ is a hydrogen atom and $R^7$ is a group represented by the following formula (2-7):

(2-7)

wherein R' is a hydrogen atom, a halogen atom, and alkyl group, an alkoxy group, an alkylthio group, an aryl group, an aryloxy group, an arylthio group, an arylalkyl group, an arylalkoxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylalkynyl group, a substituted carboxyl group, or a cyano group; and a plurality of R' may be the same or different, m is an integer of 1 to 3, and n is an integer of 0 to 2; a moiety represented by the following formula (3):

(3)

represents a monoanionic bidentate ligand; and $R^x$ and $R^y$ are atoms bonded to the metal atom M and each independently represent a carbon atom, an oxygen atom, or a nitrogen atom.

* * * * *